United States Patent [19]

Hirose et al.

[11] Patent Number: 5,515,326

[45] Date of Patent: May 7, 1996

[54] STATIC SEMICONDUCTOR MEMORY DEVICE HAVING CIRCUITRY FOR LOWERING POTENTIAL OF BIT LINES AT COMMENCEMENT OF DATA WRITING

[75] Inventors: Toshihiko Hirose; Shigeki Ohbayashi; Setsu Kondo; Takashi Hayasaka; Yoshiyuki Fujino; Masayuki Iketani, all of Hyogo, Japan

[73] Assignee: Mitsubishi Denki Kabushiki Kaisha, Tokyo, Japan

[21] Appl. No.: 402,221

[22] Filed: Mar. 10, 1995

Related U.S. Application Data

[62] Division of Ser. No. 271,691, Jul. 7, 1994.

[30] Foreign Application Priority Data

Jul. 8, 1993 [JP] Japan ..................... 5-168983

[51] Int. Cl.$^6$ ........................................ G11C 7/00
[52] U.S. Cl. ............... 365/189.11; 365/194; 365/189.01
[58] Field of Search ..................... 365/189.01, 189.11, 365/194

[56] References Cited

U.S. PATENT DOCUMENTS

| | | | |
|---|---|---|---|
| 4,337,523 | 6/1982 | Hotta et al. ............................. | 365/194 |
| 4,982,372 | 1/1991 | Matsuo . | |
| 5,262,919 | 11/1993 | Kuriyama et al. ...................... | 365/194 |

FOREIGN PATENT DOCUMENTS

| | | |
|---|---|---|
| 60-224259 | 11/1985 | Japan . |
| 63-37646 | 2/1988 | Japan . |
| 63-21190 | 9/1988 | Japan . |
| 2-91886 | 3/1990 | Japan . |
| 3-9559 | 1/1991 | Japan . |
| 3-29189 | 2/1991 | Japan . |
| 3-66095 | 3/1991 | Japan . |
| 4-102300 | 4/1992 | Japan . |

OTHER PUBLICATIONS

"A 12-NS ECL I/O 256KX1-Bit SRAM using a 1 μM BiCMOS Technology", Robert Kertis et al., IEEE Journal of Solid-State Circuits, vol. 23, No. 5, Oct. 1988.

"An 8-NS 256K ECL SRAM with CMOS Memory Array and Battery Backup Capability", Hiep Van Tran et al., IEEE Journal of Solid-State Circuits, vol. 23, No. 5, Oct. 1988.

"A 7-NS 1-MB BiCMOS ECL SRAM with Shift Redundancy", Atsushi Ohba et al., IEEE Journal of Solid-State Circuits, vol. 26, No. 4, Apr. 1991.

*Primary Examiner*—David C. Nelms
*Assistant Examiner*—Vu A. Le
*Attorney, Agent, or Firm*—Lowe, Price, LeBlanc & Becker

[57] ABSTRACT

A delay circuit delays an internal write control signal by a prescribed time to a global write driver. The global write driver is enabled in response to the delayed write control signal received from the delay circuit, to drive a global write data bus in accordance with internal write data from an input buffer. A block write driver is enabled in response to an internal write control signal and a block selection signal, to drive a local write data bus in response to data on the global write data bus. A write gate connects a bit line to the local write data bus in response to a column selection signal. The delay circuit sets the output of the block write driver at a low level for a prescribed period, whereby a precharge potential of the bit line is reduced to reduce the potential amplitude of the bit line in data writing. An SRAM which operates at a high speed with an enlarged write recovery time margin is provided. SRAM also includes various arrangement for improving operating characteristics and reliability.

3 Claims, 59 Drawing Sheets

FIG. 2

| /CS | /WE | /OE | /LB | /UB | OPERATION MODE | DQ1~DQ8 (LOWER BYTE) | DQ9~DQ16 (UPPER BYTE) |
|---|---|---|---|---|---|---|---|
| L | H | L | L | L | READ CYCLE (FULL BYTE) | Dout | Dout |
| L | H | L | H | L | READ CYCLE (UPPER BYTE) | HIGH IMPEDANCE | Dout |
| L | H | L | L | H | READ CYCLE (LOWER BYTE) | Dout | HIGH IMPEDANCE |
| L | L | X | L | L | WRITE CYCLE (FULL BYTE) | Din | Din |
| L | L | X | H | L | WRITE CYCLE (UPPER BYTE) | HIGH IMPEDANCE | Din |
| L | L | X | L | H | WRITE CYCLE (LOWER BYTE) | Din | HIGH IMPEDANCE |
| L | H | H | X | X | OUTPUT DISABLE | HIGH IMPEDANCE | HIGH IMPEDANCE |
| L | X | X | H | H | | HIGH IMPEDANCE | HIGH IMPEDANCE |
| H | X | X | X | X | NONSELECTION | DQ1~DQ9 | DQ10~DQ18 |

(NOTE) "X" INDICATES THAT BOTH OF "H" AND "L" ARE AVAILABLE FOR THE SAME MODE.

MC

STATIC SEMICONDUCTOR MEMORY DEVICE HAVING CIRCUITRY FOR LOWERING POTENTIAL OF BIT LINES AT COMMENCEMENT OF DATA WRITING

This application is a division of application Ser. No. 08/271,691 filed Jul. 7, 1994 pending.

BACKGROUND OF THE INVENTION

1. Field of the Invention

The present invention relates to a semiconductor memory device which can write and read data in random sequence, and more particularly, it relates to a BiMOS semiconductor memory device including bipolar transistors and insulated gate field effect transistors (MOS transistors) as its components. More specifically, the present invention relates to a static random access memory (SRAM) having a BiCMOS structure, which requires no refresh operation.

2. Description of the Related Art

A static random access memory (hereinafter simply referred to as SRAM) can be accessed at a high speed, since SRAM requires no RAS precharge time for precharging bit lines and no RAS-CAS delay time resulting from address multiplexing, dissimilarly to a DRAM (dynamic random access memory). Further, an access time for such an SRAM can be reduced as compared with that for a DRAM since memory cells of the SRAM are in flip-flop structures so that data are read in a non-destructive manner dissimilarly to the DRAM employing capacitors and hence it is not necessary to restore the read data and to employ latch type sense amplifiers.

Due to the aforementioned characteristics, an SRAM is widely applied to a high-speed cash memory or the like, which requires high-speed operability.

While the SRAM has a short access time, each memory cell provided therein requires four transistors in total including two transistors for forming a flip-flop and access transistors for transmitting memory cell data to bit lines, as well as a resistive element (circuit element such as a high resistance load or a TFT) for pulling up a latch node of the flip-flop. Thus, occupied areas of the memory cells are increased as compared with those of DRAM memory cells, each of which consists of only a single transistor and a single capacitor. Therefore, the cost per bit of the SRAM is higher than that of the DRAM.

With development in a technique of improving the degree of integration of such an SRAM, however, there have recently been proposed various types of highly integrated mass storage SRAMs. These SRAMs employ various structures for high integration, stable operations and high-speed operations.

A principal object of the present invention is to provide an improved SRAM, which stably operates at a high speed in a novel structure.

An SRAM is provided with a lead circuit for pulling up (precharging) each bit line potential to a supply potential Vcc level. This bit line load circuit reduces the amplitude of the bit line potential in data reading, thereby increasing the speed of data reading.

The SRAM has no RAS precharge period, dissimilarly to a DRAM. Therefore, it is possible to execute data read and write operations by continuously accessing the SRAM with no intervals. In data writing, a write driver discharges the potential of one of a selected pair of bit lines from the precharge level of the Vcc level to a ground potential GND level. After completion of the write operation, the bit line potential which is discharged to the ground potential level is again charged to the supply potential Vcc level by the bit line load circuit.

When a word line is selected before the bit line potential is sufficiently recovered in a data read operation which is executed following the data write operation, this leads to erroneous data writing in the selected memory cell or delay of a data read time, since the time required for changing the bit line potential to a potential corresponding to the read data is increased. In order to reduce the access time, therefore, it is necessary to pull up the bit line potential at a high speed after completion of the data writing. Japanese Patent Laying-Open No. 3-29189 (1991) discloses an exemplary structure for solving the problem of "write recovery", i.e., recovery of a bit line potential after completion of a data write operation.

In the technique described in Japanese Patent Laying-Open No. 3-29189 (1991), an output of a write driver is set at a high level after completion of data writing so that the write driver is connected to a bit line for a prescribed period after completion of the writing, to precharge the bit line by both of a bit line load circuit and the write driver. However, the "write recovery" cannot be regarded as efficient since the bit line potential is pulled up to a supply potential Vcc level and it takes time to equalize the bit line potential.

Japanese Patent Laying-Open No. 63-211190 (1988) discloses a structure of inhibiting a bit line load circuit from a bit line charging operation in operation of a data read sense amplifier and starting the bit line charging operation of the bit line load circuit after completion of the sense amplifier operation for precharging the bit line. However, this technique is related to only bit line precharging in data reading, and no "write recovery" is taken into consideration.

Japanese Patent Laying-Open No. 2-91886 (1990) discloses a structure of forming a bit line load circuit for precharging a bit line by a bipolar transistor and an insulated gate field effect transistor (hereinafter simply referred to as a MOS transistor) for increasing the speed for precharging the bit line. However, this technique is also insufficient in consideration of high-speed access, since the bit line is precharged to a supply potential Vcc level.

Accordingly, a specific object of the present invention is to provide a structure which can sufficiently increase a margin for "write recovery".

An SRAM employs a differential amplifier type sense amplifier utilizing a constant current source as a sense amplifier for data reading. This differential amplifier type sense amplifier is adapted to read a slight potential difference between bit lines at a high speed while exerting no influence on the bit line potentials. In general, a memory cell array of an SRAM is divided into blocks so that an output of a sense amplifier which is provided in correspondence to a selected block is transmitted to an internal data bus. In this case, the output of the sense amplifier is generally transmitted to the internal data bus through an emitter-follower transistor. An emitter of the emitter-follower transistor is connected to the internal data bus in common. Japanese Patent Laying-Open No. 3-66095 (1991) discloses an example of such a structure.

According to this technique, a clamp circuit is provided for bringing bases and emitters of emitter-follower transistors which are provided for nonselected sense amplifiers into reverse bias states, thereby guaranteeing transmission of low-level data in emitter-coupled logic to the internal data bus. However, this literature is merely aimed at reliably reading low-level data, and no increase in speed in the sense operation is taken into consideration.

Accordingly, another specific object of the present invention is to provide a structure which can read data at a high speed.

A differential amplifying stage of a sense amplifier provided in an SRAM utilizes a constant current source. This constant current source includes a transistor element which receives a reference voltage in its control electrode (a base of a bipolar transistor or a control gate of a MOS transistor). A current which is supplied by the constant current source decides the output voltage level of the differential amplifying stage. In order to correctly read data, it is necessary to set the output voltage level of the differential amplifying stage at a correct value. Thus, the current which is supplied by the constant current source must be at a constant level. In other words, it is necessary to set the reference voltage which is employed for generating the constant current correctly at a predetermined level.

A DRAM utilizes a structure of trimming an internal down-converted voltage by laser-blowing resistances which are arranged in parallel with each other for generating the internal stepdown voltage (refer to Japanese Patent Laying-Open No. 4-102300 (1992)). However, this prior art is related to a DRAM and aimed at no application to a constant current source for a sense amplifier of an SRAM, and describes no structure which can easily monitor whether or not a differential amplifying stage of a sense amplifier has prescribed operation characteristics in the exterior by a reference voltage generated by a reference voltage source.

Accordingly, still another specific object of the present invention is to provide a structure which can set a reference voltage employed for a reference current source correctly at a prescribed value and which can easily monitor the reference voltage in the exterior.

In a semiconductor memory device, a block structure of driving only a selected block is employed in consideration of reduction in power consumption. A single block includes a plurality of I/O blocks corresponding to a plurality of data input/output pins respectively. In consideration of high integration and the yield of an SRAM, it is necessary to efficiently repair defective memory cells. In relation to a system for repairing a defective memory cell, known is a "shift redundancy circuit" of simply shifting a target for connecting a column decoder output node dissimilarly to a system of replacing a defective bit line by a dedicated spare column.

In the structure of such a "shift redundancy circuit", however, defective memory cells are generally independently repaired in each I/O block. In a single memory block, therefore, a "spare column (redundant column)" is present in correspondence to each I/O block. When only one I/O block has a defective memory cell in a single memory block, there remains unused "spare columns" in this memory block. Thus, the "spare columns" are inferior in utilization factor and the memory cell array is reduced in degree of integration.

Accordingly, a further specific object of the present invention is to provide a shift redundancy circuit which can efficiently repair a defective memory cell in a single memory block.

In an SRAM, further, an output buffer is generally provided with no specific protective circuit since an output transistor which is the final stage of the output buffer has sufficient electrostatic breakdown resistance itself. In general, a recent SRAM has an interface which is compatible with TTL or LVTTL. TTL has VIH (input high level) of 2.2 V, VIL (input low level) of 0.8, VOH (output high level) of 2.4 V and VOL (output low level) of 0.4 V. LVTTL has VIH and VIL of 2.0 V and 0.8 V, and VOH and VOL of 2.4 V and 0.4 V respectively. The TTL and the LVTTL are different in quantity of current in signal output from each other.

In a two-power source system including an SRAM having an operating supply voltage Vcc of 3.3 V and a CPU, serving as an external processing unit, having an operating supply voltage Vcc of 5 V, the operating supply voltage of the CPU serving as an external processing unit may destruct components forming an output buffer of the SRAM. In relation to an integrated circuit device having a CMOS structure, known is a structure of providing a protective resistance and a protective diode to an input buffer (refer to Japanese Patent Laying-Open Nos. 60-224259 (1985), 63-37646 (1988) and 3-9559 (1991)). However, no consideration is made on a protective circuit with respect to an abnormal voltage for an output buffer in a BiMOS-SRAM.

Accordingly, a further specific object of the present invention is to provide a BiMOS-SRAM comprising a highly reliable output buffer.

In a battery driving system employing a battery as a power source, an operating supply voltage Vcc fluctuates with time. On the other hand, a supply voltage may accidentally fluctuate in a computer system which is provided with a number of memories. In general, an input buffer has a CMOS inverter structure. An input logic threshold value of the input buffer is varied with the level of the supply voltage Vcc. Even if a response time (time required for ascertaining the level of an output signal) of the input buffer for an input signal which rises from a low level to a high level is equalized to a response time for an input signal which falls from a high level to a low level with respect to a certain supply voltage level, therefore, these response times are made different from each other following fluctuation of the operating supply voltage Vcc. Thus, it is impossible to guarantee a correct operation.

Accordingly, a further specific object of the present invention is to provide an input buffer having input/output characteristics which are not dependent on a supply voltage.

SUMMARY OF THE INVENTION

An object of the present invention is to provide an SRAM having excellent operating characteristics and operating at a high speed.

A semiconductor memory device according to a first aspect of the present invention comprises a memory cell array having a plurality of memory cells which are arranged in a plurality of rows and a plurality of columns, a plurality of bit line pairs, each having true and complementary bit lines, which are arranged in correspondence to the respective columns to be connected with the memory cells of the corresponding columns respectively, and potential change means for reducing potentials of the respective bit lines of the plurality of bit line pairs in response to a data write command signal for a prescribed period upon generation of the data write command signal.

In the semiconductor memory device according to the first aspect of the present invention, the potential change means changes the potentials of the bit lines to second level directions for a prescribed period upon starting of data writing. Therefore, potential differences between the bit line pairs are reduced in the data writing and a time required for equalizing the potentials of the bit line pairs to each other after completion of the data write operation, whereby the margin for write recovery is enlarged.

The present invention provides various structures for implementing an improved SRAM. These structures are combined with each other to implement an SRAM having excellent characteristics, while these structures may be employed independently of each other, depending on the usage.

The foregoing and other objects, features, aspects and advantages of the present invention will become more apparent from the following detailed description of the present invention when taken in conjunction with the accompanying drawings.

BRIEF DESCRIPTION OF THE DRAWINGS

FIG. 2 is a list of logics of external control signals for the SRAM according to the present invention;

DESCRIPTION OF THE PREFERRED EMBODIMENTS

[Pin Arrangement]

Figure 1:
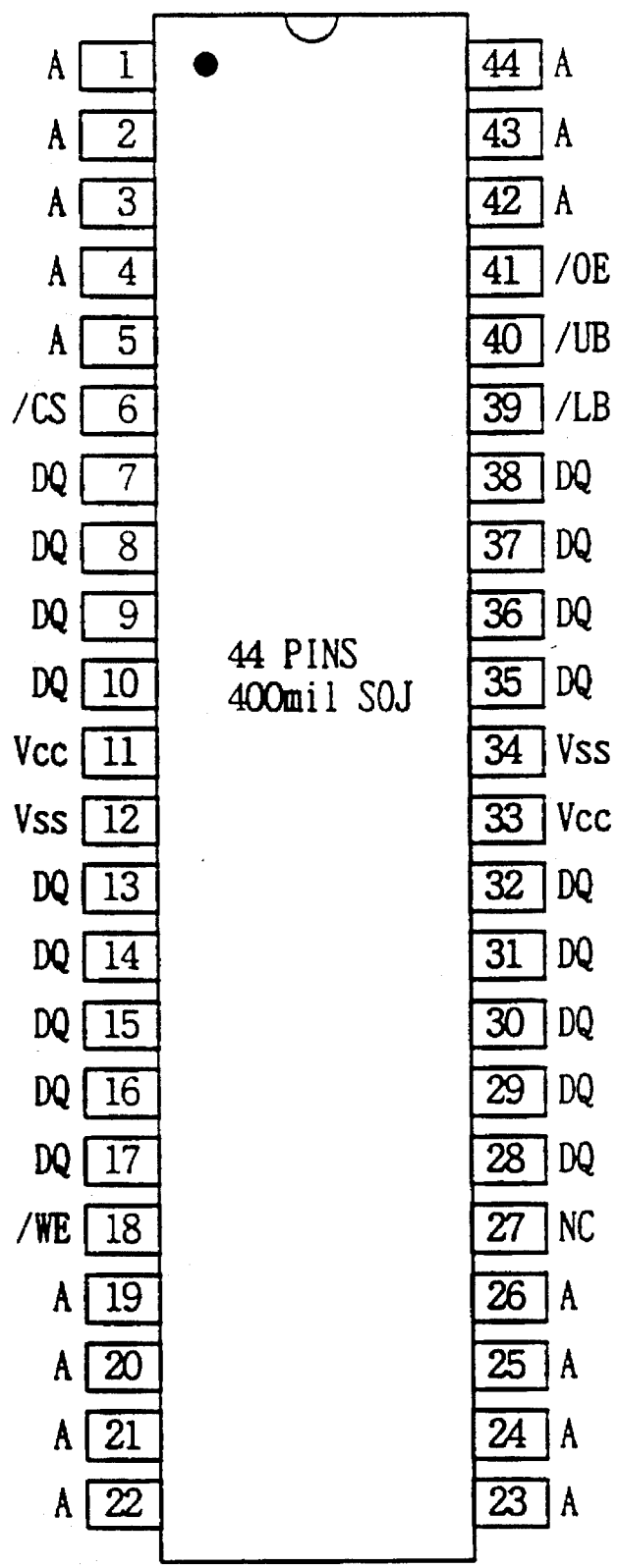
FIG. 1 illustrates the appearance and pin arrangement of a package storing an SRAM according to the present invention.

FIG. 1 illustrates pin arrangement of a semiconductor memory device according to an embodiment of the present invention. This semiconductor memory device is an SRAM, which is packaged in an SOJ (single outline J-leaded) package of 400 mil having 44 pins.

Pin terminals having pin numbers 1 to 5, 19 to 26 and 42 to 44 are address signal input terminals. Address signals which are supplied to the address input pin terminals according to a word structure of this semiconductor memory device (hereinafter simply referred to as SRAM) are different from each other. The SRAM according to this embodiment can provide a ×8/×9 or ×16/×19 word structure.

On the other hand, pin terminals having pin numbers 7 to 10, 13 to 17, 28 to 32 and 35 to 38 are data input/output terminals DQ. Positions and numbers of the data input/output terminals employed in accordance with the word structure of the SRAM are different from each other.

Pin terminals having pin numbers 11 and 33 provided at the center of the package are power supply terminals receiving a supply voltage Vcc, and those having pin numbers 12 and 34 are ground terminals receiving a ground potential Vss. Such arrangement providing power supply pins (Vcc pin terminals and Vss pin terminals) at the central portion of the package between the data input/output terminals is called "center power pin" arrangement.

A pin terminal having a pin number 6 is supplied with a chip selection signal /CS for bringing the SRAM into a selected state. A pin terminal having a pin number 18 is supplied with a write enable signal /WE specifying a data write operation. A pin terminal having a pin number 41 is supplied with an output enable signal /OE specifying a data read operation.

A pin terminal having a pin number 39 is supplied with a signal /LB indicating access to lower byte data, while that having a pin number 40 is supplied with a signal /UB indicating access to upper byte data. The signals /UB and /LB are utilized when the SRAM has a ×16 or ×18 structure. When the SRAM has a ×16 structure, bits DQ1 to DQ8 form a lower byte, and bits DQ9 to DQ16 form a upper byte. When the SRAM has a ×18 structure, on the other hand, data bits DQ1 to DQ9 form the lower byte, and bits DQ1 to DQ18 form the upper byte.

[Logic of External Control Signal]

FIG. 2 illustrates logics of external control signals for the SRAM according to the embodiment of the present invention in a list. As shown in FIG. 2, the external control signals /CS, /WE, /OE, /UB and /LB enter active states when these are at low levels ("L"). When the chip selection signal /CS is at a high level ("H"), the SRAM enters a nonselected state, and the data input/output terminals DQ1 to DQ16 (or DQ1 to DQ18) enter high impedance states.

When the chip selection signal /CS is at a low level, on the other hand, the SRAM executes an operation in accordance with the states of the remaining external control signals. When the write enable signal /WE is at a high level and the output enable signal /OE is at a low level, a read cycle for data reading is specified. The target of data reading among upper, lower and full bytes is decided by the states of the signals /LB and /UB. Access to the lower byte data is authorized when the signal /LB is at a low level, while access to the upper byte data is authorized when the signal /UB is at a low level.

A write cycle for carrying out data writing is specified when the write enable signal /WE is at a low level. Also in this case, a byte region for writing data is determined by the signals /LB and /UB.

When both of the write enable signal /WE and the output enable signal /OE or both of the signals /LB and /UB are at high levels, the SRAM enters an output disable state and all data input/output terminals enter high impedance states.

[Chip Layout]

[Power Source/Ground Line Layout]

Figure 3:
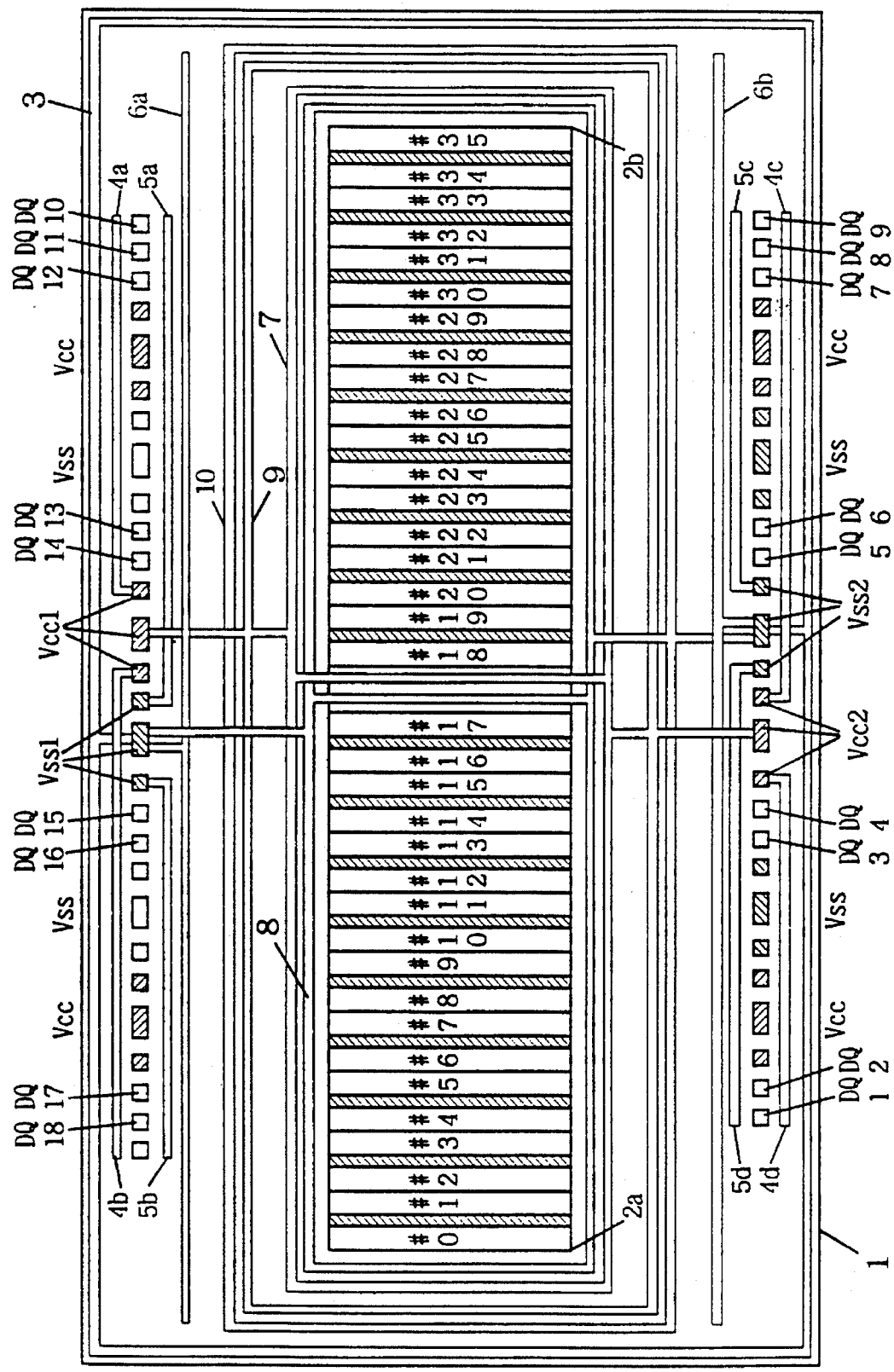
FIG. 3 illustrates arrangement of power supply lines and parts of pads in the interior of the SRAM according to the present invention.

FIG. 3 illustrates arrangement of power supply lines and ground lines on the chip of the SRAM according no the present invention. Referring to FIG. 3, a chip 1 includes memory arrays 2a and 2b in its central portion. The memory array 2a includes memory blocks #0 to #17 while the memory array 2b includes memory blocks #8 to #35. Regions located between the memory blocks, shown by slant lines, are local decoders for selecting word lines from the memory blocks. These local decoders are described later.

Pads are arranged on side end portions along longer sides of the chip 1. FIG. 3 shows pads for receiving a supply potential Vcc, those for receiving a ground potential Vcc, and data input/output pads. The data input/output pads are shown in arrangement for a ×18 structure.

Pads for inputting/outputting the data bits DQ10 to DQ18 are arranged on one side of the chip 1, and power supply pads Vcc1 for receiving the supply potential Vcc and ground pads Vss1 for receiving the ground potential Vss are arranged between data input/output pads DQ14 and DQ15. Data input/output pads DQ1 to DQ9 are arranged on the other side of the chip 1, and supply potential pads Vcc2 and ground potential pads Vss2 are arranged between the data input/output pads DQ4 and DQ5. Each set of the power supply pads Vcc1 and Vcc2 and the ground pads Vss1 and Vss2 includes three pads.

A ground line 3 is arranged along the periphery of the chip 1, to be connected to the central one of the ground pads Vss. The ground line 3 is formed by a first level aluminum wiring layer, for example. This ground line 3 is utilized in common for the internal circuits.

A power supply line 4a rightwardly extending in FIG. 3 along a long side of the chip 1 is connected to the right one of the power supply pads Vcc1, while a power supply line 4b leftwardly extending in FIG. 3 along the periphery of the chip 1 is connected to the left one of the power supply pads Vcc1. Further, a ground line 5a extending in parallel with the power supply line 4a is connected to the right one of the ground pads Vss1, while a ground line 5b extending in parallel with the power supply line 4b is connected to the left one of the ground pads Vss1.

Further, a ground line 6a extending in parallel with the ground lines 5a and 5b is connected to the central one of the ground pads Vss1. A power supply line 7 which is arranged to enclose the memory arrays 2a and 2b along the peripheries thereof is connected to the central one of the power supply pads Vcc1, while a ground line 8 which is arranged to enclose the memory arrays 2a and 2b is connected to the central one of the ground pads Vss1. The power supply line 7 and the ground line 8 are also connected to the central ones of the power supply pads Vcc2 and the ground pads Vss2.

The power supply line 4a and the ground line 5a are employed for data output circuitry for outputting the data bits DQ10 to DQ14 from the memory blocks #18 to #35 while the power supply line 4b and the ground line 5b are employed for output circuitry for outputting the data bits DQ15 to DQ18 from the memory blocks #0 to #17. The ground line 6a is utilized by a memory array driving circuit and a control circuit.

On the other side of the chip 1, a ground line 4c extending along the long side of the chip 1 in its periphery is connected to the right one of the ground pads Vss2, while a ground line 4d extending along the long side of the chip 1 in its periphery toward the memory array 2a is connected to the left one of the ground pads Vss2. A power supply line 5c extending in parallel with the ground line 4c is connected to the right one of the power supply pads Vcc2, while a power supply line 5d which is arranged in parallel with the ground line 4d is connected to the left one of the power supply pads Vcc2. The power supply line 5c and the ground line 4c are employed for output circuitry for outputting the data bits DQ5 to DQ9 of the memory blocks #18 to #35, while the power supply line 5d and the ground line 4d are employed for circuitry for outputting the data bits DQ1 to DQ4 of the memory blocks #0 to #17.

The power supply lines and the ground lines are dedicatedly provided in the data output circuitry, for preventing a memory malfunction caused by fluctuation of the supply potential in data output. Further, a ground line 6b extending in parallel with the ground lines 4c and 4d is connected to the central one of the ground pads Vss2. This ground line 6b is utilized by the memory arrays, a control signal generation circuit and the like. The power supply line 7 and the ground line 8 are utilized by circuits provided in the memory arrays 2a and 2b.

Further, a power supply line 9 is arranged along the outer periphery of the power supply line 7, to be connected to the ground pads Vcc1 and Vcc2. In addition, a ground line 10 is provided along the outer periphery of the power supply line 9, to be connected to the central ones of the ground pads Vss2 and Vss1. The power supply line 9 and the ground line 10 are utilized by peripheral circuits of the memory arrays. The power supply pads Vcc1 and Vcc2 and the ground pads Vss1 and Vss2 are connected to corresponding power supply pins and corresponding ground pins in the pin arrangement shown in FIG. 1 respectively. The power supply lines and the ground lines are provided for the respective circuits, for reducing influence by potential fluctuation. The power supply lines 4a to 4d, 7 and 9 are formed by second level aluminum wiring layers, while the ground lines 5a to 5d, 6a, 6b, 8 and 10 are also formed by second level aluminum wiring layers. The power supply pads Vcc and the ground pads Vss connected with no wires are connected to proper power supply pads or ground pads in the interior.

[Chip Architecture]

Figure 4:
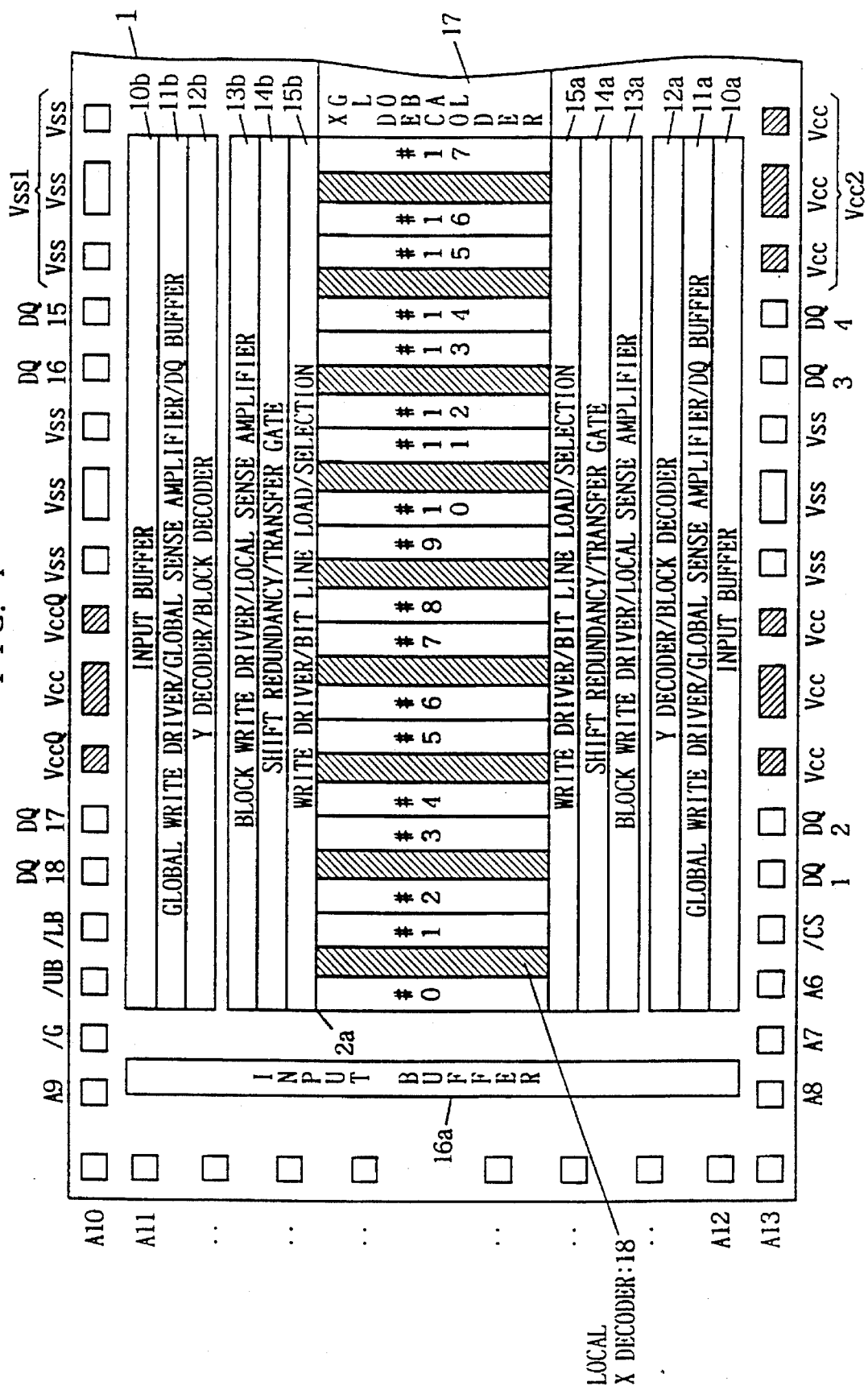
FIG. 4 schematically illustrates a layout of the SRAM according to the present invention.
Figure 5:
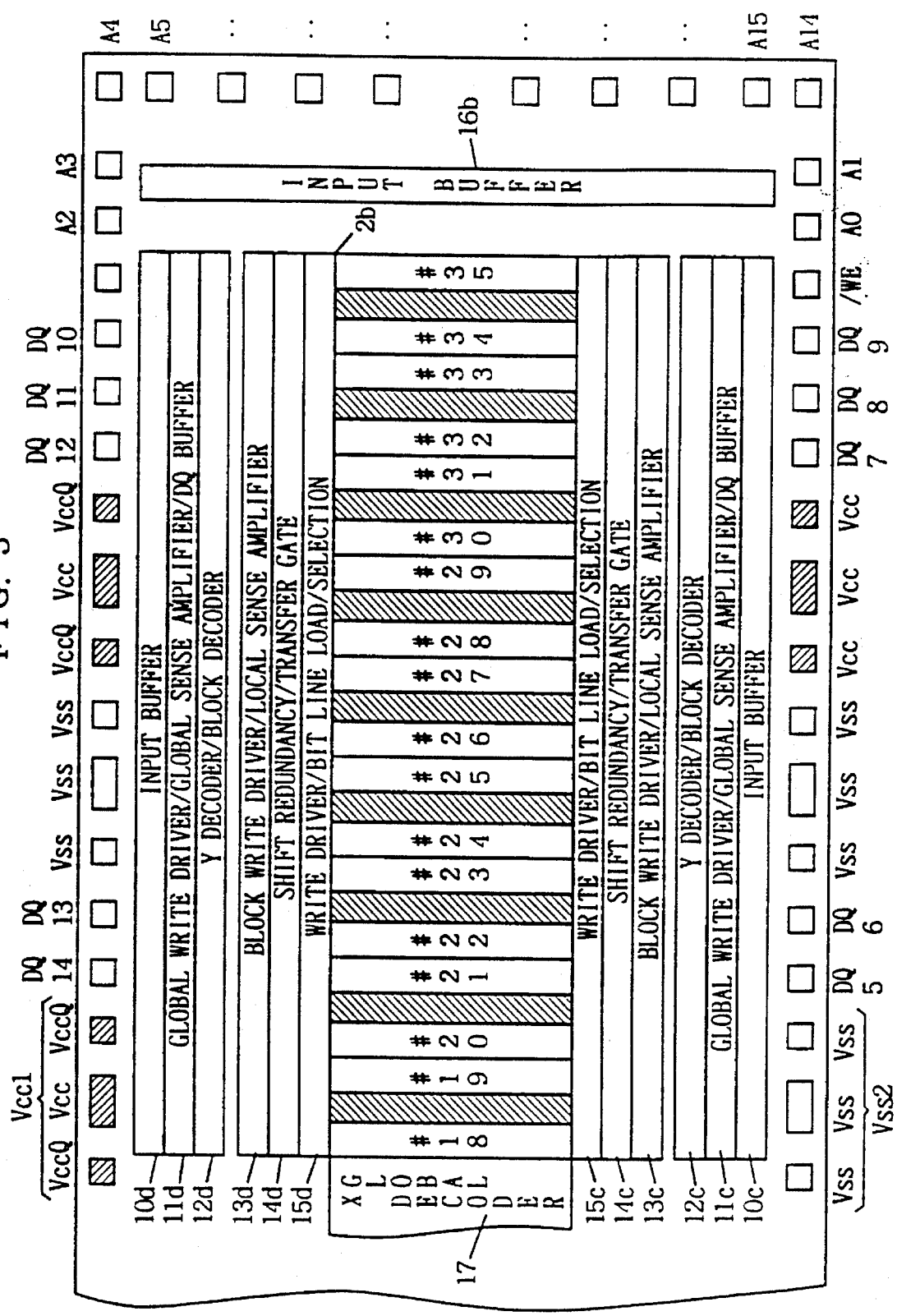
FIG. 5 schematically illustrates a chip layout of the SRAM according to the present invention.

FIGS. 4 and 5 are block diagrams schematically showing architecture on the chip of the SRAM according to the present invention. FIG. 4 shows a structure of the portion of the memory blocks #0 to #17, while FIG. 5 shows that of the portion of the memory blocks #18 to #35.

Referring to FIG. 4, each of the memory blocks #0 to #35 comprises a upper byte data storage region and a lower byte data storage region. Therefore, circuit structures are provided for controlling access to upper and lower byte data respectively. Referring to FIG. 4, an input buffer 10a for receiving control and address signals, a global write driver/global sense amplifier/DQ buffer block 11a, and a Y decoder/block decoder block 12a are provided under the memory blocks #0 to #17.

In the global write driver/global sense amplifier/DQ buffer block 11a, the DQ buffer includes a write buffer for generating internal write data from external write data and an output buffer for generating external read data from data read from the interior, and the global write driver generates internal write data in activation of the write enable signal in accordance with the write data received from the DQ buffer. The global sense amplifier amplifies selected memory cell data and generates internal read data, for supply to the output buffer of the DQ buffer.

In the Y decoder/block decoder block 12a, the block decoder decodes address signals from the input buffer 10a and another input buffer 16a which is provided on a side end of the chip, and generates a block selection signal for selecting one block from the memory blocks #0 to #17. Each of the Y decoders, which are provided in correspondence to the memory blocks #0 to #17 respectively, is activated in response to the block selection signal received from the block decoder, and generates a column selection signal for selecting a column in the selected block. Each of the memory blocks #0 to #17 includes four I/O blocks as low byte data regions, and each Y decoder selects a column from each I/O block of each memory block.

A block write driver/local sense amplifier block 13a includes a block write driver and a local sense amplifier which are provided in correspondence to each of the memory blocks #0 to #17 respectively. The block write driver is activated in response to the block selection signal and the write command signal from the block decoder, and amplifies data read from the selected memory block to transmit the same to the global sense amplifier.

A shift redundancy/transfer gate block 14a is also provided in correspondence to each of the memory blocks #0 no #17 respectively. The shift redundancy/transfer gate block 14a shifts the column selection signal from the Y decoder by one column and transmits the same in response to presence/absence of a defective bit line pair. Namely, the shift redundancy/transfer gate block 14a has a structure of a shift redundancy circuit.

A write driver/bit line load circuit/column selection block 15a includes a write driver, a bit line load circuit and a column selection gate which are provided in correspondence to each bit line pair (column) of the memory blocks #0 to #17 respectively. The write driver transmits internal write data received from the corresponding block write driver onto the corresponding bit line pair. The bit line load circuit holds the corresponding bit line pair at prescribed potentials. The column selection gate connects the corresponding bit line pair to an internal data line (data read or write line) in accordance with the column selection signal through the Y decoder and the shift redundancy/transfer gate block 14a.

A global X decoder 17 is provided in common for the memory blocks #0 to #17. This global X decoder 17 selects a global word line which is arranged in common for the memory blocks #0 to #17 Local X decoders are provided for the memory blocks #0 to #17 respectively. Each local X decoder further decodes a row address signal in accordance with a word line driving signal on a global word line which is transmitted from the global X decoder 17, to select one row from the corresponding memory block.

These blocks 10a to 15a execute data writing and data reading with respect to lower byte data in the memory blocks #0 to #17.

Similarly to the above, a write driver/bit line load circuit/column selection block 15b, a shift redundancy/transfer gate block 14b, a block write driver/local sense amplifier block 13b, a Y decoder/block decoder block 12b, a global write driver/global sense amplifier/DQ buffer block 11b, and an input buffer 10b are also provided with respect to upper byte data access regions of the memory blocks #0 to #17. In these memory blocks #0 to #17, the upper byte data storage regions store the data bits DQ15 to DQ18, while the lower byte data storage regions store the data bits DQ1 to DQ4. One memory block is brought into a selected state. Each memory block includes eight I/O blocks. Four I/O blocks are the upper byte data storage regions, while other four blocks are the lower byte data storage regions.

Referring to FIG. 5, an input buffer block 10c, a global write driver/global sense amplifier/DQ buffer block 11c, a Y decoder/block decoder block 12c, a block write driver/local sense amplifier block 13c, a shift redundancy/transfer gate block 14c and a write driver/bit line load circuit/column selection gate block 15c are also provided for the memory blocks #18 to #35 for accessing lower byte data. Further, an input buffer 10d, a global write driver/global sense amplifier/DQ buffer block 11d, a Y decoder/block decoder block 12d, a block write driver/local sense amplifier block 13d, a shift redundancy/transfer gate block 14d, a write driver/bit line load circuit/column selection gate block 15d and an input buffer 16b are also provided for accessing upper byte data.

In the memory blocks #18 to #35, each memory block includes eight I/O blocks. In the memory blocks #32 to #35 which are parity bit storage regions, 4×8=32 I/O blocks are ensured as the parity bit storage regions. Therefore, the memory blocks #18 to #31 are selected in accordance with decoder outputs. The upper byte data storage regions of the memory blocks #18 to #31 store the data bits DQ11 to DQ14, while the lower byte data storage regions store the data bits DQ5 to DQ8. The data bits DQ9 and DQ10 are parity bits. In accordance with a selected memory block, corresponding two of the 32 I/O blocks provided in the memory blocks #32 to #35 are accessed (in the case of a ×18 bit structure).

The global X decoder 17 brings the global word line which is arranged in common for the memory blocks #18 to #35 into a selected state in accordance with an address signal. Each local X decoder shown by slant lines in FIG. 5 is activated in accordance with a signal on the global word line, to carry out a decoding operation. Namely, this SRAM has a hierarchic word line structure of local and global word lines. The global X decoder 17 simultaneously brings the global word lines into selected states in the memory arrays 2a and 2b.

Figure 6:
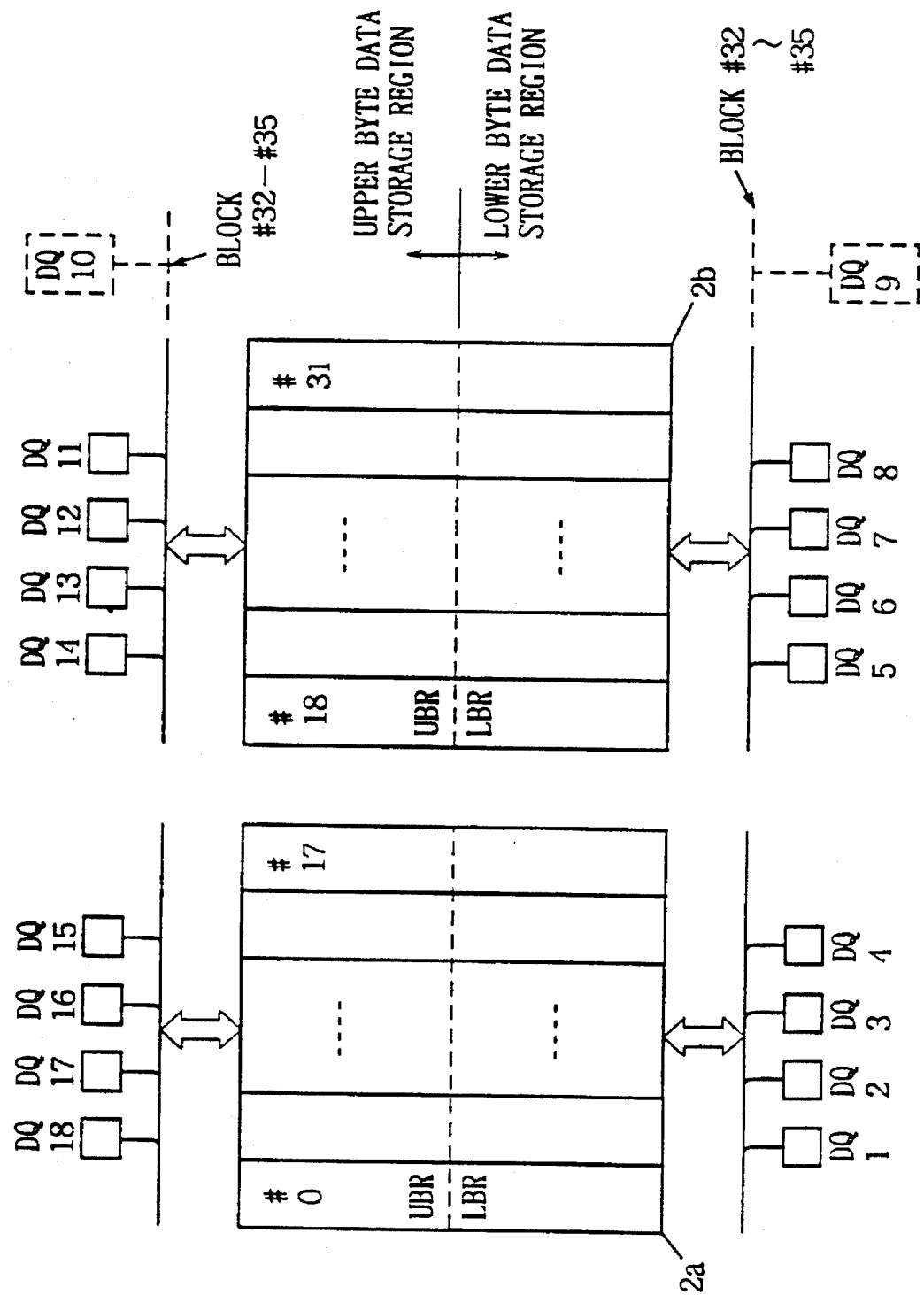
FIG. 6 schematically illustrates correspondence between memory blocks and data input/output terminals in the SRAM according to the present invention.

FIG. 6 shows connection between the memory blocks and the data input/output terminals in the case of a ×18 bit structure. The 32 blocks consisting of the memory blocks #0 to #31 are utilized as information bit storage regions. The remaining four memory blocks #32 to #35 (not shown) are utilized as parity bit storage regions. Each of the memory blocks #0 to #31 includes an upper byte data storage region UBR and a lower byte data storage region LBR. The global X decoder (see FIGS. 4 and 5) selects one memory block in each of the memory arrays 2a and 2b.

In the memory array 2a, the upper byte data storage region UBR of the selected memory block is connected to the data input/output terminals DQ15 to DQ18, while the lower byte data storage region LBR executes data input/output with the data input/output terminals DQ1 to DQ4. In the memory array 2b, on the other hand, the upper byte data storage region UBR of the selected memory block executes data input/output with the data input/output terminals DQ11 to DQ14, while the lower byte data storage region LBR executes data input/output with the data input/output terminals DQ5 to DQ8.

In the parity bit storage regions, i.e., the memory blocks #32 to #35 (not shown), parity bit storage regions for upper and lower byte data are selected in accordance with a selected memory block. The memory block for the parity bit storage regions is normally brought into a selected state regardless of the block decoder output. The block write driver or the local sense amplifier is selectively brought into an active state in correspondence to the selected memory block. Namely, each memory block includes four I/O blocks (blocks serving as units for transferring data with different data input/output terminals respectively) as the upper byte data storage region. Therefore, the memory blocks for storing parley bits include 4×4=16 I/O blocks for the upper byte data, as well as 4×4=16 I/O blocks as lower byte data storage regions. When one I/O block is selected from the 16 I/O blocks in accordance with the selected memory block, therefore, it is possible to select parity bits for the upper and lower byte data respectively.

In the memory array 2a, circuitry for outputting the upper byte data and that for outputting the lower byte data have independent power supply and ground lines, and are supplied with operating supply voltages therefrom. In the memory array 2b, on the other hand, data output circuitry are supplied with operating supply voltages from separate power supply and ground lines in order to output data from the upper byte data storage regions UBR and the lower byte data storage regions LBR respectively.

Figure 7:
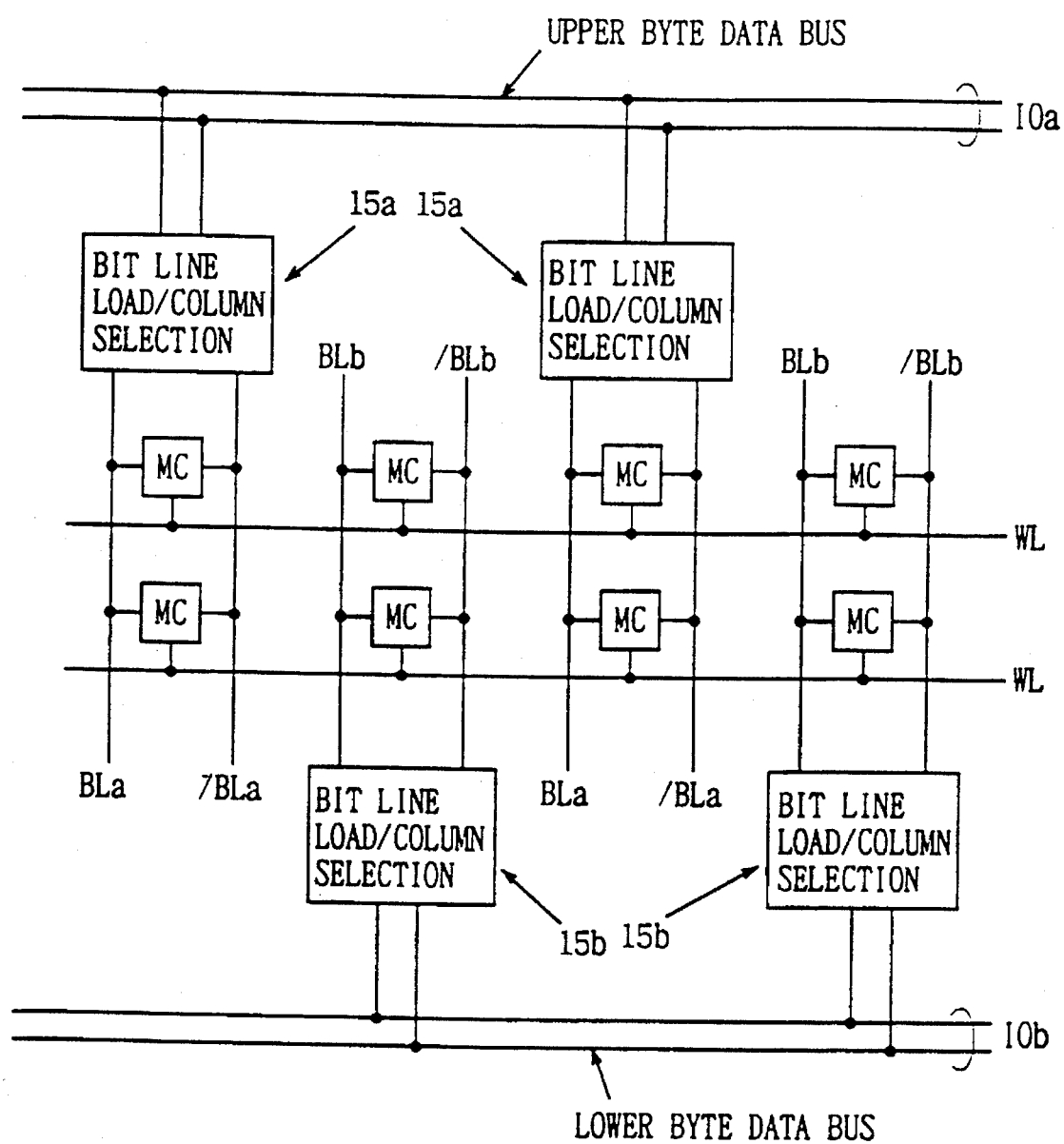
FIG. 7 schematically illustrates structures of the memory blocks provided in the SRAM according to the present invention.

FIG. 7 schematically illustrates memory arrangement in each I/O block. Referring to FIG. 7, a row of memory cells are connected to each word line WL, while a column of memory cells are connected to each bit line pair BL and BL respectively (in one I/O block). The bit line load circuit/column selection circuit blocks 15 are alternately arranged on both sides of the bit line pairs BL and /BL. The bit line load circuit/column selecting circuit blocks 15a are provided for bit line pairs BLa and /BLa, which are connected to upper byte data-buses I/Oa. The bit line load circuit/column selection circuit block 15a holds the corresponding bit line pair, BLa and /BLa, at a prescribed potential.

On the other hand, the bit line load circuit/column selecting circuit blocks 15b which are provided for bit line pair BLb and /BLb connect the bit line pair BLb and /BLb to lower byte data bus I/Ob. The bit line load circuit/column selecting circuit block 15b holds the corresponding bit lines BLb and /BLb at a prescribed potential, similarly to the above.

Due to the "bit line load interleave" structure of alternately arranging the bit line load circuit/column selection circuit blocks on both sides of the bit line pairs, it is possible to arrange the bit line load circuit/column selection circuit blocks with a sufficient margin even if the bit line pitch is reduced in each I/O block, in dividing each memory block into the upper and lower byte data storage regions without penalty of the degree of integration.

Figure 8:
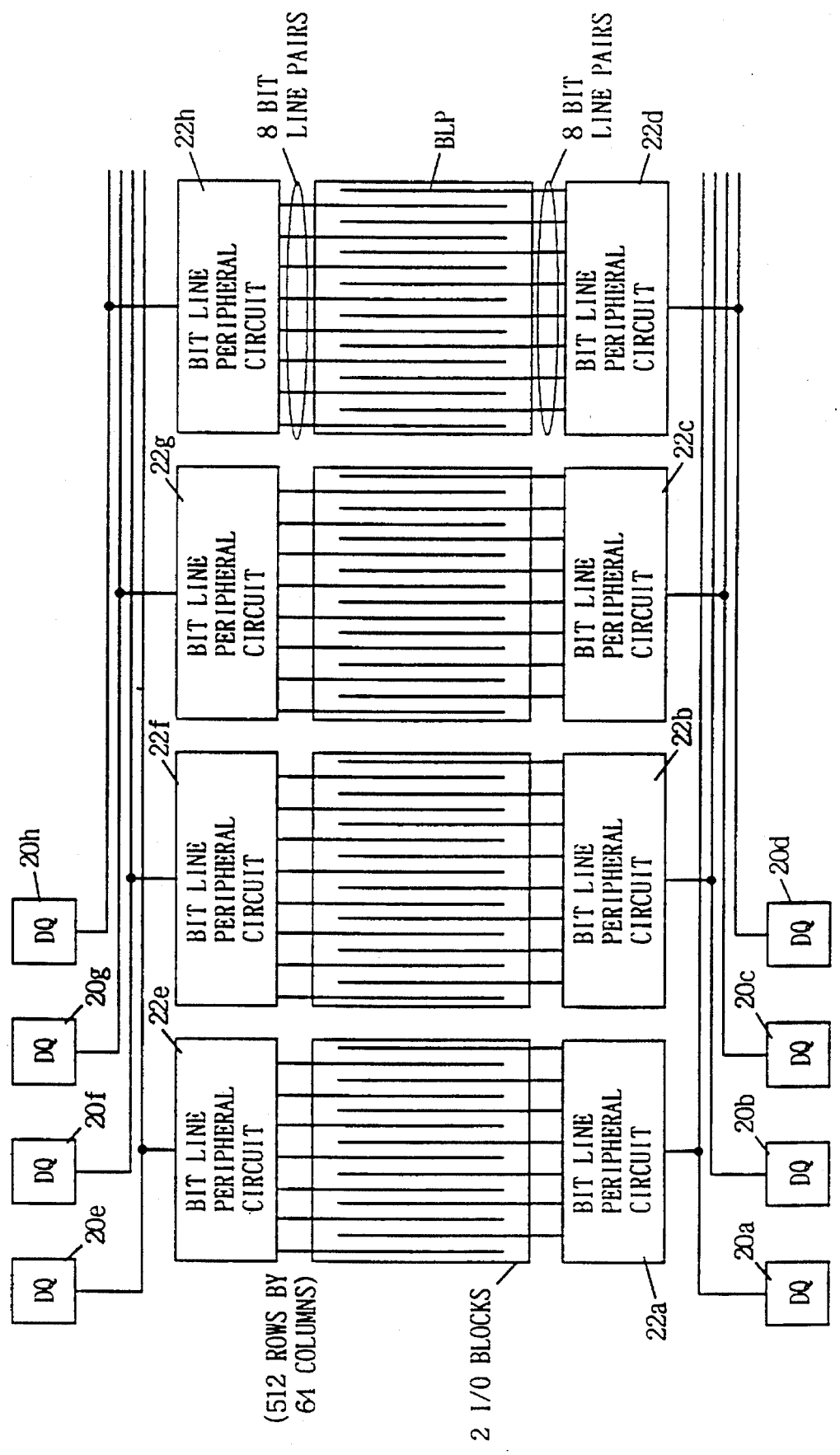
FIG. 8 schematically illustrates the structure of each memory block provided in the SRAM according to the present invention.

FIG. 8 conceptually illustrates a structure of each memory block. Each memory block corresponds to eight data input/output terminals 20a to 20h. The data input/output terminals 20a to 20d correspond to the lower byte data bits, while the data input/output terminals 20e to 20h correspond to the upper byte data bits. Bit line pairs BLP are of an interleave type, so that those corresponding to the upper byte data bits are alternately arranged with those corresponding to the lower byte data bits. Eight bit line pairs form a single group, and a single bit line peripheral circuit 22 is provided for such eight bit line pairs. Therefore, eight bit line peripheral circuits 22a to 22h are provided in total. Each of the bit line peripheral circuits 22a to 22h includes a bit line load circuit, a write gate, a read gate, a local sense amplifier, a local write driver, a write gate and the like, as described later in detail.

The bit line peripheral circuits 22a to 22d correspond to the data input/output terminals 20a to 20d respectively, while the bit line peripheral circuits 22e to 22h correspond to the data input/output terminals 20e to 20h respectively. Each of the bit line peripheral circuits 22a to 22h selects a pair of bit lines from eight pairs of bit lines in selection. Therefore, each memory block includes 8×4×2=64 pairs of bit lines, i.e., 64 columns. The number of the word lines is 512, as described later. Therefore, each memory block has memory capacity of 512×64=$2^5 \cdot 2^{10}$=32 Kbits.

[Functional Structure]

Figure 9:
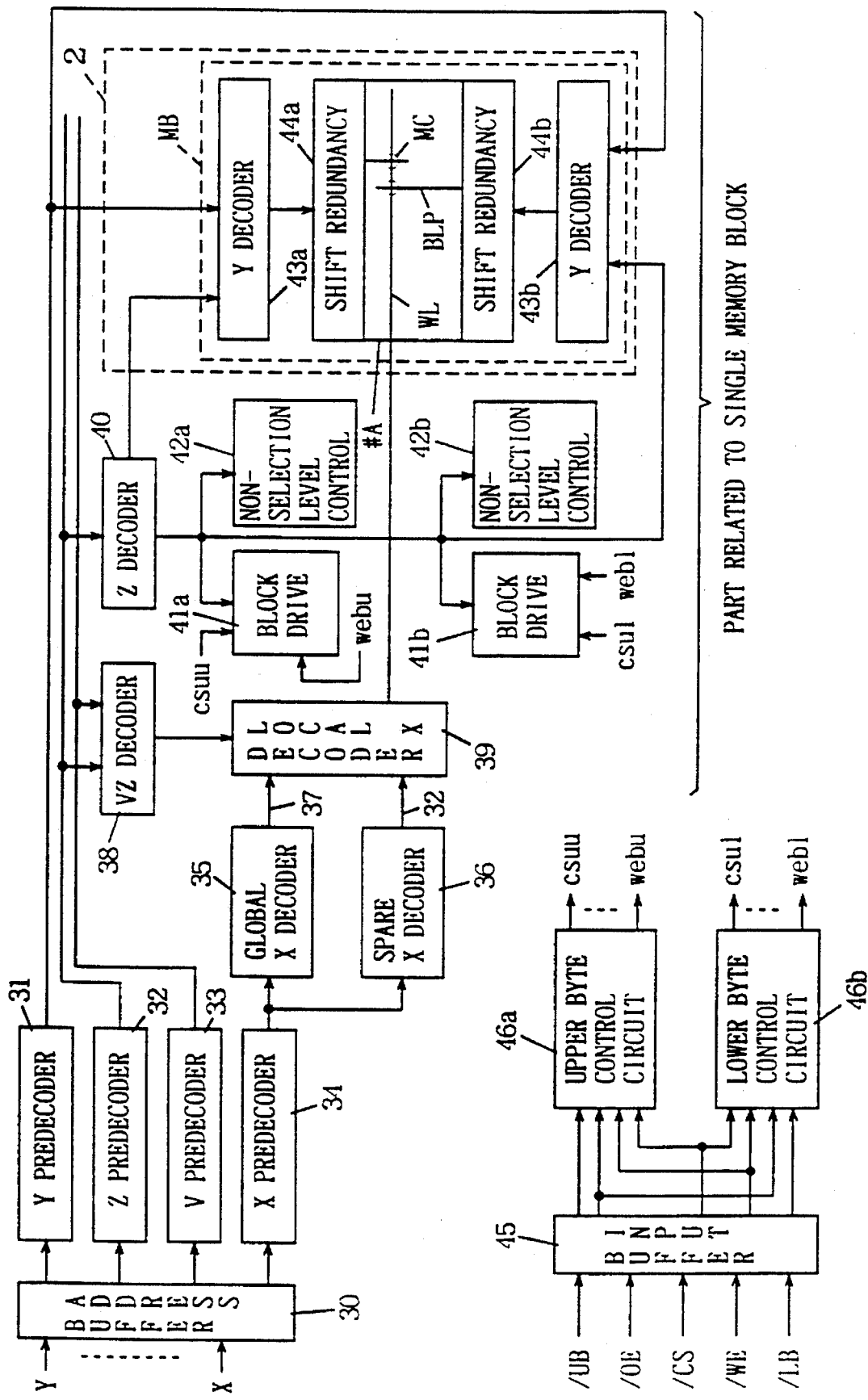
FIG. 9 schematically illustrates the functional structure of the SRAM according to the present invention.

FIG. 9 is a block diagram schematically showing the functional structure of the SRAM according to the present invention. In order to simplify the illustration, FIG. 9 shows a memory array 2 including a single memory block #A. While the memory block #A has memory cells which are arranged in a plurality of rows and a plurality of columns, FIG. 9 typically illustrates a single word line WL and a single bit line pair BLP. Each memory cell MC is arranged in correspondence to an intersection between the word line WL and the bit line pair BLP.

Referring to FIG. 9, the SRAM includes an address buffer 30 which receives X and Y address signals X and Y for generating internal address signals, and predecoders 31 to 34 for predecoding the internal address signal received from the address buffer 30. The word line WL has a hierarchial structure including a global word line which is arranged in common for respective memory blocks and a local word line which is arranged in each memory block. Memory cells (including both of memory cells for storing upper and lower byte data) of rows in the corresponding memory block are connected to the local word line.

The X predecoder 34 predecodes the internal X address signals, such as bits X2 to X8 and /X2 to /X8, for example, received from the address buffer 30, and supplies the result of the predecoding to a global X decoder 35 (17 in FIGS. 4 and 5) and a spare X decoder 36. The global X decoder 35 brings a corresponding global word line 37 into a selected state in accordance with the predecoded internal X address signal. The spare X decoder 36 is activated when a defective global word line is addressed, to bring a corresponding spare global word line into a selected state.

A single global word line is provided with a plurality of (four in this embodiment) local word lines in each memory block. A V predecoder 33 predecodes the internal X address signals, such as bits X0 and X1, for example, received from the address buffer 30, and generates a predecode signal for selecting one from the plurality of local word lines corresponding to the global word line.

A Z predecoder 32 decodes the internal Y address signals, such as bits Y3 to Y6 and /Y3 to /Y6 in the case of a ×18 structure, for example, received from the address buffer 30, and generates a predecode signal for selecting the memory block in the memory array 2.

A Y predecoder 31 predecodes the internal Y address signals, such as bits Y0 to Y2, for example, received from the address buffer 30, and outputs a Y predecode signal for selecting one column from each I/O block in one memory block.

The predecode signal outputted from the V predecoder 32 and a Z predecode signal outputted from the Z predecoder 32 are supplied to a VZ decoder 38, while the Z predecode signal outputted from the Z predecoder 32 is also supplied to a Z decoder 40.

The VZ decoder 38 generates a signal for selecting one from a plurality of local word lines corresponding to one global word line in the selected memory block. The Z decoder 40 generates a block selection signal for selecting the memory block in the memory array 2.

Outputs of the VZ decoder 38, the global X decoder 35 and the spare X decoder 36 are supplied to a local X decoder 39. The local X decoder 39, which is provided in correspondence to each memory block, brings the local word line in the selected memory block into a selected state. Thus, the word line (local word line) WL is brought into a selected state in the memory block #A shown in FIG. 9. This local word line WL brings both of the memory cells for storing the upper and lower byte data bits in the memory block #A.

A Y decoder 43a is activated in response to the block selection signal received from the Z decoder 40, and decodes the Y predecode signal received from the Y predecoder 31 to select the bit line pair BLP for upper byte data bits through a shift redundancy circuit 44a. The shift redundancy circuit 44a, which normally cuts off a defective bit line pair from an output node of the Y decoder 43a, transmits a column selection signal (output signal from the Y decoder 43a) to only a normal bit line pair.

A Y decoder 43b is activated from the block selection signal which is outputted from the Z decoder 40 and decodes the Y predecode signal received from the Y predecoder 31, to select a bit line pair for the lower byte data bits in the memory block #A.

The memory block #A comprises the upper and lower byte data storage regions, as hereinabove described. In order to independently drive the respective storage regions, the memory block #A is provided with a block driving circuit 41a and a nonselection level control circuit 42a for the upper byte data storage region, as well as a block driving circuit 41b and a nonselection level control circuit 42b for the lower byte data storage region.

The block driving circuit 41a controls the operation of the load circuit and operation timing and the block write driver provided for the bit line pair in the memory block #A, in response to control signals csuu and webu supplied from an upper byte control circuit 46a. The nonselection level control circuit 42a generates a nonselection level voltage for controlling operations of read gates provided in each bit line pair, in response to selection/nonselection of the corresponding memory block #A.

The block driving circuit 41b and the nonselection level control circuit 42b provided for the lower byte data storage region are activated in response to the block selection signal received from the Z decoder 40, to carry out operations similar to those of the circuits 41a and 42a for the upper byte data storage region. The operation of the block driving circuit 41b is controlled by internal control signals csul and webl outputted from a lower byte control circuit 46b.

The upper and lower byte control circuits 46a and 46b receive the control signals /UB, /OE, /CS, /WE and /LB through an input buffer 45, to generate necessary internal control signals. FIG. 9 typically shows only control signals related to a write operation. The upper byte control circuit 46a is activated when the signal /UB is in an active state, while the lower byte control circuit 46b is activated when the signal /LB is in an active state.

The VZ decoder 38 is provided for memory blocks storing information bits. V predecoder output is decoded with respect to memory blocks (blocks #32 to #35) storing parity bits. In these parity bit storage memory blocks, local sense amplifiers or local write drivers provided for the respective I/O blocks are brought into active slates in accordance with block selection signals from the Z decoder 40.

The buffers 30 and 45 have CMOS structures, while BiCMOS structures are employed for the decoders and control circuitry. CMOS structures are employed in low load regions, while BiMOS structures are applied to driving circuit parts. A continuous structure of BiMOS gates reducing signal amplitudes is avoided in consideration of the speed and reliability.

[Structure and Arrangement of Control Circuit]

Figure 10:
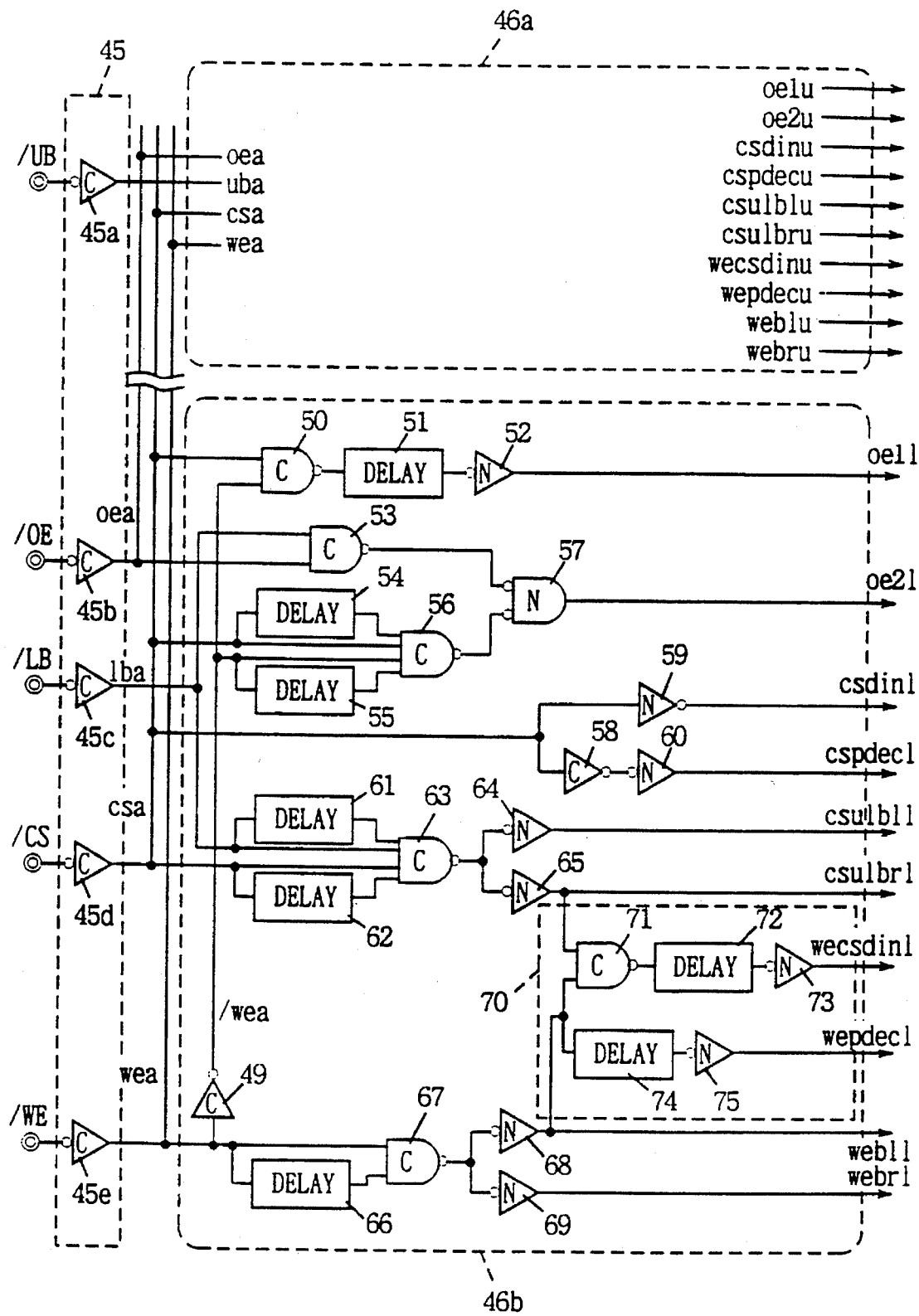
FIG. 10 illustrates a specific structure of a control signal generation circuit provided in the SRAM according to the present invention.

FIG. 10 illustrates a concrete structure applicable to each of the upper and lower byte control circuits shown in FIG. 9. FIG. 10 shows only the concrete structure of the lower byte control circuit 46b. The upper byte control circuit 46a has the same structure as the low byte control circuit 46b, except that the signal /UB is employed in place of the signal /LB.

Referring to FIG. 10, the input buffer 45 includes inverter buffers 45a, 45b, 45c, 45d and 45e which receive the signal /UB, the output enable signal /OE, the signal /LB, the chip selection signal /CS, and the write enable signal /WE respectively. The inverter buffers 45a to 45e output positive logic internal control signals uba, oea, lba, csa and wea respectively. These inverter buffers 45a to 45e have CMOS structures.

The lower byte control circuit 46b includes an inverter circuit 49 which inverts the internal write enable signa wea, a two-input NAND circuit 50 which receives the inverted internal write enable signal /wea from the inverter circuit 49 and the internal chip selection signal csa from the inverter buffer 45, a delay circuit 51 for delaying an output of the NAND circuit 50 for a prescribed time, and an inverter circuit 52 for inverting an output of the delay circuit 51. A signal oe11 outputted from the inverter circuit 52 is employed for activating a main amplifier (global sense amplifier) of a data output part described later.

The control circuit 46b further includes a two-input NAND circuit 53 which receives the internal signal lba from the inverter buffer 45c and the internal output enable signal oea from the inverter buffer 45b, a delay circuit 54 for delaying the internal chip selection signal csa for a prescribed time, a delay circuit 55 for delaying the internal write enable signal /wea from the inverter circuit 49 for a prescribed time, four-input NAND circuit 56 for receiving respective outputs of the delay circuits 54 and 55 and the internal signals csa and /wea, and a two-input NOR circuit 57 for receiving outputs of the NAND circuits 53 and 56. An internal control signal oe21 outputted from the NOR circuit 57 is employed for enabling a data output buffer.

The lower byte control circuit 46b further includes an inverter circuit 59 for inverting the internal chip selection signal csa, and two stages of cascade-connected inverter circuits 58 and 60 for receiving the internal chip selection signal csa. A signal csdinl outputted from the inverter circuit 59 is employed for bringing a data input buffer provided for lower byte data into an active state. A signal cspdecl outputted from the inverter circuit 60 provides timing for incorporating the address signals of the X and Z predecoders.

The lower byte control circuit 46b further includes a delay circuit 61 for delaying the internal signal lba for a prescribed time, a delay circuit 62 for delaying the internal chip selection signal csa for a prescribed time, a four-input NAND circuit 63 for receiving respective outputs of the delay circuits 61 and 62 and the internal signals lba and csa, and inverter circuits 64 and 65 for inverting an output of the NAND circuit 63. The inverter circuits 64 and 65, which are provided in parallel with each other in correspondence to the two memory arrays 2a and 2b respectively, are employed for activating the block driving circuits for controlling operations of the bit line load circuits.

The lower byte control circuit 46b further includes a delay circuit 66 for delaying the internal write enable signal wea for a prescribed time, a two-input NAND circuit 67 for receiving an output of the delay circuit 66 and the internal write enable signal wea, and inverter circuits 68 and 69 which are provided in parallel with each other for receiving an output of the NAND circuit 67. Signals webll and webrl which are outputted from the inverter circuits 68 and 69 are transmitted to different memory arrays respectively, to be employed for activating block the driving circuits provided in the lower byte data storage regions.

The lower byte control circuit 46b further includes a two-input NAND circuit 71 for receiving outputs of the inverter circuits 65 and 68, a delay circuit 72 for delaying an output of the NAND circuit 71 for a prescribed time, an inverter circuit 73 for inverting an output of the delay circuit 72, a delay circuit 74 for delaying an output of the inverter circuit 68 for a prescribed time, and an inverter circuit 75 for inverting an output of the delay circuit 74. A signal wecsdinl which is outputted from the inverter circuit 73 is employed for activating the global write driver provided for the lower byte data, while a signal wepdecl which is outputted from the inverter circuit 75 is employed in the X and Y predecoders for delaying rise timing of word lines in change of an operation mode from a data write operation to a data read operation.

The signal wecsdinl is generated with a delay time, in order to reduce the amplitudes of the bit line potentials, as described later in detail.

A NAND circuit generally outputs a low-level signal only when all input signals go high. The delay circuits 54 and 55 delay the internal signals csa and /wea respectively, and the output of the NAND circuit 56 goes low after a lapse of a prescribed time from starting of a data read cycle. Thus, the data output buffer is brought into an active state after the main amplifier is activated by the signal oe11 and read data are amplified, so that valid data are reliably outputted.

The delay circuits 61 and 62 delay the signals lba and csa for prescribed times respectively. Thus, the output of the NAND circuit 63 goes low after a lapse of a prescribed time upon starting of access, to drive the block driving circuit. This driving circuit, whose structure is described later in detail, controls operations of the block write driver and the bit line load circuit provided for each block. Thus, an address enters a definite state. In other words, the selected block is prevented from entering a write stale before selection of the local word line or entrance of the column selection signal line into a selected state.

The delay circuit 66 also delays the internal write enable signal wea for a prescribed time, to delay transient timing for activation of the internal write signal for a prescribed time. Thus, the signals webll and webrl are prevented from entering definite states before address definition. The delay circuit 62 delays the internal chip selection signal csa for a prescribed time, in order to delay word line rise timing by a prescribed time for providing a sufficient margin for recovery of bit line potentials when potentials of a bit line pair enlarged to a Vcc level are recovered to prescribed potentials by the bit line load circuit in a data write operation and a data read cycle is subsequently performed.

Figure 11:
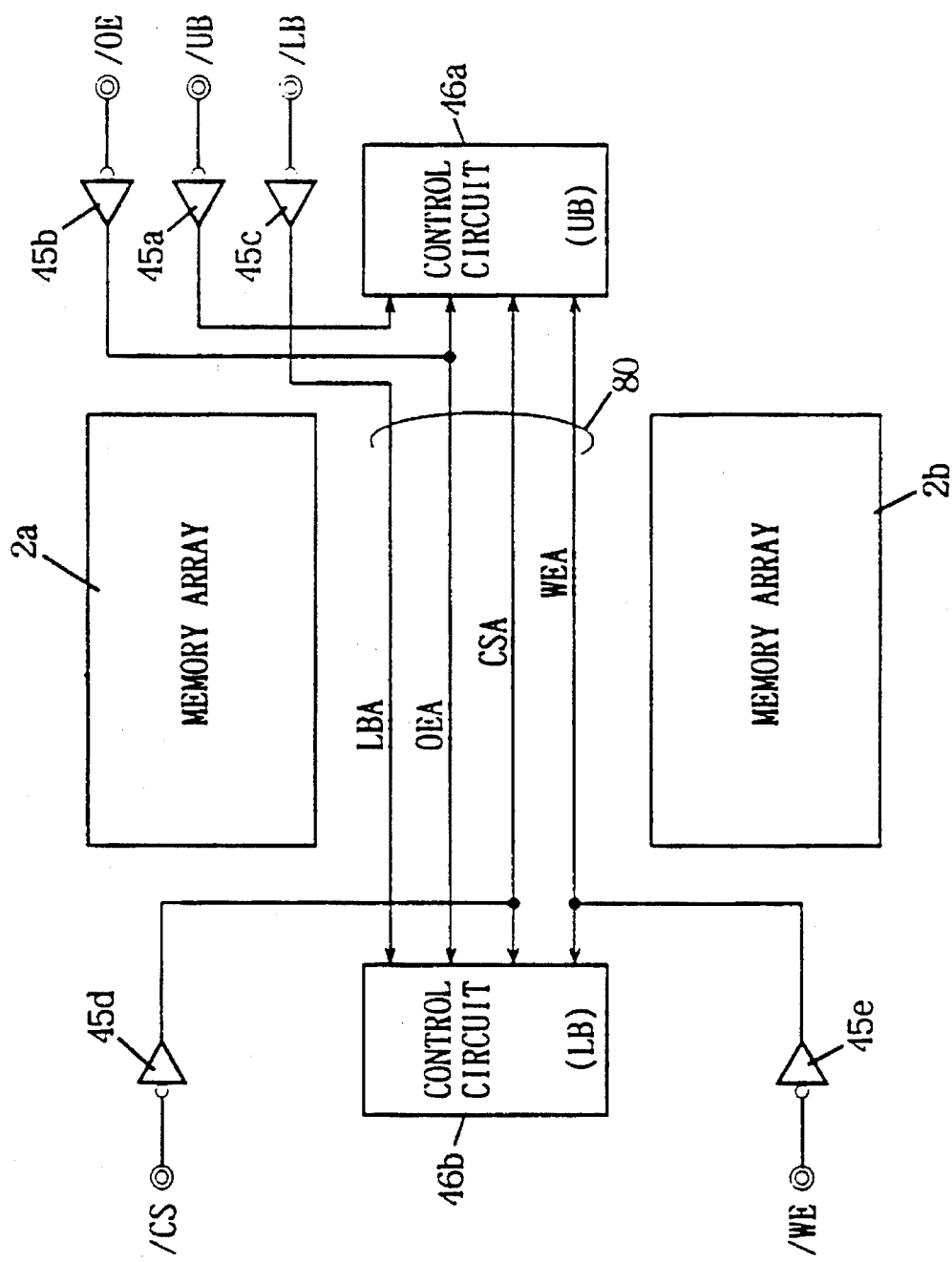
FIG. 11 illustrates arrangement of control circuits in the SRAM according to the present invention.

As clearly understood from the pin arrangement shown in FIG. 1, pin terminals for receiving the output enable signal /OE and the signals/UB and /LB are provided on one side of the chip of the SRAM, while those for receiving the chip selection signal /CS and the write enable signal /WE are provided on the other side of the chip. As shown in FIG. 11, therefore, the inverter buffers 45a to 45c included in the input buffer 45 are arranged on one side of the memory arrays 2a and 2b, while the inverter buffers 45d and 45e are arranged on the other side of the memory arrays 2a and 2b. FIG. 11 shows 2he inverter buffers 45a to 45c which are arranged in proximity to one side of the memory array 2a, the inverter buffer 45d which is arranged in proximity to the other side of the memory array 2a, and the inverter buffer 45e which is arranged in proximity to the other side of the memory array 2b.

The upper byte control circuit 46 is arranged on one side of a central portion between outer peripheries of the memory arrays 2a and 2b, while the lower byte control circuit 46b is arranged on the other side of the central portion between the outer peripheries of the memory arrays 2a and 2b, to be opposed to the control circuit 46a. Output signal lines from the inverter buffers 45a to 45e are connected to the upper and lower byte control circuits 46a and 46b respectively. In order to prevent signal propagation delay caused by wiring resistance, signal wires 80 which are arranged in a region between the memory arrays 2a and 2b are increased in width to 4 μm, for example, as compared with ordinary signal wires, thereby preventing increase in wiring resistance.

In order to transmit the control signals to the control circuits 46a and 46b at a high speed, transistors forming the inverter buffers 45a to 45e are sufficiently increased in size to be doubled as compared with those of address input buffers, for example, and improved in drivability, thereby preventing occurrence of signal propagation delay by driving the signal wires at a high speed.

The internal control signals outputted from the control circuits 46a and 46b are transmitted to the respective memory blocks of the memory arrays 2a and 2b. Logics with other signals are taken in each memory block, to generate necessary write control signals. Logics of the write control signals are taken only in the vicinity of the blocks, to transmit the write control signals at a high speed.

Figure 12:
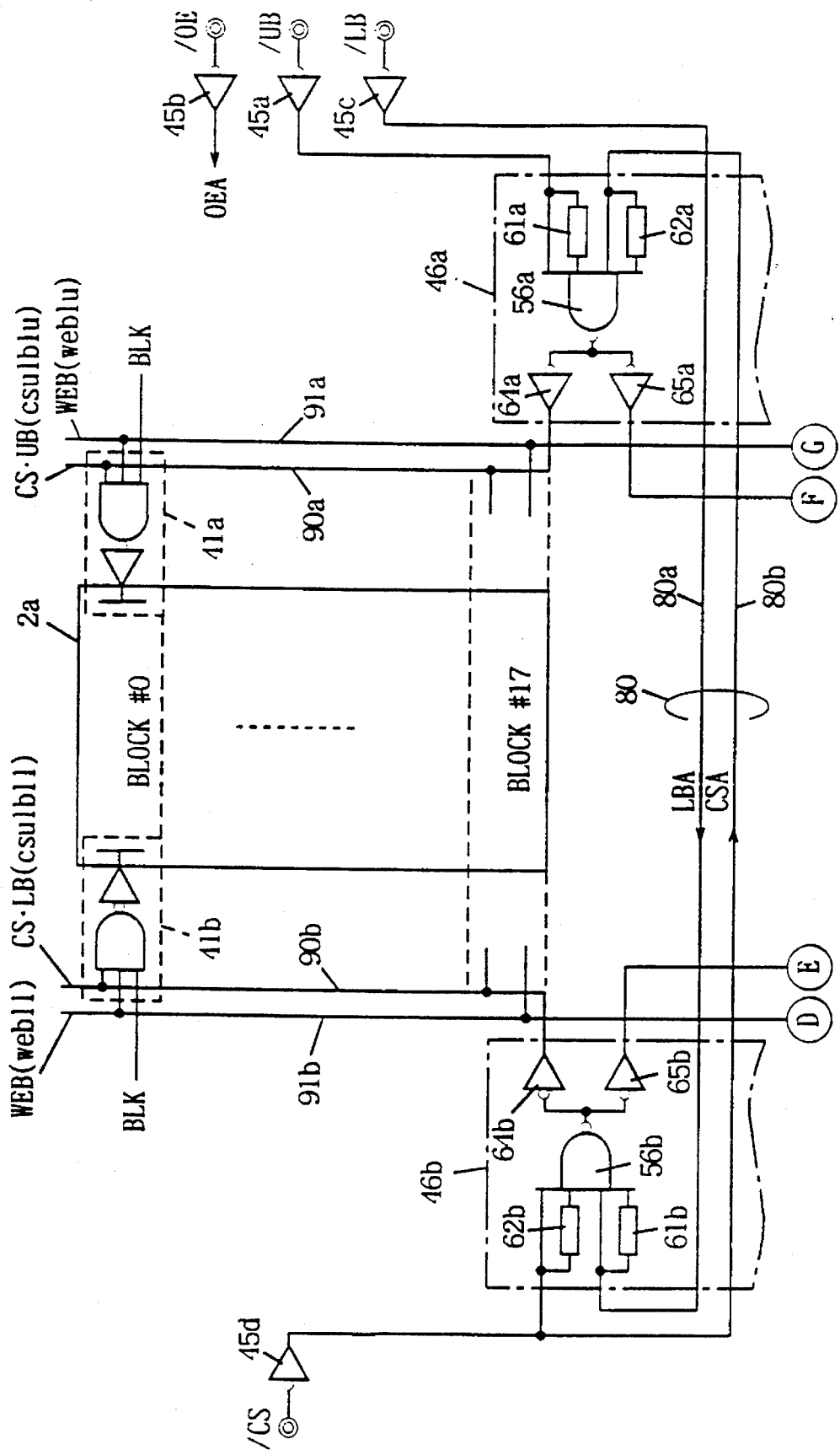
FIG. 12 illustrates arrangement of the control signal generation circuits in the SRAM according to the present invention.
Figure 13:
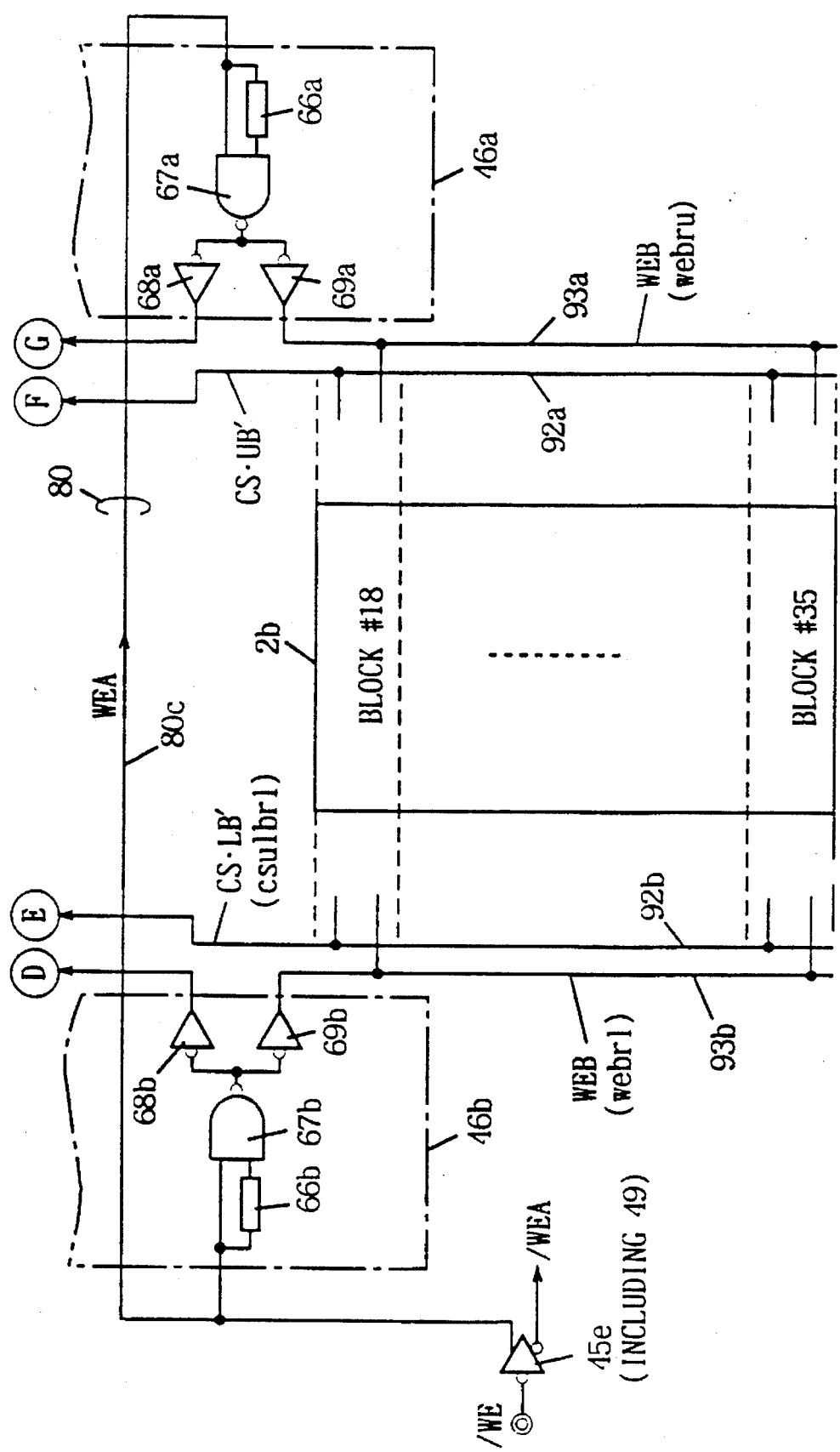
FIG. 13 illustrates arrangement of a write control signal generation circuit provided in the SRAM according to the present invention.

FIGS. 12 and 13 illustrate structures and arrangements of parts related to write control signals. Referring to FIGS. 12 and 13, elements corresponding to those of the control circuits 46a and 46b shown in FIG. 11 are denoted by the same reference numerals. Further, elements of the upper byte control circuit 46a are shown with subscripts a, to clarify correspondence to those of the lower byte control circuit 46b.

Referring to FIGS. 12 and 13, the signal from the inverter buffer 45c is transmitted to the lower byte control circuit 46b across the memory arrays 2a and 2b through a signal wire 80a. The internal chip selection signal CSA from the inverter buffer 45d is transmitted to the upper byte control circuit 46a through a signal wire 80b, while the internal write enable signal wea from the inverter buffer 45e is transmitted to the upper byte control circuit 86a through a signal wire 80c. Internal activation signals CS·UB from the upper byte control circuit 46a are transmitted to the block driver circuit parts of the memory blocks of the memory arrays 2a and 2b respectively through signal wires 90a and 92a. Write command signals WEB (weblu and webru) from the upper byte control circuit 46a are transmitted to the respective memory blocks of the memory arrays 2a and 2b through signal wires 91a and 93a respectively.

Internal enable signals CS·LB (csulbll and csulbrl) from the lower byte control circuit 46b are transmitted to the respective memory blocks of the memory arrays 2a and 2b through signal wires 90b and 92b respectively. Internal write command signals WEB (webll and webrl) from the lower byte control circuit 46b are transmitted to the respective memory blocks of the memory arrays 2a and 2b through signal wires 91b and 93b respectively.

In the memory blocks (blocks #0 to #35) of the memory arrays 2a and 2b, the block driving circuits 41a and 41b are enabled in response to block selection signals BLK respectively, to take logics of internal write command signals and internal selection signals and generate write control signals for corresponding blocks. Since logics for generating write control signals are taken in portions close to the blocks, it is possible no minimize signal propagation delay of the write control signals. Since the write control signals can be driven at a high speed, it is possible to execute a write operation at a high speed, thereby improving write recovery characteristics.

As hereinabove described, the upper and lower byte data control circuits are so structured that the signal /WE for controlling writing is not directly combined with the upper or lower byte enable signal /UB or /LB but logics of the write control signals are taken only in the vicinity of the respective memory blocks, whereby it is possible to remarkably reduce gate delay of the signals of the write control circuitry for executing the write operation at a high speed, thereby enlarging an operation margin in write recovery.

[Decoder Circuit]

Figure 14:
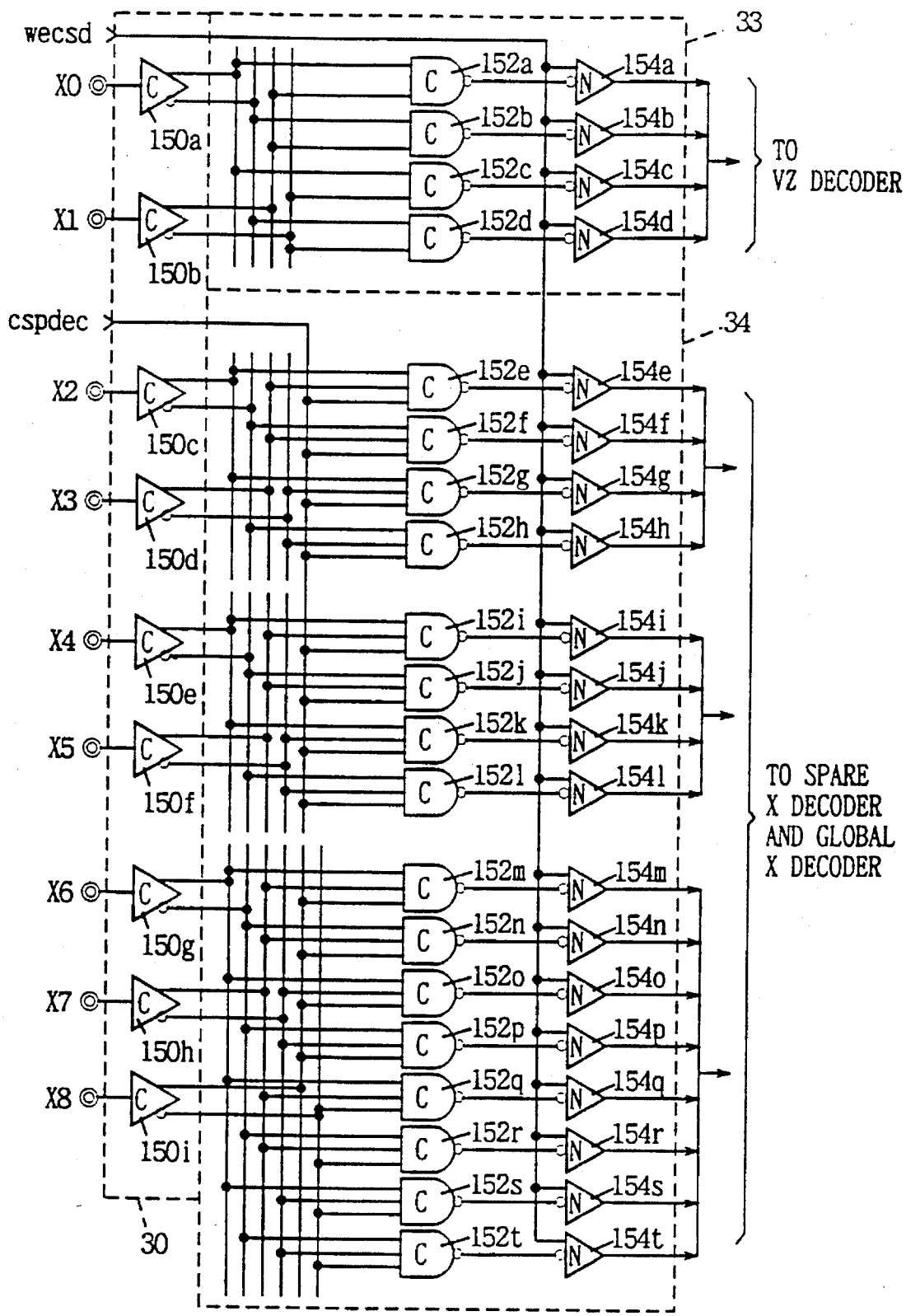
FIG. 14 illustrates structures of an X predecoder and a V predecoder provided in the SRAM according to the present invention.

FIG. 14 shows structures of the address input buffer and the X predecoder. Referring to FIG. 14, the address buffer 30 includes buffer circuits 150a to 150i of CMOS structures which are provided in correspondence to the X address bits X0 to X8. Each of the buffer circuits 150a to 150i receives a supplied X address bit Xi, to generate complementary internal X address bits Xi and /Xi.

The V predecoder 33 includes 2-input NAND circuits 152a to 152d receiving prescribed output signals of the buffer circuits 150a and 150b respectively and buffer circuits 154a to 154d, provided in correspondence to the NAND circuits 152 to 152d respectively, whose output drivability levels are varied in response to the internal control signal wecsd (see FIG. 10). The output of the V predecoder 33 is supplied to the VZ decoder.

The X predecoder 34 includes three-input NAND circuits 152e to 152h which are provided for the internal buffer circuits 150c and 150d, NAND circuits 152i to 152l which are provided in correspondence to the address input buffer circuits 150c to 150f, buffer circuits 154i to 154l which are provided in correspondence to the NAND circuits 152i to 152l, NAND circuits 152m to 152t which are provided in correspondence to the address input buffers 150g to 150i, and buffer circuits 154m to 154t which are provided in correspondence to the NAND circuits 152m to 152t respectively.

The output of the X predecoder 34 is supplied to the global X decoder and the spare X decoder. The NAND circuits 152e to 152t provided in this X predecoder 34 are brought into enabled states in response to the internal control signal cspdec, to incorporate prescribed internal address bits and output signals corresponding to the supplied address signal bits. Further, drivability levels of the buffer circuits 154e to 154t are made variable with the internal control signal wecsd. Structures and operations of the buffer circuits 154a to 154t are described later in detail. It is simply stated here that the buffer circuits 154a to 154t operate in response to a signal obtained by delaying the internal write command signal by a prescribed time for delaying rise of word lines only upon change from a write cycle (data write cycle) to a read cycle (data read cycle). Thus, the margin for write recovery is enlarged.

Figure 15:
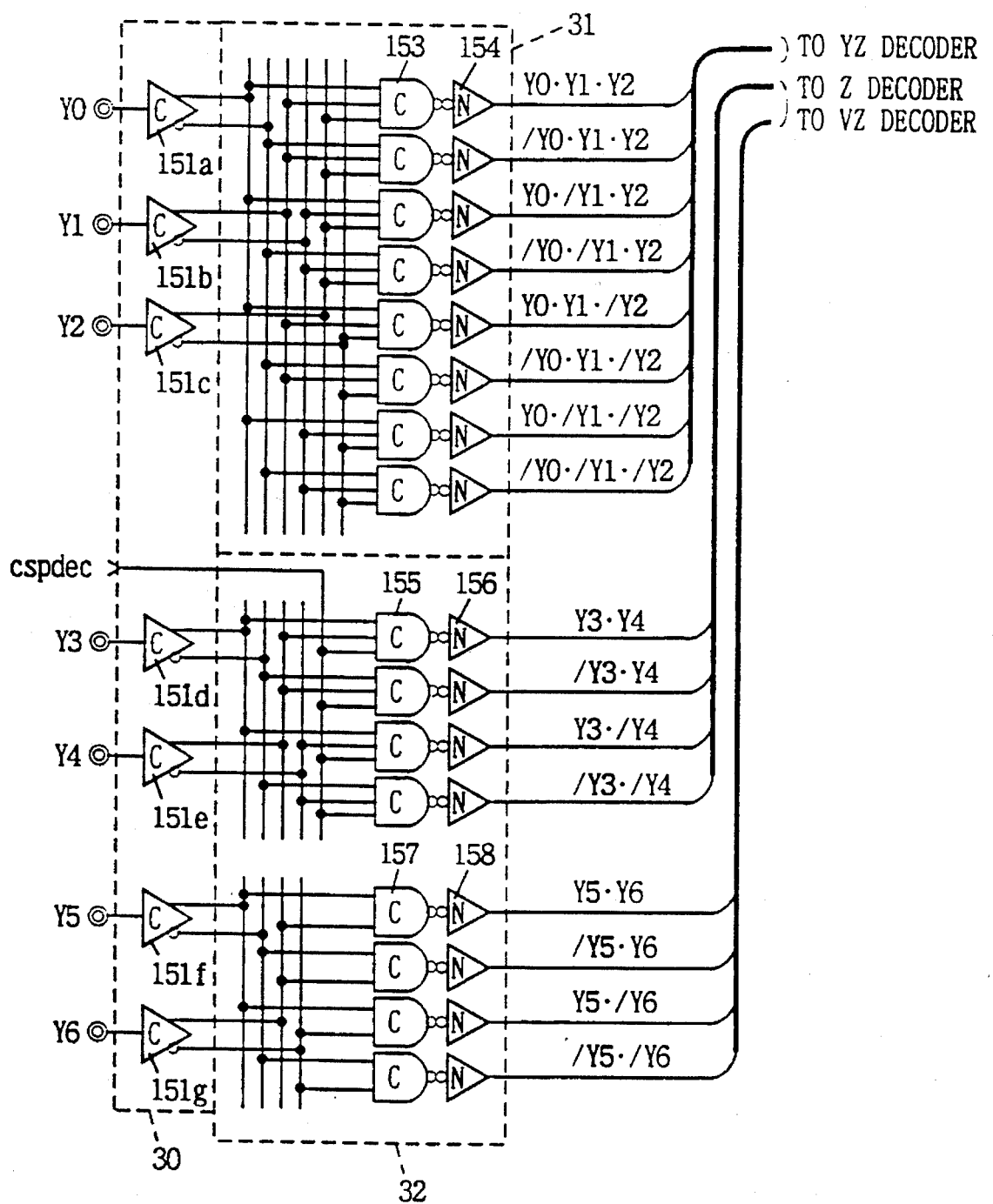
FIG. 15 illustrates structures of a Y predecoder and a Z predecoder provided in the SRAM according to the present invention.

FIG. 15 illustrates a structure of a circuit part related to Y address predecoding. Referring to FIG. 15, the address input buffer 30 includes buffer circuits 151a to 151g of CMOS structures which are provided in correspondence to Y address signal bits Y0 to Y6. The buffer circuits 151a to 151g buffer the supplied Y address signal bits, to generate complementary Y address bits Yi and /Yi.

The Y predecoder 31 includes NAND circuits 153 of CMOS structures which are provided in correspondence to the buffer circuits 151a to 151c, and buffer circuits 154 of BiMOS structures which are provided in correspondence to the NAND circuits 153. In the Y predecoder 31, one of eight output signal lines enters an activated state.

The Z predecoder 32 includes four three-input NAND circuits 155 of CMOS structures which are provided in correspondence to the buffer circuits 151d and 151e, inverter buffer circuits 156 of BiMOS structures which are provided in correspondence to the NAND circuits 155, four two-input NAND circuits 157 of CMOS structures which are provided in correspondence to address input buffer circuits 151f and 151g, and four inverter buffer circuits 158 of BiMOS structures which are provided in correspondence to the NAND circuits 157.

One of outputs of the four inverter buffer circuits 156 enters an active state, while one of outputs of the inverter buffer circuits 158 also enters an active state. The NAND circuits 155 are enabled in accordance with the internal control signal cspdec, to incorporate supplied address signals. The NAND circuits 155 are supplied with the control signal cspedec, to entirely form the predecode circuit for the Y address signal bits by three-input NAND circuits. Referring to FIG. 15, NAND circuits for the address bits Y5 and Y6 are shown as two-input gates. In a case of a ×8/×9 structure, the address bit Y7 is employed and supplied to the NAND circuits 157. Change of this word structure is a mask option, and the NAND circuits 157 are formed as three-input gates (not clearly shown in the figure).

Figure 16:
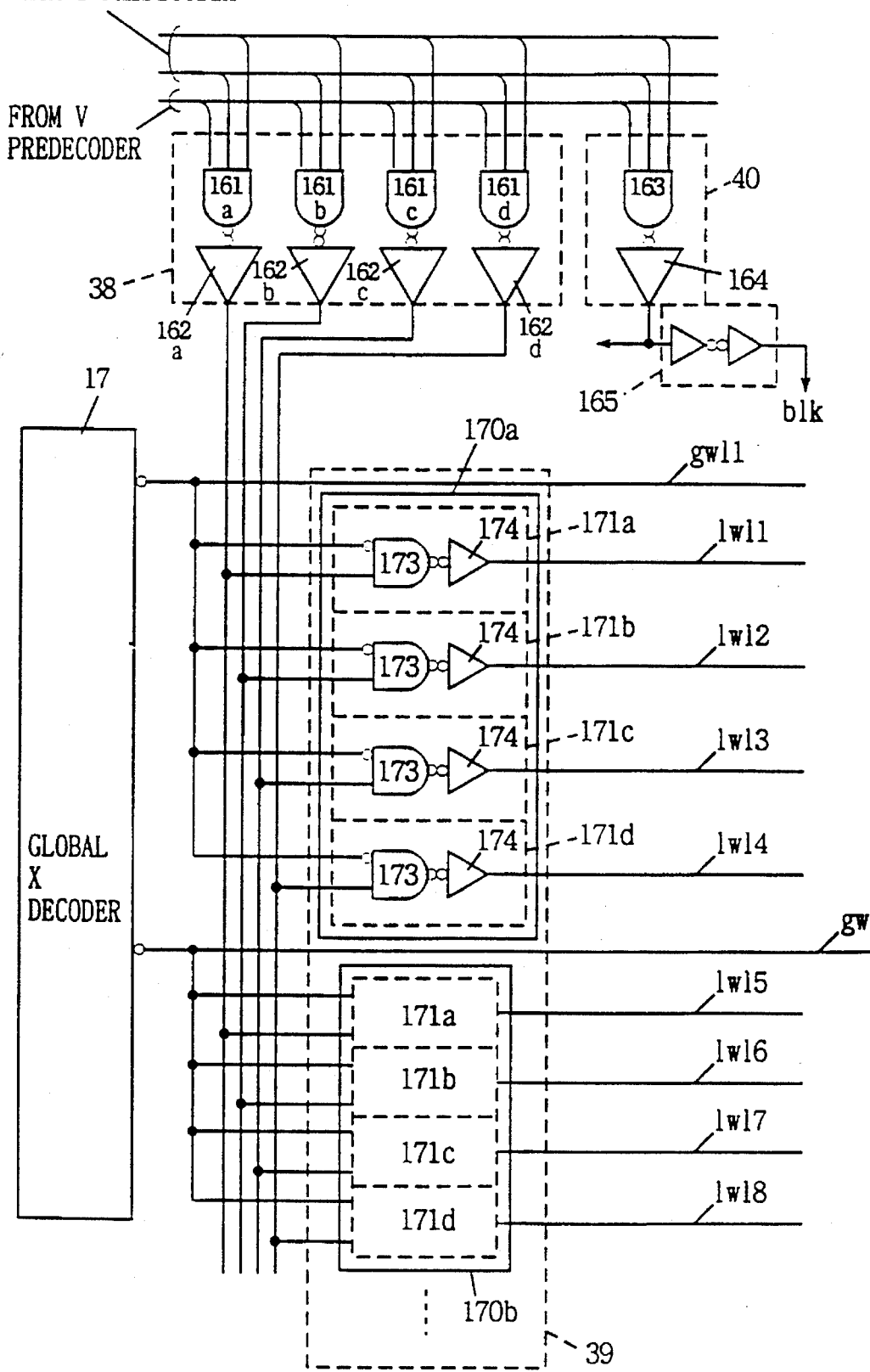
FIG. 16 illustrates structures of a local X decoder and a VZ decoder according to the present invention.

FIG. 16 shows exemplary structures of the VZ decoder and the local X decoder. FIG. 16 shows only a structure related to a single memory block. Referring to FIG. 16, the VZ decoder 38 includes four three-input NAND circuits 161a to 161d receiving the predecode signals from the Z predecoder 32 and the V predecoder 33 (see FIG. 14), and inverter circuits 162a to 162d which are provided in correspondence to the NAND circuits 161a to 161d respectively. The VZ predecoder 38 decodes the predecoders from the Z predecoder and the V predecoder. Therefore, a decoding operation is executed only in a block specified by the predecode signal outputted from the Z predecoder, in accordance with the predecode signal from the V predecoder. One of four output signal lines from the VZ decoder 38 enters an active state. The NAND circuits 161a to 161d have CMOS structures, while the inverter circuits 162a to 162d have BiNMOS structures.

The Z decoder 40 includes a two-input NAND circuit 163 for receiving the predecode signal outputted from the Z predecoder, and an inverter circuit 164 for receiving an output of the NAND circuit 163. Both of the NAND circuit 163 and the inverter circuit 164 are in CMOS structures. An output signal of the Z decoder 40 is outputted as a block selection signal blk through a delay circuit 165. This Z decoder 40 is shared by the upper and lower byte data storage regions, whereby its output is branched into two directions to be transmitted.

The local X decoder 39 includes local X decode circuits 170 which are provided for respective ones of global word lines gwl (output signal lines of the global X decoder 17). While 128 global word lines gwl are provided, FIG. 16 shows two global word lines gwl1 and gwl2 and local X decode circuits 170a and 170b related thereto.

Each local X decode circuit 170 includes four unit circuits 171a to 171d. Each of the unit decode circuits 171a to 171d includes a two-input gate circuit 173 which receives the decode signal from the VZ predecoder 38 at its one input while receiving a signal on a related global word line at its another input, and an inverter circuit 174 which receives an output signal of the gate circuit 173. An output signal of the inverter circuit 174 is transmitted onto a local word line lwl which is connected with a row of memory cells in the memory block. The gate circuit 173 outputs a low-level signal when a signal potential of the related global word line gw1 goes low and that on the output signal line from the VZ predecoder 38 goes high. The global word line may go high in selection, so that a selected output signal line of the VZ predecoder 38 goes low. The global X decoder 17 selects a single global word line, and the local X decoder brings one of the four local word lines corresponding to the selected global word line into a selected state.

Figure 17:
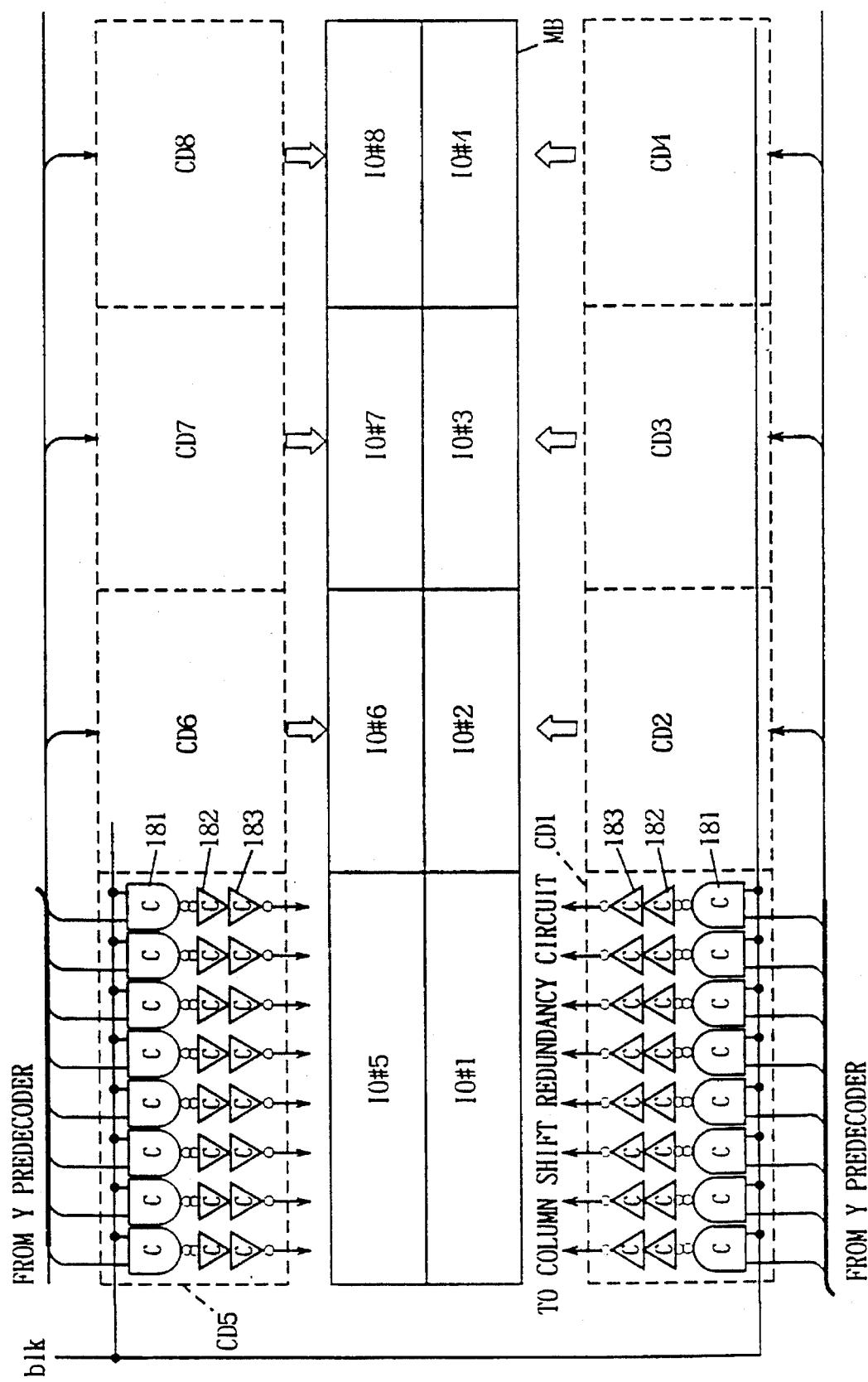
FIG. 17 illustrates a structure of a column decoder provided in the SRAM according to the present invention.

FIG. 17 illustrates a structure of a YZ decoder. This figure shows the structure of a YZ decoder related to a single memory block MB. Referring to FIG. 17, the memory block MB includes eight I/O blocks IO#1 to IO#8. The I/O blocks IO#1 to IO#4 form lower byte data storage regions, while the I/O blocks IO#5 to IO#8 form upper byte data storage regions. YZ decode circuits CD1 to CD8 are provided in correspondence to the I/O blocks IO#1 to IO#8 respectively. The YZ decode circuits CD1 to CD8 are activated in response to the block selection signal blk supplied from the Z decoder 40, to decode the predecode signal supplied from the Y predecoder 31.

Each of the YZ decode circuits CD1 to CD8, which are identical in structure to each other, includes eight two-input AND circuits 181, and two stages of inverter circuits 182 and 183 of CMOS structures which are provided in correspondence to the respective NAND circuits 181. In each YZ decode circuit, one of eight output signal lines is brought into a selected state. Namely, one column is selected from each I/O block in the selected memory block. An output of the YZ predecode circuit is transmitted to a column selection gate provided in each bit line pair through a column shift redundancy circuit described later.

[Detailed Structures of X and V Predecoders]

Figure 18:
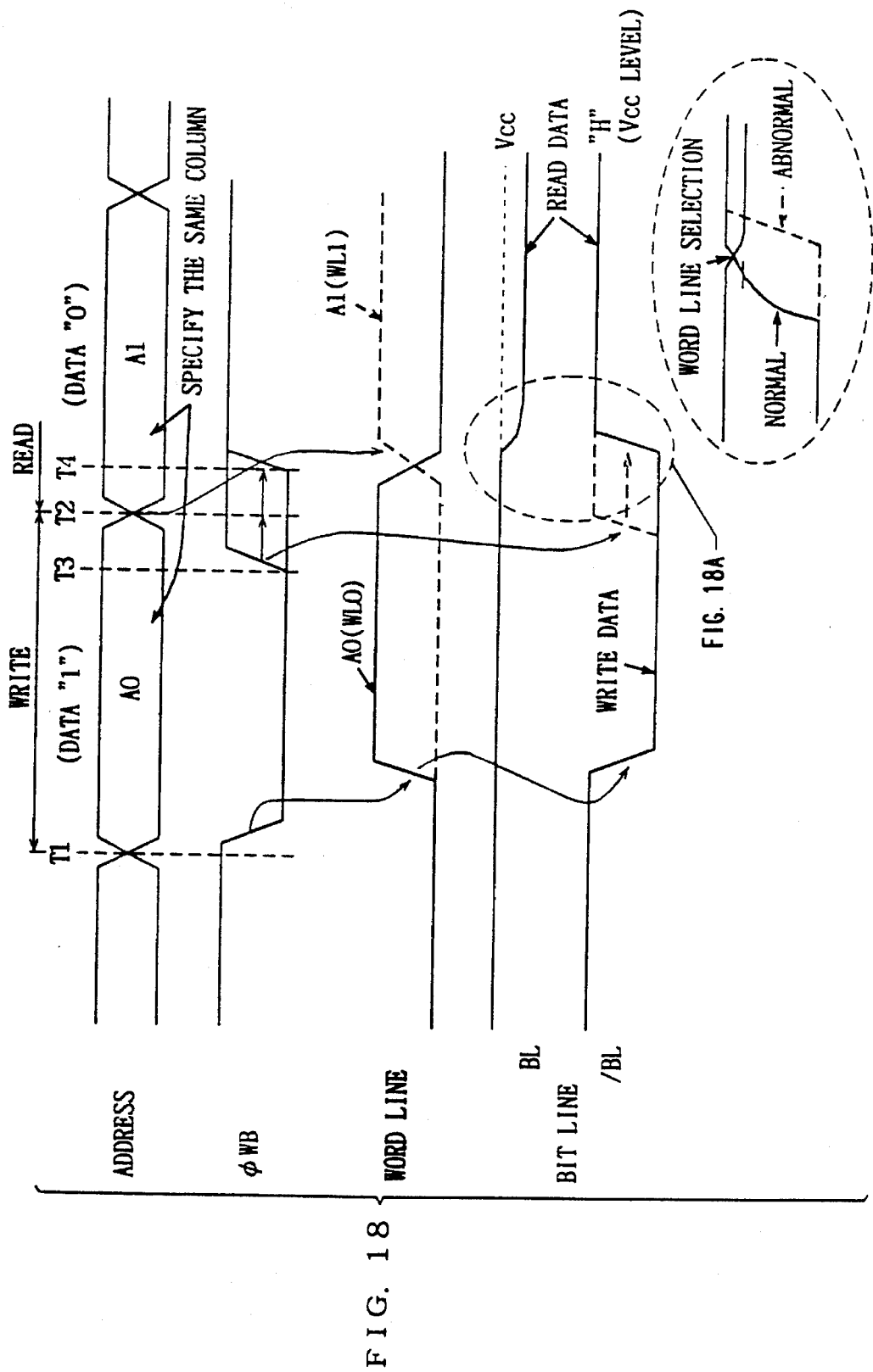
FIG. 18 is a diagram for illustrating problems of write recovery in the SRAM.

FIG. 18 illustrates operation waveforms in data write and read operations which are carried out in continuation in the SRAM. Referring to FIG. 18, data "1" is written in an address A0, and then "0" is read from an address A1. It is assumed that the addresses A0 and A1 specify the same column.

The address A0 is supplied at a time T1, and then an internal write control signal φWB (combination of the signals /CS, /WE, /UB and /LB) enters an active state of a low level. A pair of bit lines BL and /BL, corresponding to one column of the memory cell, are precharged at high levels of the supply voltage Vcc in a standby time by the bit line load circuit (this structure is described later in detail). A word line (local word line) WL0 corresponding to the address A0 is selected in accordance with the write control signal φWB and the address A0, and then a column is selected so that the data "1" is written in the selected memory cell. In this case, the bit line /BL is discharged to the ground potential Vss level.

The next address A1 is supplied at a time T2. These addresses A0 and A1 specify the same column. The bit line is charged to the supply potential Vcc level by the bit line load circuit when the internal write control signal φWB enters an inactive snare of a high level. After this charging, a word line WL1 according to the address A1 enters a selected state so that its potential is increased. In response to this, the potentials of the bit lines BL and /BL are again charged in response to data stored in the newly selected memory cell.

In data reading, potential difference across the bit lines BL and /BL is decided by the ratio of ON-resistance of the load circuit to that of the transistor of the memory cell. Therefore, extremely small potential difference is developed between the bit lines BL and /BL in data reading. As shown by solid arrow in FIG. 18, the potential of the bit line /BL is not sufficiently recovered when the internal write control signal φWB rises at a time T4. In this case, data are erroneously written in the newly selected memory cell. In order to avoid this, it is necessary to sufficiently increase the time between supply of the address and rise of the word line. However, this countermeasure is not preferable since the access time is increased.

The period between times T2 and T3, called a recovery time trec, is generally set at 0 ns in practice. In order to prevent erroneous writing without increasing the access time in the data write and read operations, the variable delay buffer circuits 154a to 154t are provided in the X and V predecoders shown in FIG. 14 for operating in response to the delay signal wecsd.

Figure 19:
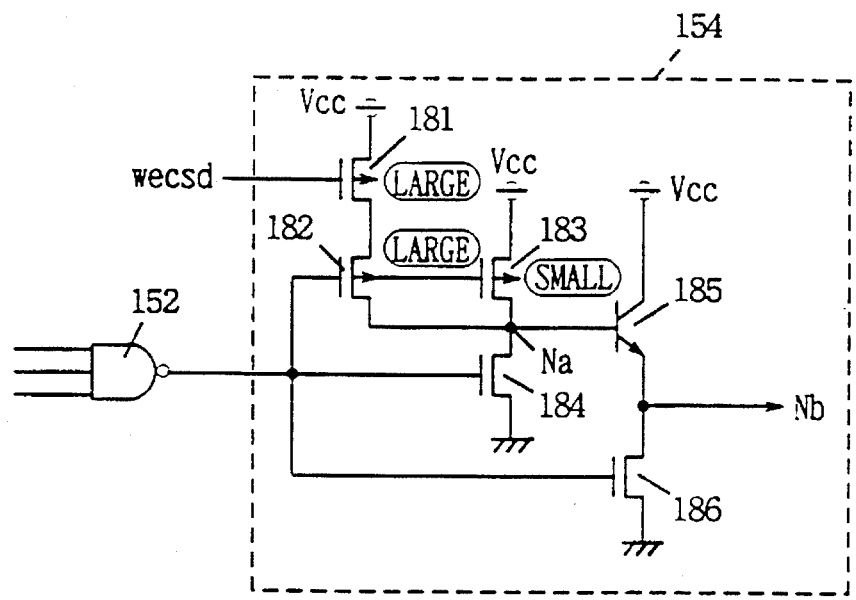
FIG. 19 illustrates a structure of a predecoder according to the present invention.

FIG. 19 illustrates an exemplary concrete structure of each variable buffer circuit shown in FIG. 14. Referring to FIG. 19, the variable buffer circuit 154 includes a p-channel MOS (insulated gate field effect) transistor 181 having one conduction terminal which is coupled to receive the supply potential Vcc and a gate receiving a delay signal wecsd (corresponding to the delay signal wecsdin from the control circuit 46b shown in FIG. 19), a p-channel MOS transistor 182 having one conduction terminal which is connected to another conduction terminal of the p-channel MOS transistor 181, a gate which is connected to receive an output of the NAND circuit 152 and another conduction terminal which is connected to a node Na, a p-channel MOS transistor 183 having one conduction terminal which is coupled to receive the supply potential Vcc, a gate which is connected to receive the output of the NAND circuit 152, and another conduction terminal which is connected to the node Na, and an n-channel MOS transistor 184 having one conduction terminal which is connected to the node Na, another conduction terminal which is connected to receive another supply potential Vss, and a gate which is connected to receive the output of the NAND circuit 152.

The transistors 181 and 182 are larger in size (gate width or gate width/gate length) than the transistor 183. Thus, the transistors 181 and 182 are set at sufficiently larger levels of current suppliability than the transistor 183.

The variable buffer circuit 154 further includes an npn bipolar transistor 185 having a collector connected to a node supplying the operating supply potential Vcc, a base connected to the node Na, and an emitter connected to an output node Nb, and an n-channel MOS transistor 186 having one conduction terminal which is connected to the output node Nb, a gate connected to receive the output of the NAND circuit 152, and another conduction terminal connected to a node supplying the other supply potential Vss. The operation is now described.

Figure 20:
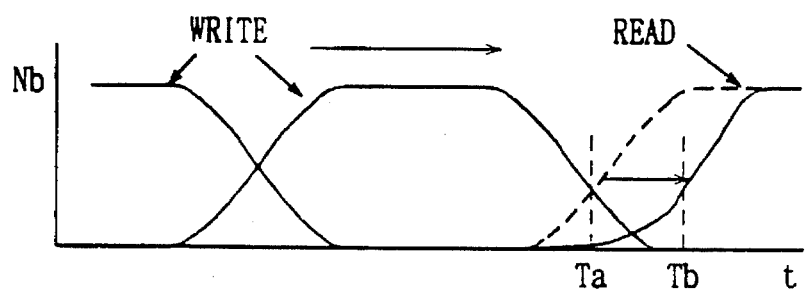
FIG. 20 is a waveform diagram showing an operation of the predecoder shown in FIG. 19.

Referring to FIG. 20, an operation sequence for carrying out a data write operation followed by a data read operation is now described.

In a write cycle for writing data, the write delay signal wecsd rises to a high level after a lapse of a prescribed period after both of the write enable signal /WE and the chip selection signal /CS go low. Thus, the p-channel MOS transistor 181 enters an OFF state. In a nonselected decoder, the output of the NAND circuit 152 goes high, and both of the transistors 182 and 183 are in OFF states. Further, the transistor 184 enters an ON state. Thus, the node Na is discharged to the ground potential (the other supply potential) Vss level, and the bipolar transistor 185 enters an OFF state at a high speed. At this time, further, the transistor 186 is in an ON state, and the output node Nb goes low to the ground potential Vss level.

In the selected decoder, on the other hand, the output of the NAND circuit 152 goes low and the transistors 184 and 186 enter OFF states, while the transistors 182 and 183 enter ON states. Since the transistor 181 is in an OFF state, the node Na is charged through the transistor 183. Thus, the node Na rises at a slow speed and the bipolar transistor 185 slowly enters an ON state, while the output node Nb slowly rises in the data write operation. Namely, rise timing of the word line is delayed in the data write operation.

In a subsequent read cycle for data reading, the delay signal wecsd maintains a high level for a constant period also after the read cycle is specified. In the selected decoder, therefore, the potential at the node Na so slowly rises that it is possible to take a sufficiently long time period between a time Ta when the write cycle is completed and the potential of the selected word line falls and a time Tb when the potential of the selected word line rises in the read cycle. Thus, the potentials of the bit lines BL and /BL receiving the data are sufficiently recovered to cause no erroneous writing.

At this timer the external control signals may have normal operation timing since such delay is implemented in the interior, and it is not necessary to increase the access time. Thus, it is possible to reliably delay the rise timing of the selected word line in transition from the write cycle to the read cycle. In the nonselected decoder, the transistors 184 and 186 enter ON states since the output of the NAND circuit 151 is at a high level, to discharge the output node Nb to the ground potential level of the nonselected state at a high speed. After a lapse of a prescribed period, the delay signal wecsd goes low and the transistor 181 having high current suppliability enters an ON state, while the internal node Na is charged at a high speed and the output node Nb rises to a high level at a high speed in the selected decoder.

As hereinabove described, only transition of the output node Nb to a high level is delayed in transition from the write cycle to the read cycle. Thus, it is possible to prevent erroneous writing and increase of the access time.

Figure 21:
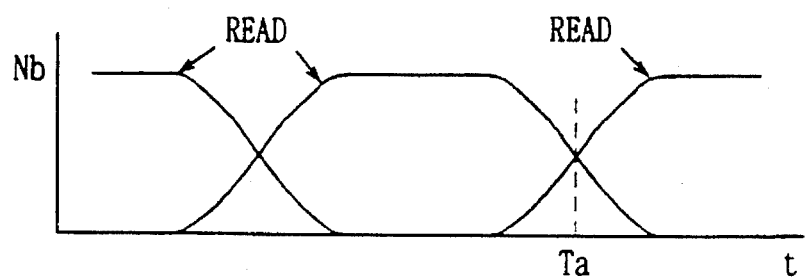
FIG. 21 is a waveform diagram showing another operation of the predecoder shown in FIG. 19.

FIG. 21 shows a waveform of the output node of the predecode circuit shown in FIG. 19 in repetition of the read cycle. In transition from a read cycle to another read cycle, the delay signal wecsd is at a low level. Therefore, the transistor 181 is in an ON state. In the selected decoder, the output of the NAND circuit 152 goes low, the transistors 182 and 183 enter ON states, and the transistors 184 and 186 enter OFF states. Therefore, the node Na is charged through the transistors 181 and 182 having high current suppliability, whereby its potential rises at a high speed and the bipolar transistor 185 enters an ON state at a high speed. Therefore, the potential of the output node Nb rises to a high level at a high speed.

In the nonselected decoder, on the other hand, the transistors 181 to 183 are in OFF states and the transistors 184 and 186 are in ON states, whereby the node Na is discharged to the ground potential level at a high speed and the bipolar transistor 185 enters an OFF state at a high speed, while the output node Nb is discharged at a high speed through the transistor 186. As shown in FIGS. 20 and 21, therefore, timing for a selected word line potential of a next cycle at the time Ta is delayed to the time Tb only in transition from the write cycle to the read cycle. Thus, the word line is selected after the selected bit line potentials are recovered to slight amplitudes, whereby it is possible to prevent erroneous writing and increase of the access time.

When write cycles are executed in continuation, the node Na is charged by the transistor 183 since the transistor 181 is in an OFF state. In this case, therefore, the rise timing of the selected word line is delayed as compared with the read cycle. Thus, it is possible to reliably prevent erroneous writing.

In the structure shown in FIG. 19, the transistors 181 and 182 are increased in size. Alternatively, the transistors 182 and 183 may be identical in size to each other, since the node Na is charged by the transistors 182 and 183 in selection.

Figure 22:
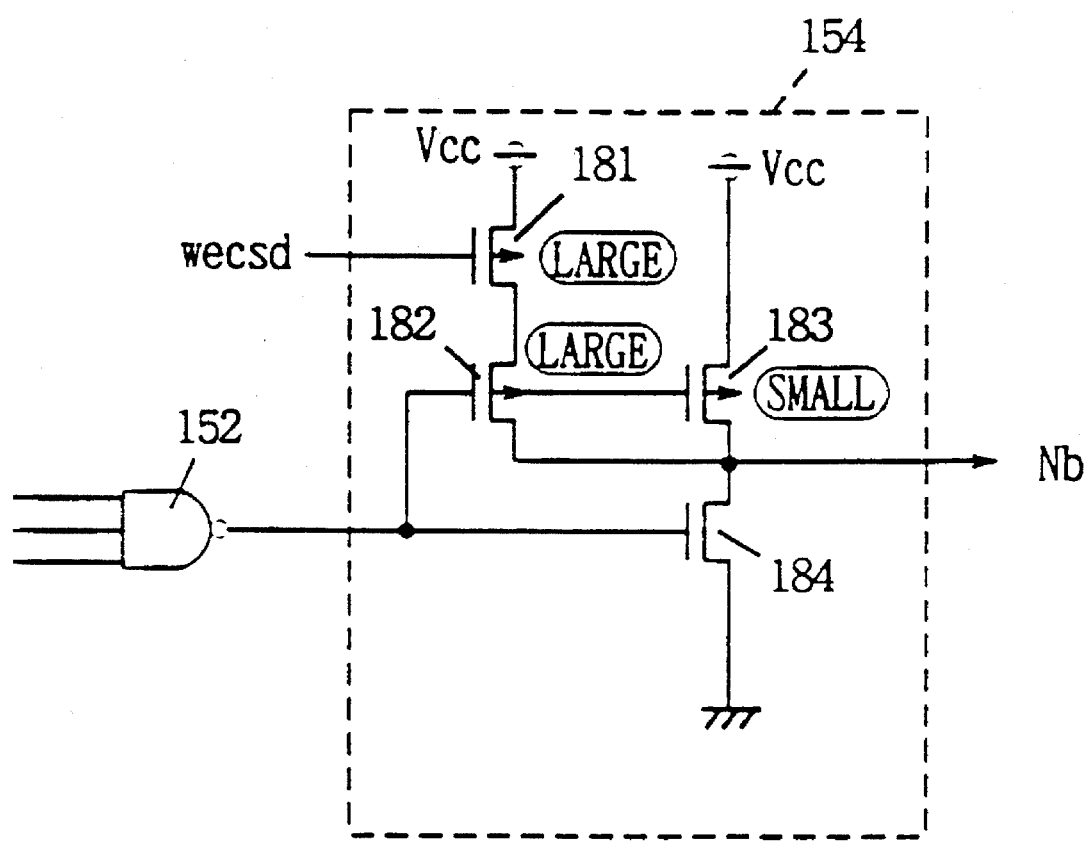
FIG. 22 illustrates another structure of a predecoder according to the present invention.

FIG. 22 shows another structure of each variable buffer circuit. Referring to FIG. 22, the bipolar transistor 185 and the MOS transistor 186 of the output stage shown in FIG. 19 are omitted, while a node Na is connected to an output node Nb. The variable buffer circuit having such a CMOS structure can also attain an effect which is similar to that of the structure shown in FIG. 19. While the variable buffer circuit shown in FIG. 19 has a BiNMOS structure, an effect which is similar to that of this structure can also be attained by a BiCMOS structure in which p-channel MOS transistors are provided in parallel with a bipolar transistor.

Further, the delay signal wecsdin shown in FIG. 10 is employed. This signal may be replaced by the delay signal wepdec, to attain an effect which is similar to that of the aforementioned embodiment.

As hereinabove described, it is possible to delay rise of the predecoder output only in change from the write cycle to the read cycle to sufficiently reduce the potential difference across the bit lines when the potential of the selected word line rises in the read cycle time, thereby reliably preventing erroneous writing and delay of data reading. When the potential difference across the bit lines is sufficiently reduced, this is changed to a signal potential corresponding to read data at a high speed in response to data of the selected memory cell in selection of the word line, whereby no long time is required for data reading.

[Memory Array Structure]

Figure 23:
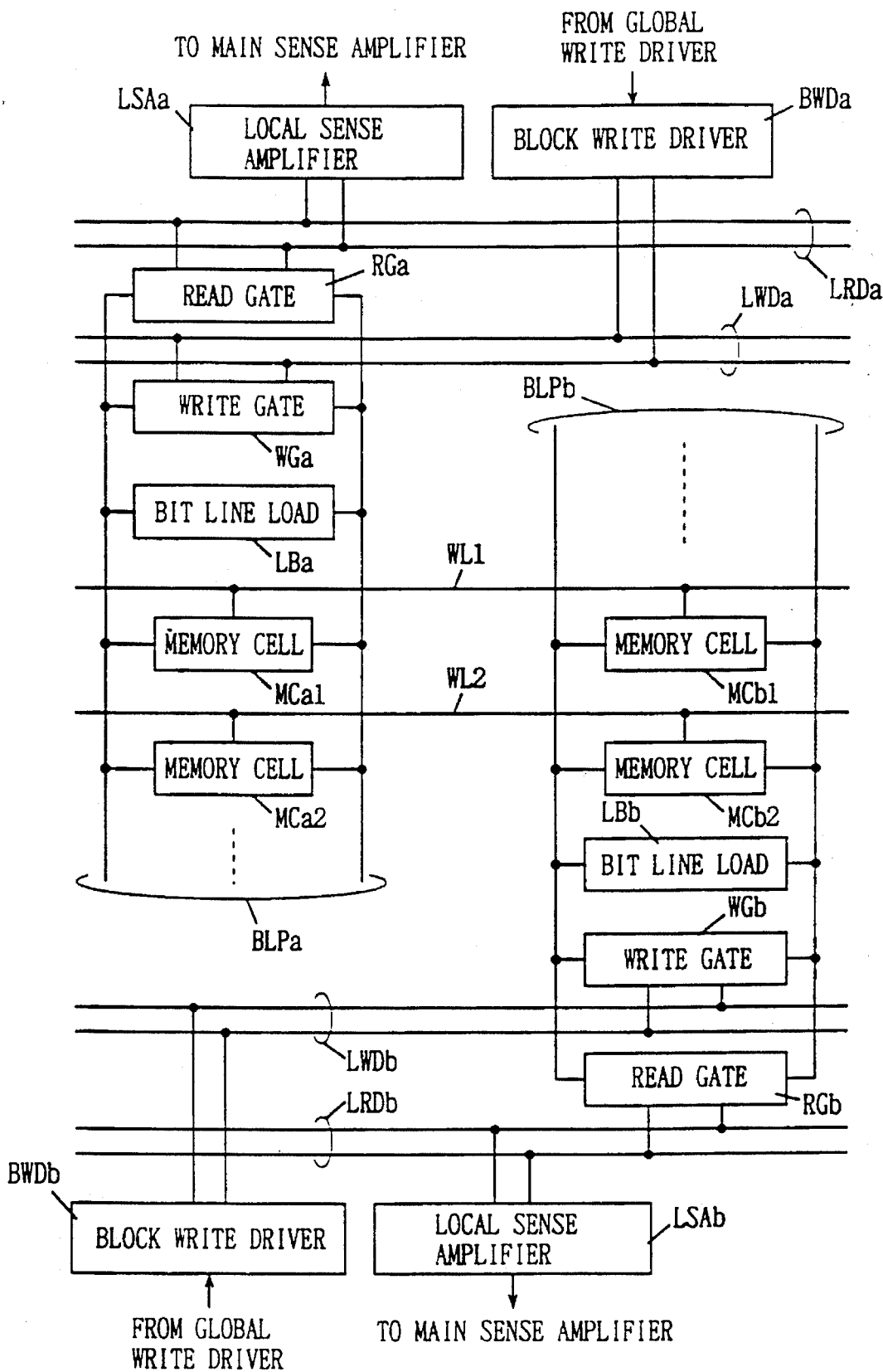
FIG. 23 is a block diagram showing a specific structure in a memory array provided in the SRAM according to the present invention.

FIG. 23 schematically shows a structure of each memory block. FIG. 23 typically shows a bit line pair BLPa for storing upper byte data bits, and another bit line pair BLPb for storing lower byte data bits.

Referring to FIG. 23, the bit line pair BLPa is connected with a column of memory cells (FIG. 23 typically shows two memory cells MCa1 and MCa2), a bit line load circuit LBa for precharging the bit line pair BLPa at a prescribed potential, a write gate WGa for connecting the bit line pair BLPa to a local write data bus LWDa in response to the column selection signal (not shown), and a read gate RGa for connecting the bit line pair BLPa to a local read data bus LRDa in response to the column selection signal.

The bit line pair BLPb is also connected with a column of memory cells (MCb1 and MCb2), a bit line load circuit LBb, a write gate WGb and a read gate RGb.

A local sense amplifier LSAa is provided for detecting/ amplifying read data on the local read data bus LRDa, and a block write driver BWDa is provided for transmitting internal write data onto the local write data bus LWDa and driving the potential of the selected bit line pair to a potential corresponding to the internal write data through the write gate which is related to the selected bit line pair. The local sense amplifier LSAa transmits the detected/amplified data to the main sense amplifier. The block write driver BWDa receives the internal write data from the global write driver.

The local read data bus LRDb and the local write data bus LWDb are also provided with a local sense amplifier LSAb and a block write driver BWDb.

The local sense amplifier and the block write driver are provided every I/O block. The main sense amplifier and the global write driver are provided every data input/output terminal. Since one memory block includes eight I/O blocks, eight local sense amplifiers and eight block write drivers are provided in relation to each memory block.

Both of the word lines WL1 and WL2 are arranged in common for the upper byte data storage memory cells and the lower byte data storage memory cells.

Figure 24:
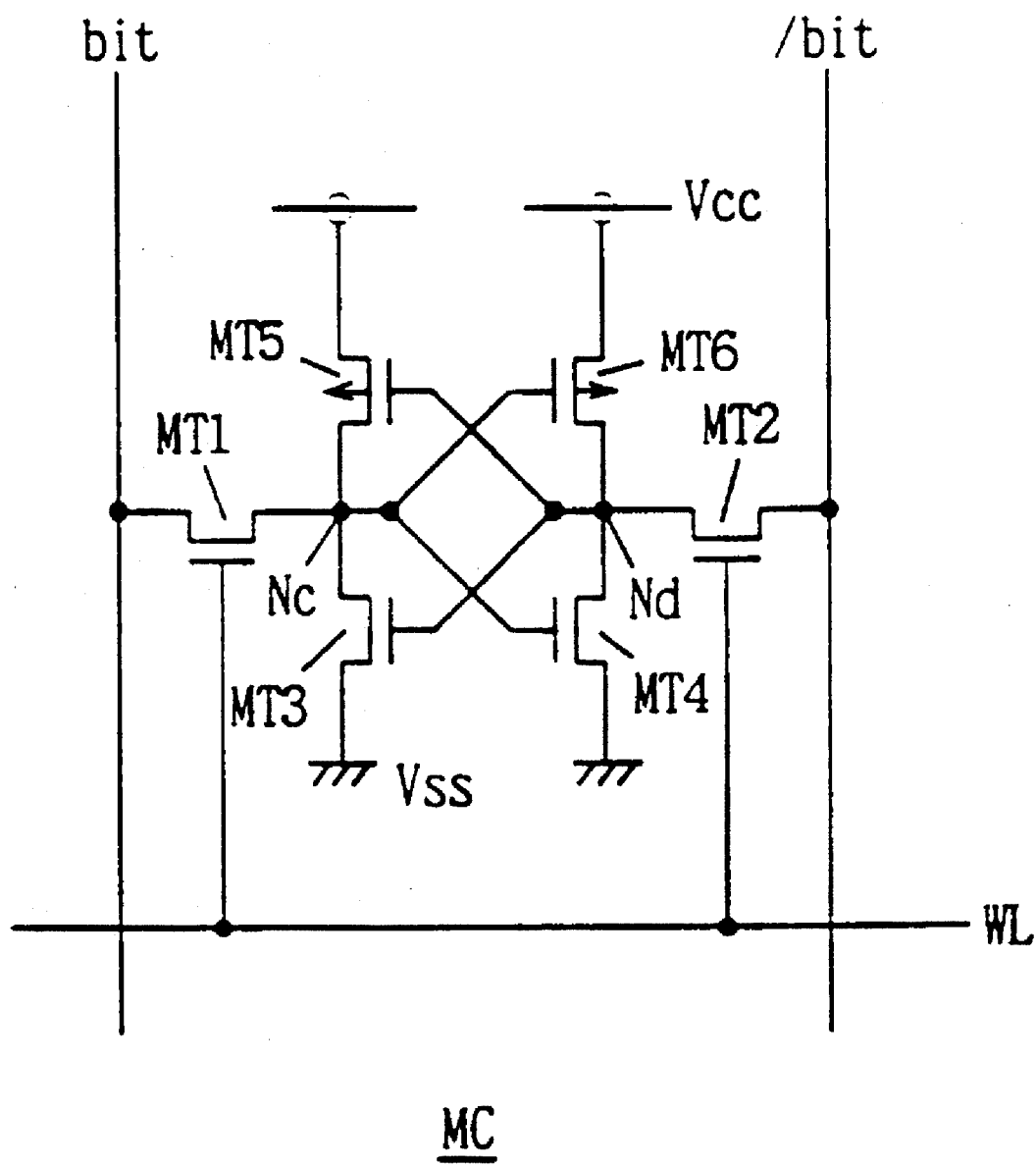
FIG. 24 illustrates an exemplary structure of a memory cell provided in the SRAM according to the present invention.

FIG. 24 shows a specific structure of each memory cell MC. Referring to FIG. 24, the memory cell MC includes transfer gates MT1 and MT2 which conduct in response to the signal potential on a word line to connect storage nodes Nc and Nd to bit lines bit and /bit respectively, memory transistors MT3 and MT4 whose gates and drains are cross-connected with each other, and load transistors MT5 and MT6 whose gates and drains are cross-connected with each other. The load transistors MT5 and MT6 are formed by p-channel thin-film transistors, for example. The drains of the transistors MT3 and MT4 are connected to the nodes Nc and Nd respectively. The transistors MT5 and MT6 have pullup functions of charging the nodes Nc and Nd to the supply potential Vcc level respectively. The operation of the SRAM memory cell MC shown in FIG. 24 is identical to that of an ordinary memory cell.

[Data Write System]

Figure 25:
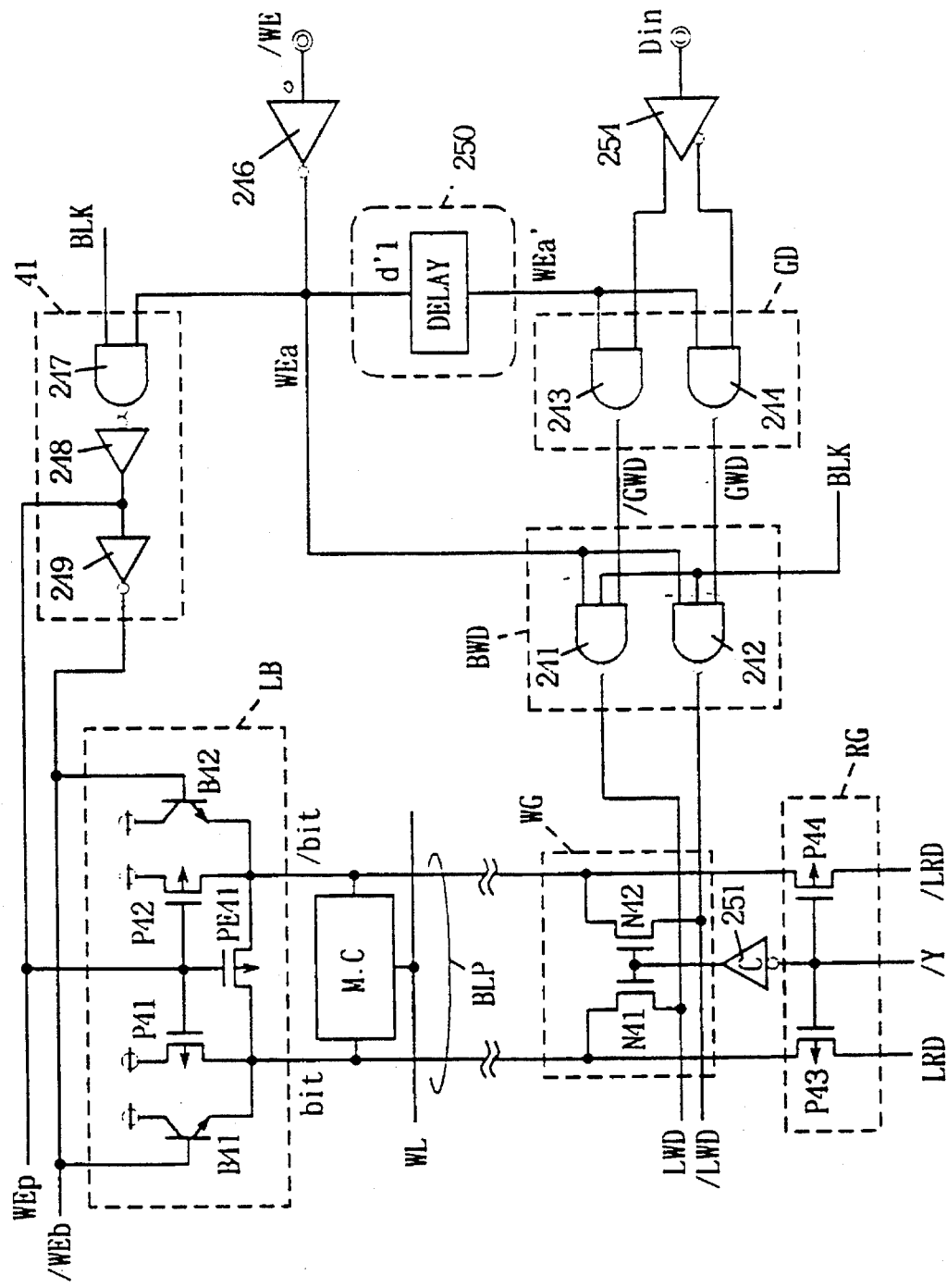
FIG. 25 illustrates a structure of data write related circuitry according to the present invention.

FIG. 25 schematically shows a structure of a part which is related to data writing. A single bit line pair BLP is typically shown in FIG. 25. A bit line load circuit LB includes p-channel MOS transistors P41 and P42 which conduct in response to a first equalize/precharge signal WEp for precharging the bit lines bit and /bit to the supply potential Vcc level respectively, a p-channel MOS transistor PE41 which equalizes the bit lines bit and /bit in response to the first precharge/equalize signal WEp, and npn bipolar transistors B41 and B42 for precharging the bit lines bit and /bit at a prescribed potential (Vcc–Vbe) in response to a second precharge/equalize signal /WEb.

A write gate WG includes n-channel MOS transistors N41 and N42 which conduct in response to a column selection signal Y from an inverter circuit 251 to connect the bit lines bit and /bit to local write data lines LWD and /LWD. A read gate RG includes p-channel MOS transistors P43 and P44 which conduct in response to a column selection signal /Y for connecting the bit lines bit and /bit to local read data lines LRD and /LRD respectively.

A block write driver BWD includes three-input NAND circuits 241 and 242 which are enabled in response to the block selection signal BLK and an internal write enable signal WEa received from a buffer circuit 246 to drive the local write data lines LWD and /LWD in response to signal potentials on global write data lines /GWD and GWD. A global write driver GD for driving the global write data lines /GWD and GWD includes two-input NAND circuits 243 and 244 which are enabled in response to a delayed internal write enable signal WEa'. The NAND circuit 243 drives the global write data line /GWD in response to internal write data received from a data input buffer 245. The NAND circuit 244 drives the global write data line GWD in accordance with the internal write data received from the data input buffer 245.

The delayed internal write enable signal WEa' is supplied from a delay circuit 250, which delays the internal write enable signal WEa from the buffer circuit 246 by a prescribed time d'1 to generate the delayed internal write enable signal WEa'.

The block driving circuit 41 (see FIG. 9) generating the precharge/equalize signals WEp and /WEb includes a two-input NAND circuit 247 which receives the block selection signal BLK and the internal write enable signal WEa, an inverter circuit 248 which inverts an output of the NAND circuit 247, and an inverter circuit 249 which inverts an output of the inverter circuit 248. The inverter circuit 238 outputs the first precharge/equalize signal WEp, while the inverter 249 outputs the second precharge/equalize signal /WEb. The operation of the circuit shown in FIG. 25 is now described with reference to an operation waveform diagram show in FIG. 26.

In advance of a Lime t0, the external write enable signal /WE is at a high level of an inactive state, while the internal write enable signal WEa is at a low level. The NAND circuits 241 and 242 provided in the block write driver BWD drive both of the local write data lines LWD and /LWD to high levels in accordance with the low-level internal write enable signal WEa. In the block driving circuit 41, on the other hand, the output of the inverter circuit 248 goes low, the output of the inverter circuit 249 goes high, all transistors P41, P42, PE41, B41 and B42 enter ON states, and the bit lines bit and /bit are precharged at high levels.

The external write enable signal /WE falls to a low level at the time t0, whereby the internal write enable signal WEa rises to a high level in response. If the block selection signal BLK is at a high level showing a selection state at this time, the output of the NAND circuit 247 goes low, the output of the inverter circuit 248 goes high, the output of the inverter circuit 249 goes low and all transistors P41, P42, PE41, B41 and B42 included in the bit line load circuit LB enter OFF states in the block driving circuit 41. At this time, the column selection signal /Y is also at a low level of the selection state.

On the other hand, the delayed internal write enable signal WEa' outputted from the delay circuit 250 is still at a low level. Therefore, the outputs of the NAND circuits 243 and 244 included in the global write driver GD are at high levels. Thus, the outputs of the NAND circuits 241 and 242 included in the block write driver BWD go low (the block selection signal BLK is at a high level to indicate a selected state), while the potentials of the local write data lines LWD and /LWD go low. Both of the transistors N41 and N42 included in the write gate WG are selected and in ON states, whereby the potentials of the bit lines bit and /bit are discharged toward the local data lines LWD and /LWD through the write gate WG, to be reduced.

At a time t1, the delayed internal write enable signal WEa' outputted from the delay circuit 250 rises to a high level, and the outputs of the NAND circuits 243 and 244 included in the global write driver GD reach potentials corresponding to the internal write data supplied from the data input buffer 245. In response, the output potentials of the NAND circuits 241 and 242 included in the block write driver BWD also reach potentials corresponding to the signal potentials on the global write data lines /GWD and GWD. When high-level data is written in the bit line "bit", the potential of the bit line "bit" reaches a voltage level obtained by subtracting a threshold voltage Vth of the transistor N41 from the signal potential (Vcc level) on the local write data line LWD since both of the transistors P41 and B41 for precharging the bit line bit are in OFF states. On the other hand, the complementary bit line /bit is discharged to the ground potential Vss level through the transistor N42.

In the memory cell MC, the transistors MT1 and MT2 are in ON states as shown in FIG. 24, and the transistors MT3 and MT4 execute latch operations in accordance with the potential difference developed between the bit lines, bit and /bit, so that the nodes Nc and Nd are driven at the supply potential Vcc level and the ground potential Vss level respectively.

At a time t2, the data write cycle is completed and the write enable signal /WE rises to a high level while the internal write enable signal WEa falls to a low level in response. The NAND circuits 241 and 242 included in the block write driver BWD enter disabled state, and the potentials of the local write data lines LWD and /LWD go high. The write gate WG enters an OFF state.

Figure 26:
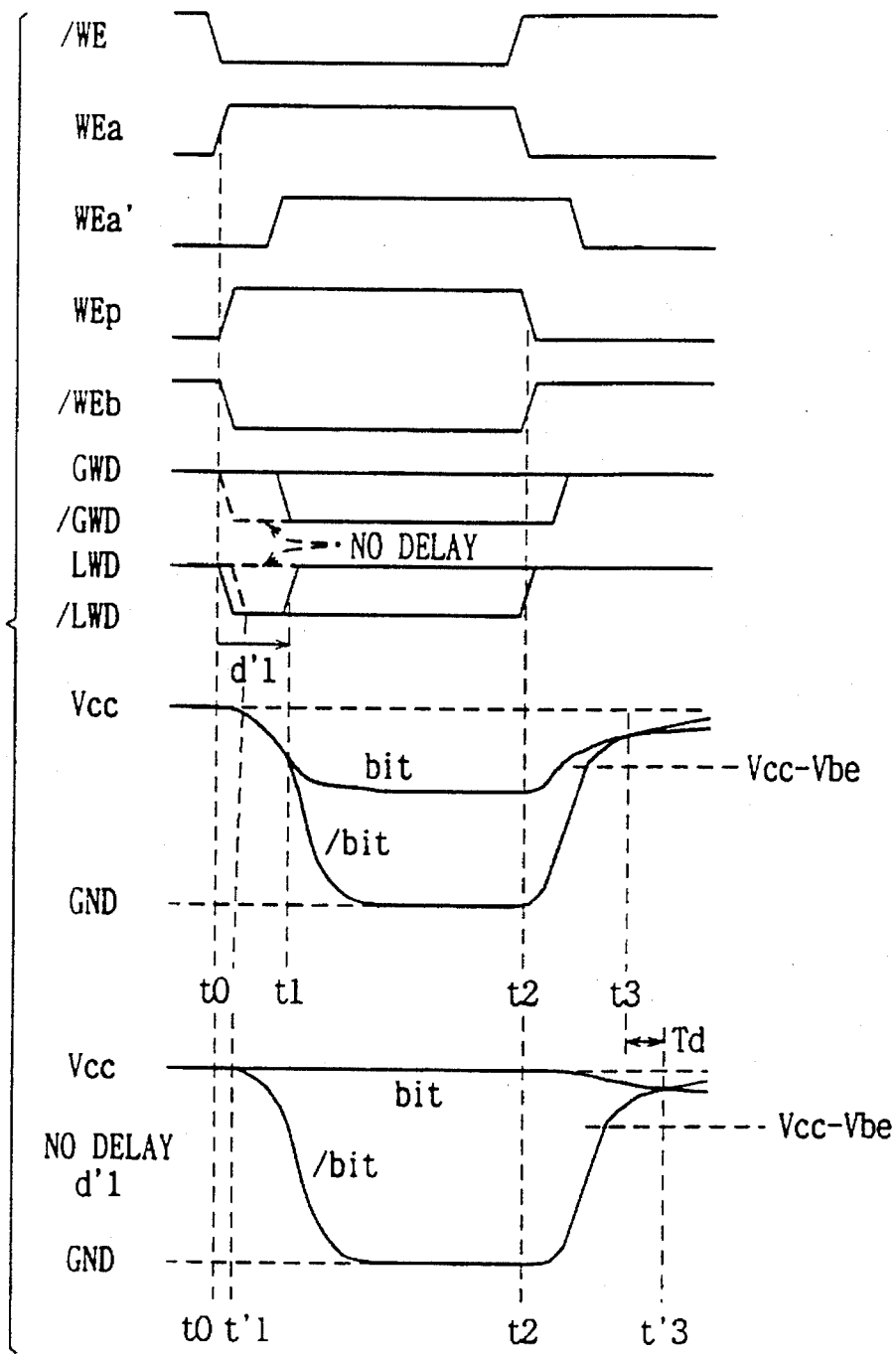
FIG. 26 is a signal waveform diagram showing an operation of the circuitry shown in FIG. 25.

In the block driving circuit 41, the output of the NAND circuit 247 goes high, whereby the first precharge/equalize signal WEp goes low and the second precharge/equalize signal /WEb goes high so that all transistors P41, P42, PE41, B41 and B42 included in the bit line load circuit LB enter ON states to start charging the bit lines bit and /bit. At this time, the potential difference between the complementary bit lines bit and /bit is so small that the bit lines bit and /bit reach the same potentials at a time t3. Referring to FIG. 26, a level shown by a broken line Vcc–Vbe indicates that charging is carried out by the bipolar transistors B41 and B42 at a high speed to this potential level, and thereafter loose charging is carried out by the MOS transistors P41 and P42.

FIG. 26 also shows potential change of the bit lines bit and /bit provided with no delay circuit 250. When no delay circuit 250 is provided, discharging of the complementary bit line /bit is carried out from a time t1' when the write gate WG enters an ON state after the write enable signal /WE falls to a low level of an active state as to the potentials of the local write data lines LWD and /LWD (when high level data is written in the bit line bit). When the write cycle is completed at a time t2 and precharging and equalization of the bit lines bit and /bit are executed, it is necessary to charge the complementary bit line /bit from the ground potential level. When a low level data is read on the bit line bit in a next cycle, therefore, no word line selection can be performed until a time t'3 when the bit line bit and the complementary bit line /bit reach the same potentials, in order to prevent erroneous writing. The potentials of the complementary bit line /bit and the bit line bit are set up at high and low levels respectively after this time t'3, so that the data can be read out. Thus, it is obviously possible to sufficiently advance the time t'3 when the bit lines bit and /bit reach the same potentials by providing the delay circuit 250 as in this embodiment, thereby executing switching of the potentials of the bit line pair in a read cycle following the write cycle at a high speed.

As hereinabove described, it is possible to reduce the potential of the high-level bit line during a data write period for executing equalization in bit line precharging at a high speed by providing the delay circuit 250 and delaying activation timing of the global write driver in data writing.

Figure 27:
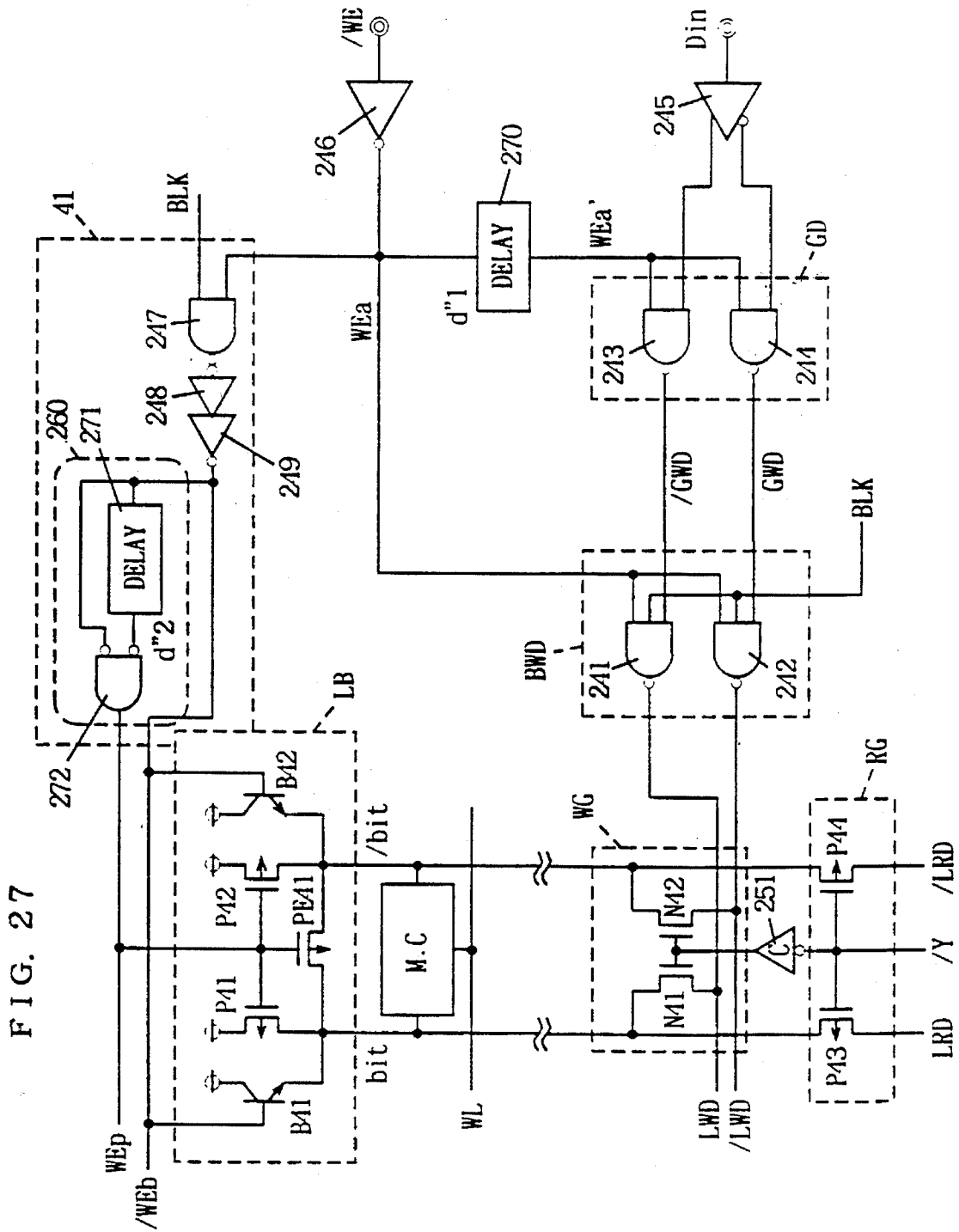
FIG. 27 illustrates another structure of data write related circuitry according to the present invention.

FIG. 27 illustrates another structure of the data write control system. The block driving circuit 41 shown in FIG. 27 further includes a rise delay circuit 260 for delaying rise of the first precharge/equalize signal WEp by a prescribed time d"2, in addition to the structure shown in FIG. 25. This rise delay circuit 260 includes a delay circuit 271 for delaying the output of the inverter circuit 249 by a prescribed time, and a two-input NOR circuit 272 which receives outputs from the inverter circuit 249 and the delay circuit 271. The NOR circuit 272 outputs the first precharge/equalize signal WEp.

Figure 28:
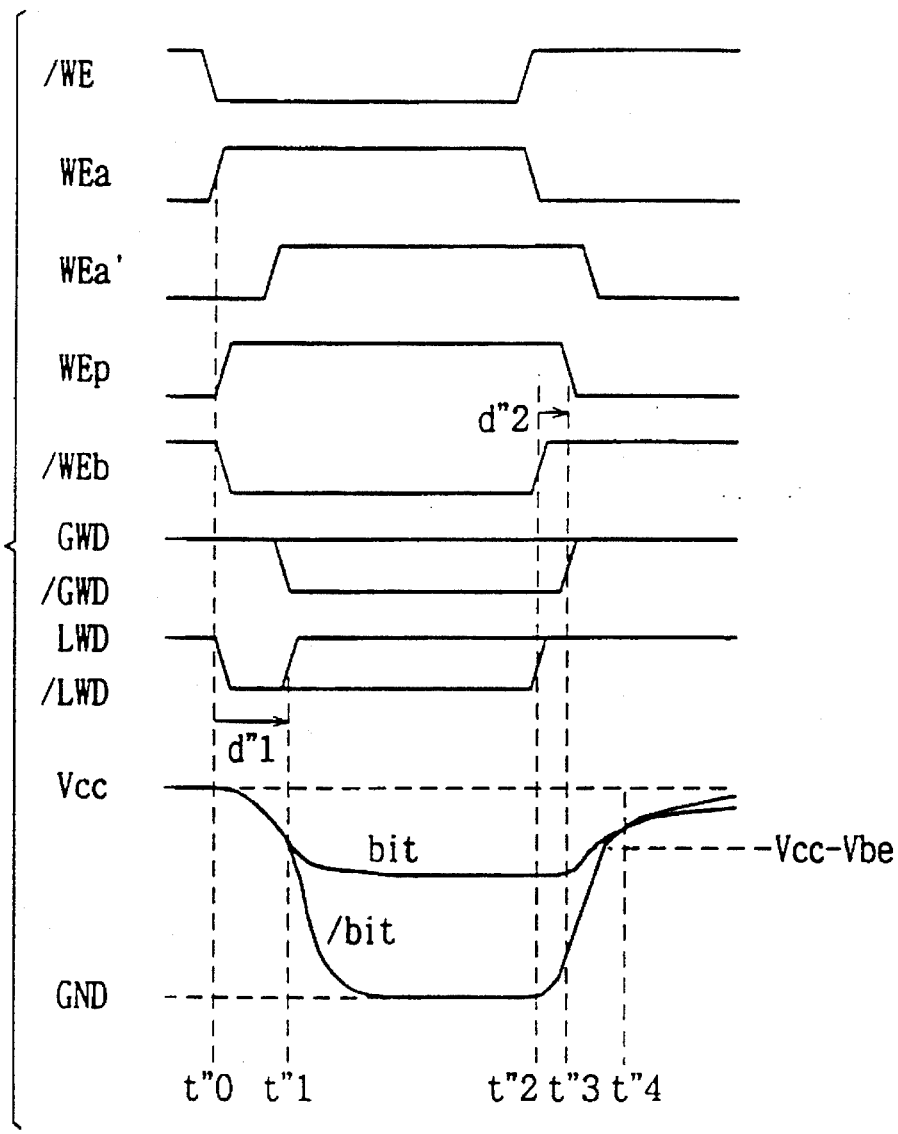
FIG. 28 is a signal waveform diagram showing an operation of the circuit shown in FIG. 27.

In the structure shown in FIG. 27, the first precharge/equalize signal WEp falls to a low level of an active state after a lapse of the prescribed time d"2 from rise of the second precharge/equalize signal /WEb to a high level upon completion of the write cycle. Other structure is similar to that shown in FIG. 25, and hence corresponding components are denoted by the same reference numerals. The operation of the circuit shown in FIG. 27 is now described with reference to an operation waveform diagram shown in FIG. 28.

In the write cycle, the write enable signal /WE falls to a low level of an active state at a time t"0, so that the local write data lines LWD and /LWD are maintained at low levels during a prescribed period d"1 (identical or substantially identical to a prescribed delay time d'1) and the potentials of the bit lines bit and /bit are reduced, similarly to the structure shown in FIG. 25.

The write cycle is completed at a time t"2, whereby the external write enable signal /WE goes high and the internal write enable signal WEa goes low. In response to the low level internal write enable signal WEa, the output of the inverter circuit 249 included in the block write circuit 41, i.e., the second precharge/equalize signal /WEb rises to a high level. At this time, the first precharge/equalize signal WEp outputted from the rise delay circuit 260 is still at a high level. Therefore, the bit lines bit and /bit are charged at a high speed through the bipolar transistors B41 and B42 which are included in the bit line load circuit LB. At this time, the potential level of the high-level bit line, bit, is approximate to a potential Vcc–Vbe ( Vcc–Vth, where Vth represents the threshold value of the transistor included in the write gate), and the bipolar transistor B41 provided for this bit line, bit, substantially maintains an OFF state due to small base-to-emitter potential difference. In this case, therefore, only the complementary bit line /bit which has been discharged to the ground potential level is charged by the bipolar transistor B42 at a high speed.

At a time t"3 after a lapse of the prescribed period d"2 from the time t"2, the output of the rise delay circuit 260, i.e., the first precharge/equalize signal WEp, falls to a low level, whereby the transistors P41, P42 and PE41 enter ON states. Thus, the bit line bit is charged by the MOS transistor P41, while the bit line bit and the complementary bit line /bit are equalized by the equalize transistor PE41. The potential of the complementary bit line /bit is still raised by the bipolar transistor B41 at a high speed.

At a time t"4, the bit lines bit and /bit reach the same potentials, so that it is possible to raise the word line and carry out data reading from this point of time.

As described above, only the charging operations by the bipolar transistors B41 and B42 are carried out between the times t"2 and t"3, whereby no potential increase is caused until the time t"3 if the high-level bit line, bit, reaches the potential Vcc–Vbe at an earlier time (or already exceeds the potential Vcc–Vbe). Thus, the quickly increased potential of the low-level bit line /bit approaches the potential level of the bit line bit. The MOS transistor enters an ON state at the time t"3, equalization of the bit line potentials can be completed before a time t"4 since the potential difference across the bit lines bit and /bit is relatively smaller than that shown in FIG. 26.

In the circuit structure shown in FIGS. 25 or 27, the high-level bit line bit may be at such a potential level that a high-level potential is written in the memory cell.

The delay circuit 270 for maintaining the local write data bus lines LWD and /LWD at low levels for a prescribed period controls the operation of the global write driver GD. In this case, only a single delay circuit 270 may be provided for a single data input/output terminal, whereby it is possible to efficiently control the bit line potentials without increasing the occupied area.

[Detail of Write Control Signal]

Referring to FIGS. 25 or 27, only the write enable signal /WE is employed. Relation between the control signals generated from the control circuit 46 shown in FIG. 10 and those shown in FIGS. 25 or 27 is now described more specifically.

Figure 29:
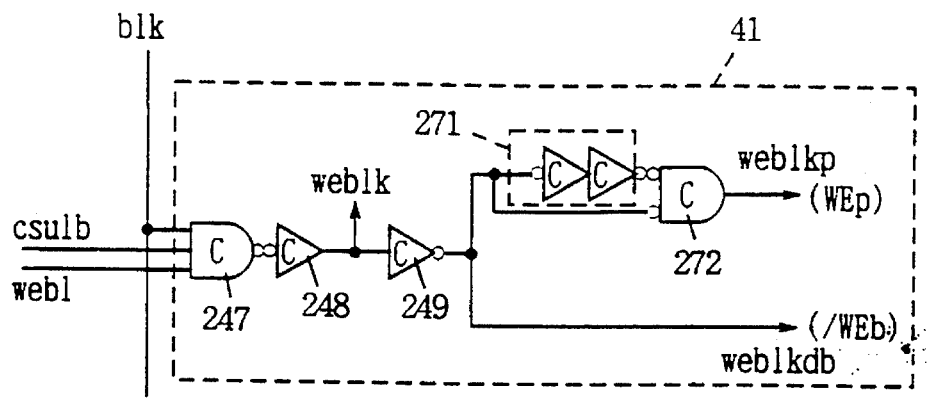
FIG. 29 illustrates a specific structure of a block driving circuit for driving a bit line load circuit according to the present invention.

FIG. 29 shows the control signals which are supplied to the block driving circuit in detail. Referring to FIG. 29, the NAND circuit 247 receives the block selection signal blk from the Z decoder, the internal enable signal csulb which is generated from the chip selection signal /CS, and the internal write enable signal webl which is generated from the write enable signal /WE. The logic of the chip selection signal /CS, the internal write control signal webl and the block selection signal blk is first taken in the NAND circuit 247. As hereinabove described, taking of logic of the write control signal is delayed until it is transmitted to each block, in order to minimize propagation delay in the write control signal.

A block write command signal weblk is generated from the inverter circuit 248. The delay circuit 271 is formed by two-stage CMOS inverter circuits. The NOR circuit 272 generates a precharge/equalize signal weblkp (WEp). The inverter circuit 249 generates a precharge/equalize signal weblkdb (/WEb).

Figure 30A:
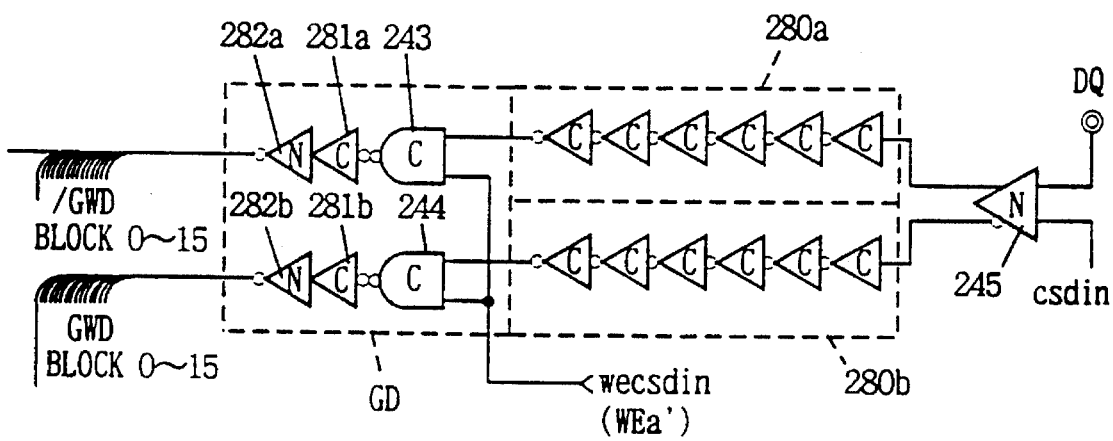
FIGS. 30A and 30B illustrate specific structures of a global write driver and a block write driver in a data write circuit according to the present invention respectively.

FIG. 30A shows the control signals which are supplied to the data input buffer and the global write driver in detail. Referring to FIG. 30A, the data input buffer 245 is brought into an active state in response to the internal chip selection signal csdin (symbols u and l for identifying upper and lower bytes are omitted) generated from the inverter circuit 59 shown in FIG. 10, to generate complementary internal write data from the external write data supplied to the data input/output terminal DQ. The complementary internal write data from the data input buffer 245 is transmitted to the global write driver GD through delay circuits 280a and 280b including inverters of CMOS structures. In the global write driver GD, the NAND circuit 243 is brought into an enabled state in response to the internal control signal wecsdin generated from the delay circuit 70 shown in FIG. 10, to generate data corresponding to the internal write data. This also applies to the NAND circuit 244, which is enabled in response to the control signal wecsdin to output data corresponding to the supplied internal write data through the delay circuit 280b.

The output of the NAND circuit 243 is transmitted to the global write data line GWD through inverter circuits 281a and 282a. The output of the NAND circuit 244 is transmitted to the global write data line /GWD through inverter circuits 281b and 282b. This global write driver GD transmits the internal write data to 16 memory blocks. In order to drive the global write data lines GWD and /GWD having large loads, therefore, an inverter circuit of the final output stage of the global write driver GD is formed by a BiNMOS circuit. The remaining components have CMOS structures.

The signal wecsdin corresponds to the internal write data WEa' described above with reference to FIGS. 25 or 27. Therefore, the delay circuit 270 shown in FIGS. 25 or 27 corresponds to the NAND circuit 71, the delay circuit 72 and the inverter circuit 73 in the delay circuit 70 shown in FIG. 10.

Figure 30B:
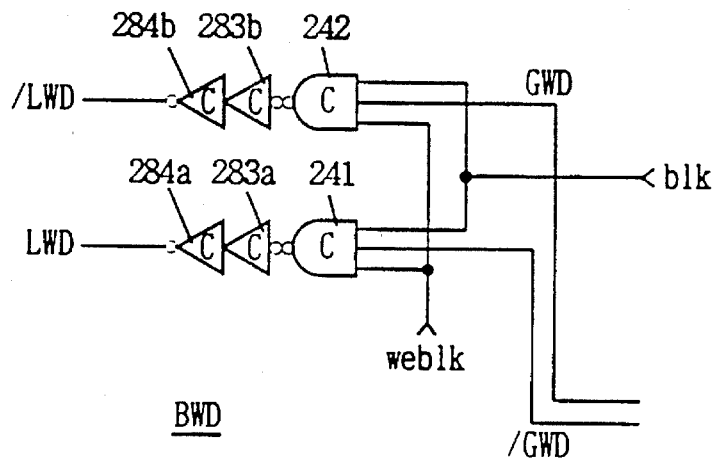

FIG. 30B illustrates the control signals which are supplied to the block write driver in detail. Referring to FIG. 30B, both of the NAND circuits 241 and 241 are brought into enabled states to serve as inverters when both of the block selection signal blk from the Z decoder (see FIG. 9) and the block write control signal weblk from the block driving circuit 41 (see FIG. 29) are at high levels. The output of the NAND circuit 241 is transmitted to the local write data line LWD through inverter circuits 283a and 284a of CMOS structures. The output of the NAND circuit 242 is transmitted to the local write data line /LWD through inverter circuits 283b and 284b of CMOS structures.

As clearly understood from FIGS. 29 to 30B, the block write control signal weblk enters an active state after the block selection signal blk enters an active state. The precharge/equalize signals weblkp (WEp) and weblkdb (/WEb) are generated from the block write control signal weblk. The column decoder carries out a column selecting operation in accordance with the block selection signal blk (see FIG. 17). The column decoder comprises two-stage inverter circuits, as shown in FIG. 17. Therefore, timing defined by the column selection signal is slightly delayed as compared with that of the block write control signal weblk. The block write driver BLW enters an inactive state in response to the block selection signal blk, while transition of the column decoder to inactivation is also executed in accordance with the block selection signal blk. Therefore, the bit lines are precharged and equalized after the write gate is closed or cut off upon completion of the write cycle in accordance with the precharge/equalize signals.

In the aforementioned description, no operation in a read cycle is described. In the read cycle, the write enable signal /WE is at a high level, whereby the block write driver BWD is in a disabled state and the local write data lines LWD and /LWD are charged at high levels. In the bit line load circuit LB, all transistors are in ON states to charge the bit lines bit and /bit.

[Data Read System]

Figure 31:
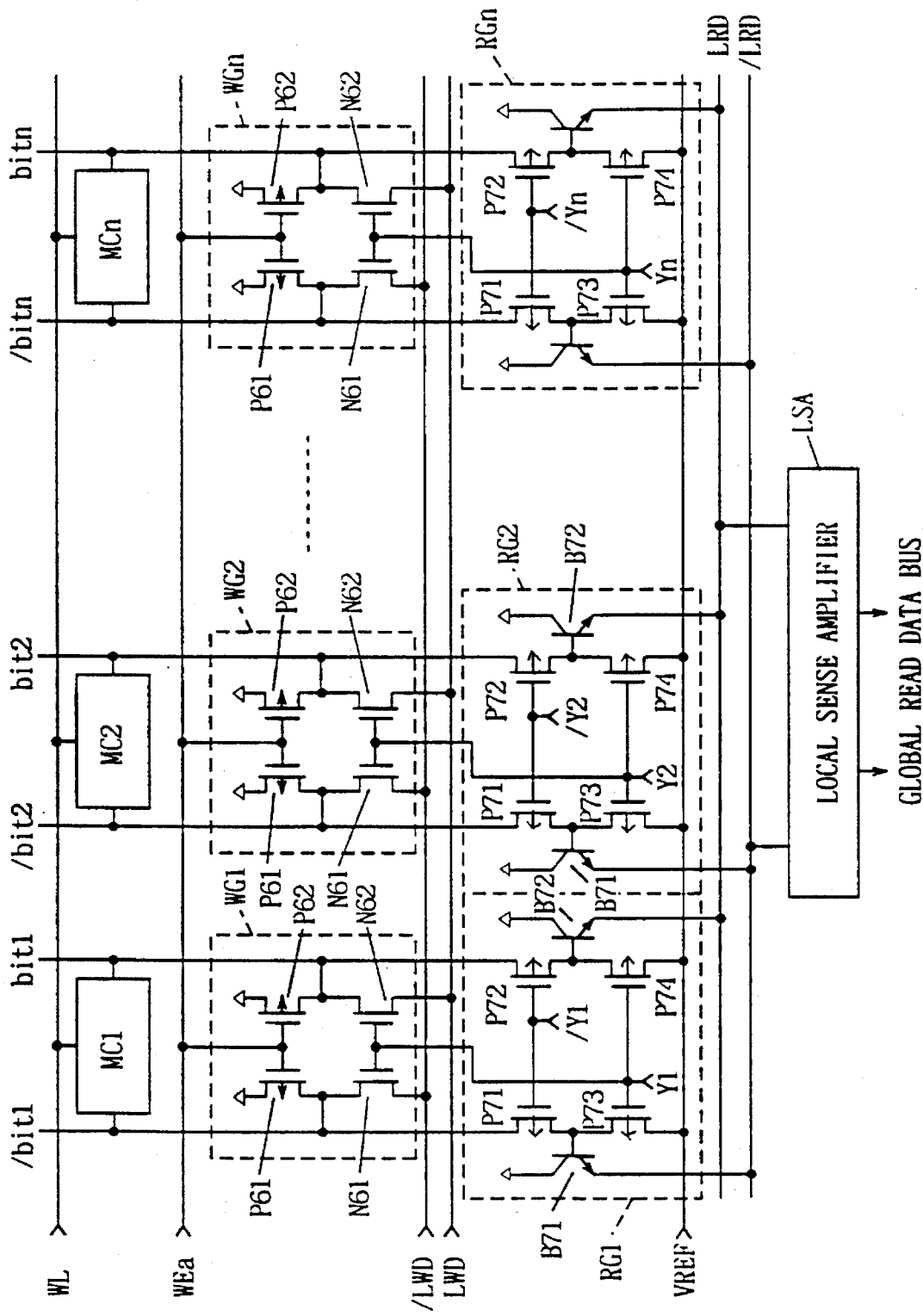
FIG. 31 illustrates structures of read gates provided in the SRAM according to the present invention.

FIG. 31 illustrates the structure of a portion which is related to data reading from the memory cell array in a single I/O block. Bit line pairs bit1 and /bit1 to bitn and /bitn are provided with memory cells MC, write gates WG and read gates RG respectively. The respective components are provided with the same subscripts as those of the bit lines, to be distinguished from each other. Each write gate WG includes p-channel MOS transistors P61 and P62 which conduct in response to the write signal WEa for charging the bit lines /bit and bit to the supply potential Vcc level, and n-channel MOS transistors N61 and N62 which conduct in response to the column selection signal Y for connecting the bit lines /bit and bit to the local write data bus lines /LWD and LWD respectively. The p-channel MOS transistors P61 and P62 conduct in a data read operation when the internal write signal WEa is at a low level, to charge the corresponding bit lines bit and /bit. Thus, potential amplitudes of the bit lines bit and /bit are reduced in accordance with resistance ratios to the memory transistors of the memory cells.

In data writing, the write signal WEa is at a high level, whereby the p-channel MOS transistors P61 and P62 enter OFF states.

Each read gate RG includes npn bipolar transistors B71 and B72 which are connected to the local read data bus /LRD and LRD in emitter-follower mode respectively, p-channel MOS transistors P71 and P72 for connecting the bit lines /bit and bit to bases of the bipolar transistors B71 and B72 in response to the column selection signal /Y, and p-channel MOS transistors P73 and P74 which conduct in response to the column selection signal Y for supplying nonselection levels VREF to the bases of the bipolar transistors B71 and B72 respectively.

Figure 32:
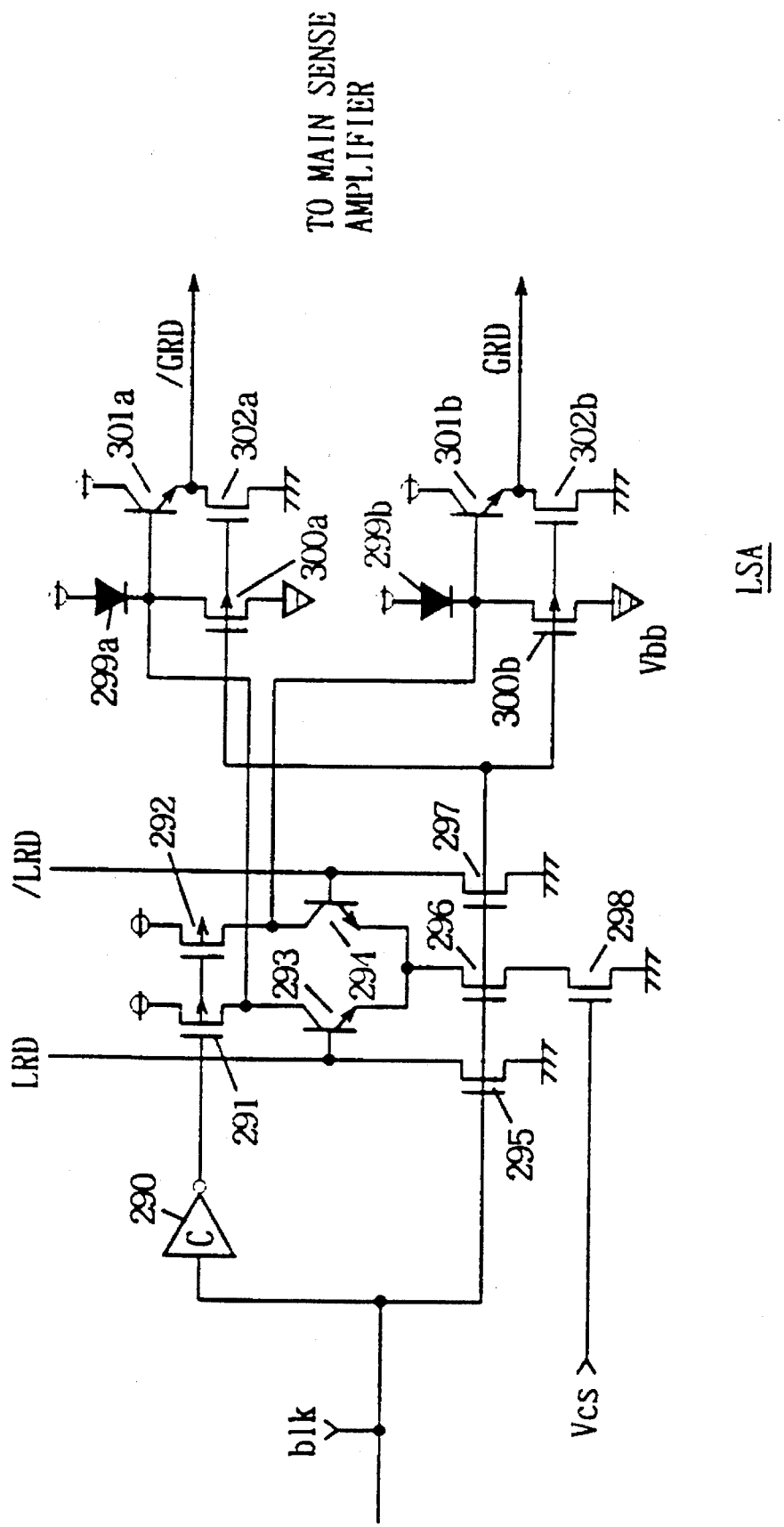
FIG. 32 Illustrates a specific structure of a local sense amplifier shown in FIG. 31.

FIG. 32 illustrates an exemplary structure of each local sense amplifier. Referring to FIG. 32, the local sense amplifier LSA includes a differential amplifying stage for differentially amplifying potential difference across the local read data lines LRD and /LRD, and an output amplifying stage which amplifies and transmits the output of the differential amplifying stage to the main sense amplifier. The differential amplifying stage includes npn bipolar transistors 293 and 294 having emitters which are connected in common and bases which receive the potentials on the local read data lines LRD and /LRD, and n-channel MOS transistors 295, 296 and 297 which conduct in response to the block selection signal blk. The transistors 295 and 297 form current paths between the local read data lines LRD and /LRD and the ground potential Vss, to serve as load resistances. These transistors 295 and 297 adjust potential amplitudes of the local read data lines LRD and /LRD. One conduction terminal of the transistor 296 is connected to emitters of emitter-coupled transistors 293 and 294.

The differential amplifying stage further includes p-channel MOS transistors 291 and 292 which receive the block selection signal blk through inverter circuits to enter conducting states and serve as load resistances for supplying currents to the transistors 293 and 294, and an n-channel MOS transistor 298 which is provided between the transistor 296 and the ground potential Vss for receiving a reference potential Vcs at its gate and serving as a constant current source.

On the other hand, the output amplifying stage includes an npn bipolar transistor 301a having a collector connected to the supply potential Vcc, a base connected to the collector of the transistor 293 and an emitter connected to the global read data line GRD, an n-channel MOS transistor 302 which conducts in response to the block selection signal blk for discharging the global read data line GRD, a diode 299a which is connected between the base of the transistor 301a and a supply potential Vcc supply node, and a p-channel MOS transistor 300a which is provided between the base of the transistor 301a and a reference potential Vbb supply node and conducts in response to the block selection signal blk.

The transistor 300a is connected to the reference potential Vbb, in order to make output voltage levels of nonselected ones of a plurality of local sense amplifiers, which are wired-connected with the global read data line GRD, lower than high and low levels outputted from a selected local sense amplifier. At this time, the transistor 301a is biased by the reference potential Vbb to operate in a nonsaturated or linear region since the switching speed is retarded if the transistor 301a is made to operate in a saturated region.

A diode 299b, a p-channel MOS transistor 300b, an npn bipolar transistor 301b and an n-channel MOS transistor 302b are also provided for the global read data line GRD. The diodes 299a and 299b clamp base potentials of the transistors 301a and 301b to Vcc–Vbe. Upon operation of the differential amplifying stage, a current flows through one of the diodes so that the cathode potential of the diode is reduced and the base potential of the corresponding bipolar transistor is also reduced in response to reduce its output level.

High and low levels of the global read data lines GRD and /GRD are decided by current drivability levels of the bipolar transistors 301a and 301b and the MOS transistors 302a and 302b. The current drivability levels of the bipolar transistors 301a and 301b are made larger than those of the MOS transistors 302a and 302b. Therefore, the MOS transistors 302a and 302b function as load resistances.

Figure 33A:
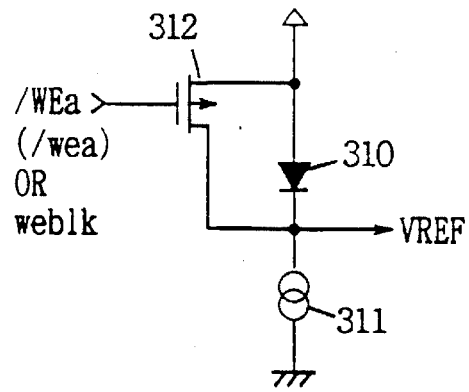
FIGS. 33A–33C illustrates circuit structures for generating a nonselection level shown in FIG. 31.
Figure 33B:
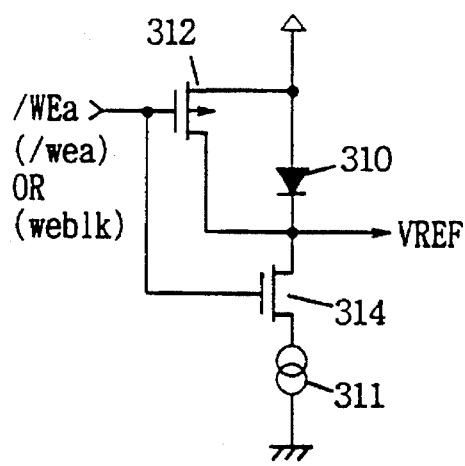
Figure 33C:
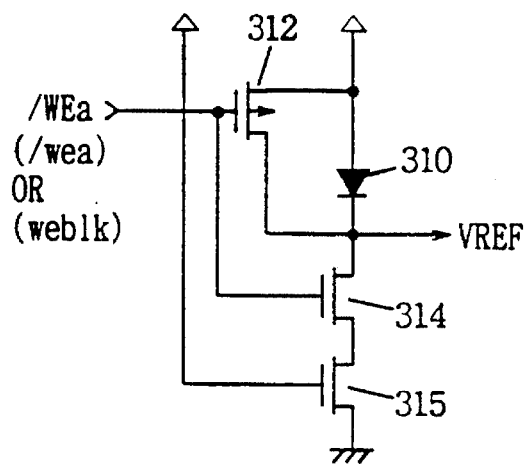

FIGS. 33A–33C shows exemplary structures of nonselection level generation circuits.

The nonselection level generation circuit shown in FIG. 33A includes a diode 310 which is provided between the supply potential Vcc and an output node, a constant current source 311 which is connected between the diode 310 and the ground potential Vss, and a p-channel transistor 312 which conducts in response to the internal write control signal /WEa to charge the output node at the supply potential Vcc level. The internal write signal /WEa which is supplied to a gate of the transistor 312 may be an inverted signal of the internal write signal wea outputted from the write buffer, or the block write control signal weblk generated from the block driving circuit shown in FIG. 29.

Referring to FIG. 33B, the nonselection level generation circuit is different from that shown In FIG. 33A in a point that FIG. 33B arrangement includes an n-channel MOS transistor 314 which is provided between an output node and a constant current source 311 for receiving the internal write signal /WEa at its gate. Other structure is similar to that of the circuit shown in FIG. 33A.

The nonselection level generation circuit shown in FIG. 33C has such a circuit structure that the constant current source 311 of the circuit shown in FIG. 33B is replaced by an n-channel MOS transistor 315 which receives a voltage of the supply potential Vcc level. This transistor 315 serves as a load resistance.

Each of the nonselection level generation circuits shown in FIGS. 33A–33C increases its nonselection level VREF to the supply potential Vcc level when the internal write signal /WEa is at a low level to indicate a data write operation. When the internal write control signal /WEa goes high to indicate no data write operation, the transistor 312 enters an OFF state and the nonselection level VREF is fixed at the supply potential Vcc–Vbe (Vbe: forward drop voltage of the diode 310). The operations of the circuits shown in FIGS. 32 and 33 are now described with reference to an operation waveform diagram shown in FIG. 34.

It is assumed here that Y1 enters a selected state as a column selection signal, for writing data 0 (low level data in bit line "bit") and then reading data 1 (high level data from bit line "bit").

In data writing, the internal write control signal /WEa is at a low level and the transistor 312 is in an ON state. In this case, the nonselection level VREF is substantially at the supply voltage Vcc level, i.e., substantially at the same voltage level as the potential level of the bit line /bit of a high level potential.

The internal write control signal WEa shown in FIG. 31 is at a high level in data writing, whereby the load MOS transistors P61 and P62 provided in the write gate WG are in OFF states. Upon rise of the column selection signal Y1, the MOS transistors N61 and N62 provided in the write gate WG1 enter ON states. The MOS transistors N61 and N62 provided in the nonselected write gates WG2 to WGn enter OFF states. Thus, the bit lines bit1 and /bit1 are connected to the local write data lines LWD and /LWD, so that internal write data supplied from the block write driver (not shown) are transmitted onto the bit lines bit1 and /bit1. In this case, the potential of the bit line bit1 is discharged to the ground potential level for writing the data 0.

Upon completion of the data writing, the column selection signal Y1 falls to a low level and the transistors N61 and N62 provided in the write gate WG1 enter OFF states, while the word line enters a nonselected state, the internal write signal WEa enters an inactive state and the bit lines bit1 and /bit1 are charged to the supply potential Vcc level by the load MOS transistors P61 and P62.

In this write operation, the transistors P71 and P72 are in ON states in the read gate RG1, so that signal potentials on the bit lines bit1 and /bit1 are transmitted to the bases of the bipolar transistors B71 and B72 provided in the read gate RG1.

In the remaining nonselected bit line pairs, the transistors P73 and P74 are in ON states in the read gates. In this case, the nonselection levels VREF are at the same level as high-level bit line potentials, so that high-level nonselection levels VREF are transmitted to the gates of the bipolar transistors B71 and B72 of the read gates RG2 to RGn related to nonselected columns. The emitters of the bipolar transistors B71 and B72 of the read gates RG1 to RGn are OR-connected to the local read data lines /LRD and LRD respectively. In this case, voltage levels from the bipolar transistors having the highest base potentials appear on the local read data lines /LRD and LRD. In this case, the highest voltage levels of the bipolar transistors B71 and B72 are maintained at the supply potential Vcc level.

Then, reading of the data 1 is executed. In this case, the internal write signal WEa is at a low level. All load MOS transistors P61 and P62 included in the write gates WG1 to WGn are in ON states, to charge the bit lines bit and /bit respectively. At this time, the nonselection levels VREF are reduced by forward drop voltages VBE of the diodes 310 and the voltage levels reach the Vcc–VBE level since the internal write control signal /WEa is at a high level. The potentials on the bit lines bit1 and /bit1 are transmitted to the bases of the bipolar transistors B71 and B72 which are included in the read gate RG1 for the selected bit lines bit1 and /bit1 through the transistors P71 and P72. The nonselection levels VREF are transmitted to the bases of the bipolar transistors B71 and B72 of the read gates RG2 to RGn corresponding to the nonselected bit line pairs bit2 and /bit2 to bitn and /bitn. The nonselection level VREF is lower than the potential level of the low-level bit line /bit1 in this case (the amplitudes of the potentials of the bit lines, which is decided by the resistances of the MOS transistors P61 and P62 and the memory transistors included in the memory cell and current suppliability levels of charging circuit included in the bit line load circuit, are about Vcc and Vcc–0.1 in general). Therefore, potentials corresponding to the signal potentials on the bit lines bit1 and /bit1 are transmitted onto the local read data lines LRD and /LRD in emitter-follower modes through the bipolar transistors B71 and B72.

The signal potentials appearing on the local read data lines LRD and /LRD are amplified by the local sense amplifier LSA. Namely, the local sense amplifier LSA is brought into an active state by the block selection signal blk so that the signal potential difference on the local read data lines LRD and /LRD is amplified by the bipolar transistors 293 and 294, while a large amount of a current flows through the bipolar transistor 293 since the signal potential on the local read data line LRD is high, the base potential of the bipolar transistor 301a is reduced below that of the bipolar transistor 301b, and the potential level of the global read data line /GRD is reduced below that of the global read data line GRD. As shown at (b) in FIG. 34, the local read data lines LRD and /LRD are equalized at the same potentials in the data write operation, whereby the potential levels of the local read data lines LRD and /LRD are amplified at a high speed if a data read operation is executed in continuation, so that it is possible to read the data at an extremely higher speed as compared with a case of fixing the nonselection levels VREF at constant potential levels regardless of constant read and write cycles. When the nonselection level VREF is set at fixed potential level in both of the write and read cycles, potential difference is developed between the read data lines /LRD and LRD in accordance with the internal write data as shown at (a) in FIG. 34 so that the read data is ascertained after the potential amplitudes are equalized and it is possible to reduce the time required for equalizing the potentials of the read data lines LRD and /LRD.

Figure 34:
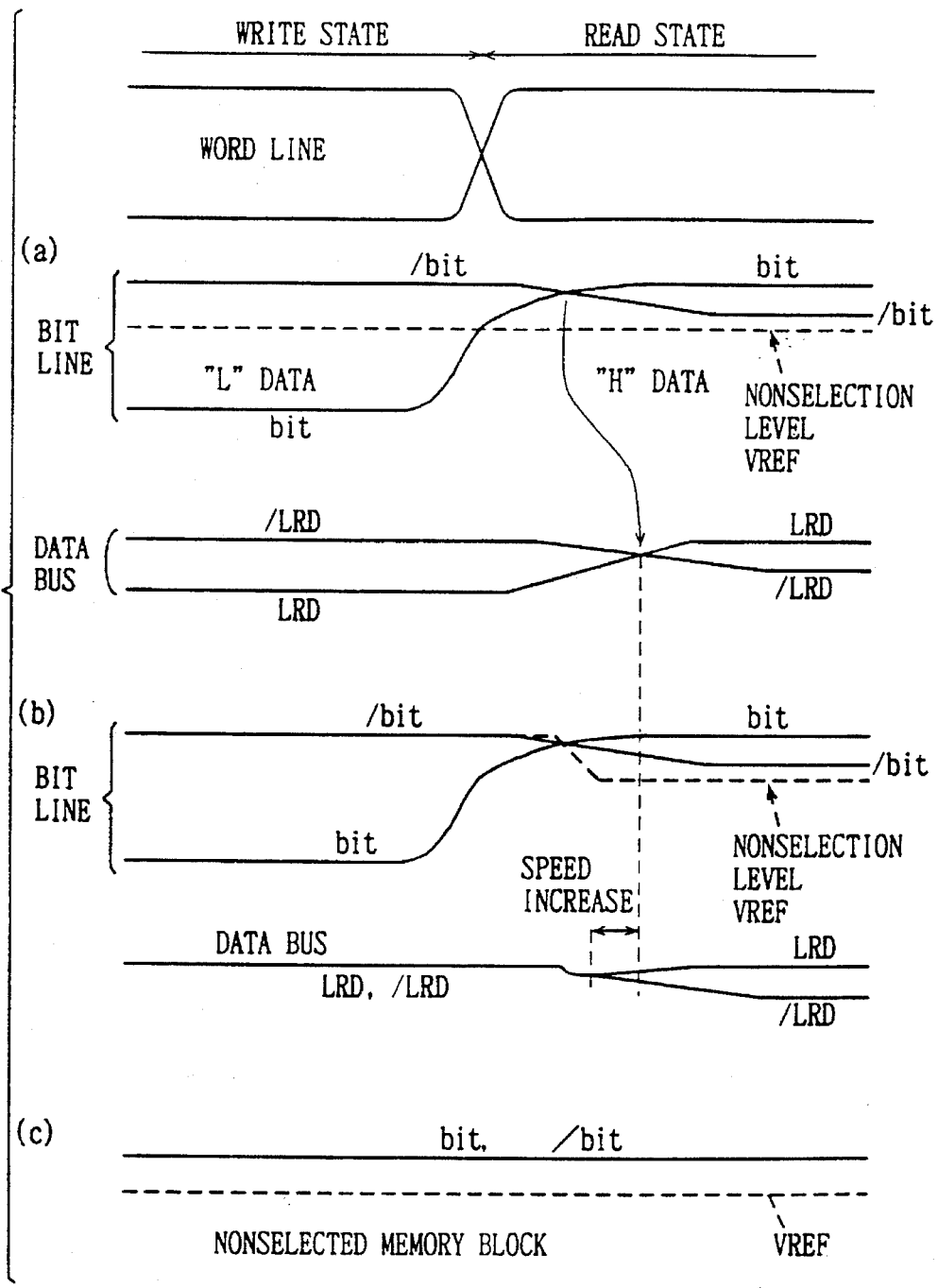
FIG. 34 is a signal waveform diagram showing operations of the circuits shown in FIGS. 31 and 33A–33C.

When the internal write control signal /WEa is generated employing the signal weblk in the nonselected blocks, the nonselection levels VREF remain unchanged and at constant VCC–VBE levels since the transistors 312 are normally in OFF states (see (c) in FIG. 34).

Figure 35:
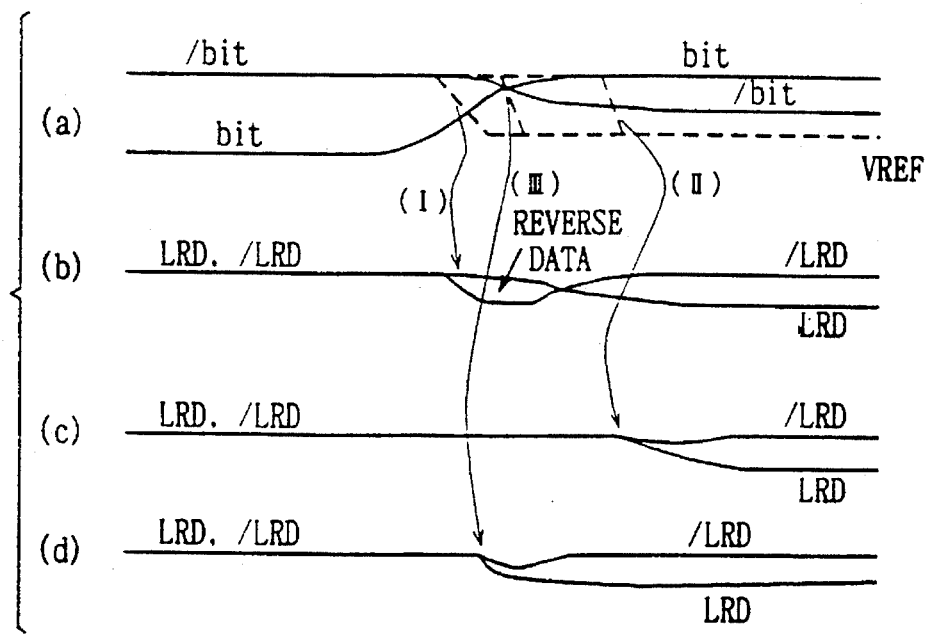
FIG. 35 is a diagram for illustrating switching timing for nonselection levels.

FIG. 35 illustrates switching timing for each nonselection level. When the nonselection level VREF is reduced in advance of a point of time when the potentials of the bit lines bit and /bit cross with each other as shown by a broken line I at (a) in FIG. 35, reverse data are outputted to the local read data lines LRD and /LRD as shown at (b) in FIG. 35. Consequently, it is necessary to again inverse the reverse data for reading correct data, and hence the access time is increased.

When the nonselection level REF is reduced after the point of time when the potentials of the bit lines bit and /bit cross with each other at (a) in FIG. 35, data appear on the local read data lines LRD and /LRD at retarded timing, as shown at (c) in FIG. 35. This leads to increase of the access time. Therefore, the data can be read at the highest speed when the nonselection level VREF is reduced at the point of time when the potentials of the bit lines bit and /bit cross with each other, as shown by a broken line III at (a) in FIG. 35.

Figure 36:
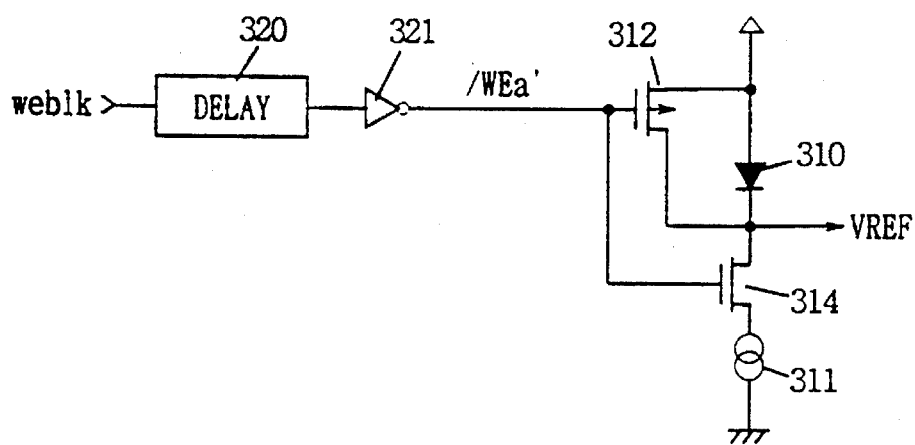
FIG. 36 illustrates another structure of a nonselection level generation circuit.

FIG. 36 illustrates a further structure of the nonselection level generation circuit. The nonselection level generation circuit shown in FIG. 36 includes a delay circuit 320 which delays the internal write control signal weblk by a prescribed time, and an inverter circuit 321 which inverts an output of the delay circuit 320. Other structure is similar to that of the circuit shown at (b) in FIG. 33. When the nonselection level generation circuit shown in FIG. 36 is employed, the transistor 312 enters an OFF state after a lapse of a prescribed time after the internal write control signal weblk enters an inactive state. When a delay time provided by the delay circuit 320 is set at a proper value, therefore, it is possible to switch the potential level of the nonselection level VREF at the point of time when the potentials of the bit lines bit and /bit cross with each other, thereby implementing high-speed access.

Figure 37:
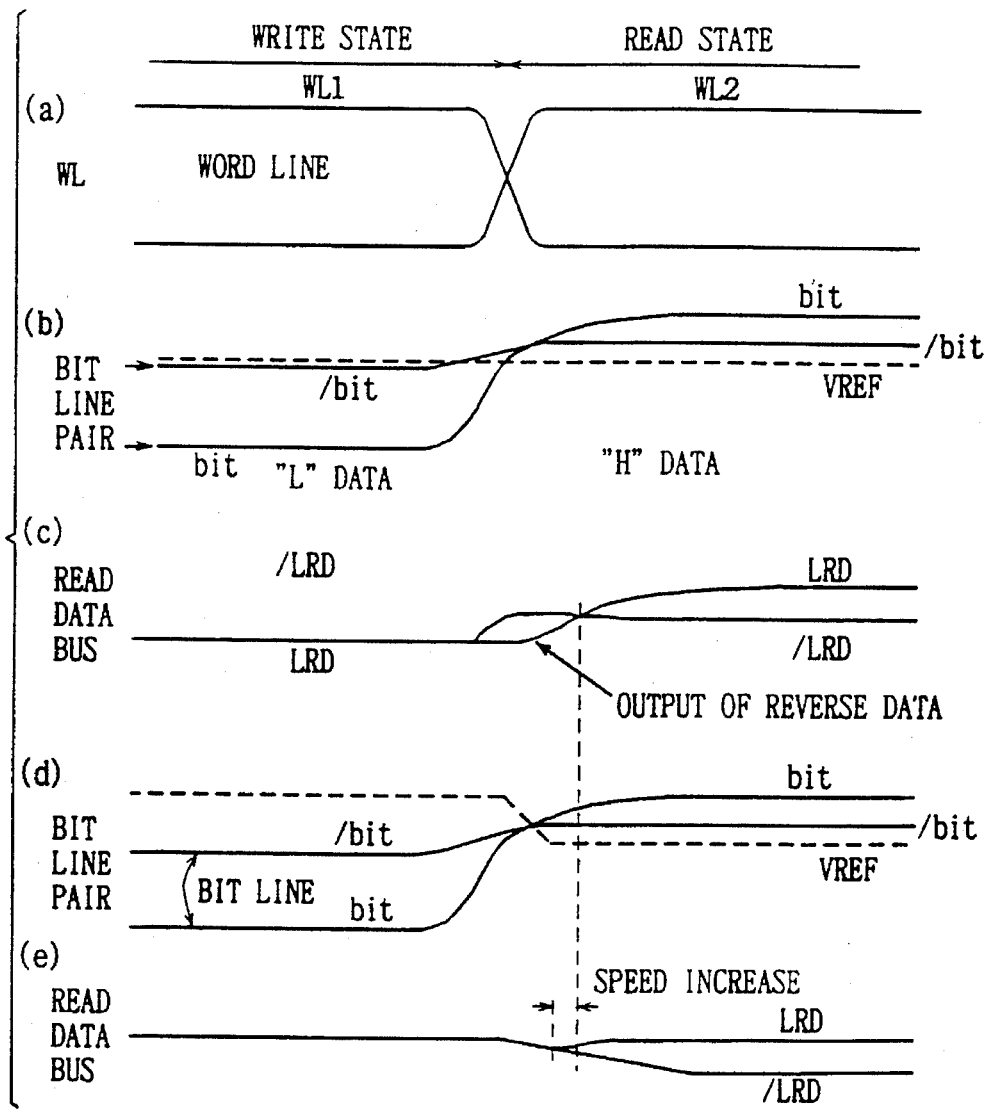
FIG. 37 is a signal waveform diagram showing an operation of a combination of the data write system shown in FIGS. 25 or 27 and the read gates shown in FIG. 31.

FIG. 37 is an operation waveform diagram showing an operation which is attained when the structure of the nonselection level switching circuit is .applied to the embodiment shown in FIGS. 25 to 27. In the embodiment shown in FIGS. 25 to 27, the high-level bit line potential is reduced by a prescribed potential in data writing. When the nonselection level VREF is made constant regardless of write and read cycles, the nonselection level VREF exceeds the high-level bit line potential as shown at (b) in FIG. 37, and the potential of the read data bus is brought into an equalized state in a data write cycle.

When the write cycle is converted to a read cycle, however, reverse data are outputted until both of the potentials of the bit lines bit and /bit exceed the nonselection level VREF, and hence correct read data appear on the read data bus at retarded timing (see (c) in FIG. 37).

When the nonselection level VREF is set at a high level of the supply potential Vcc level in data writing and set to be lower than the low-level bit line potential in data reading as in this embodiment, however, it is possible to read the data an a high speed with no output of such reverse data (see (d) and (e) in FIG. 37).

[Another Embodiment of Data Read System]

Figure 38:
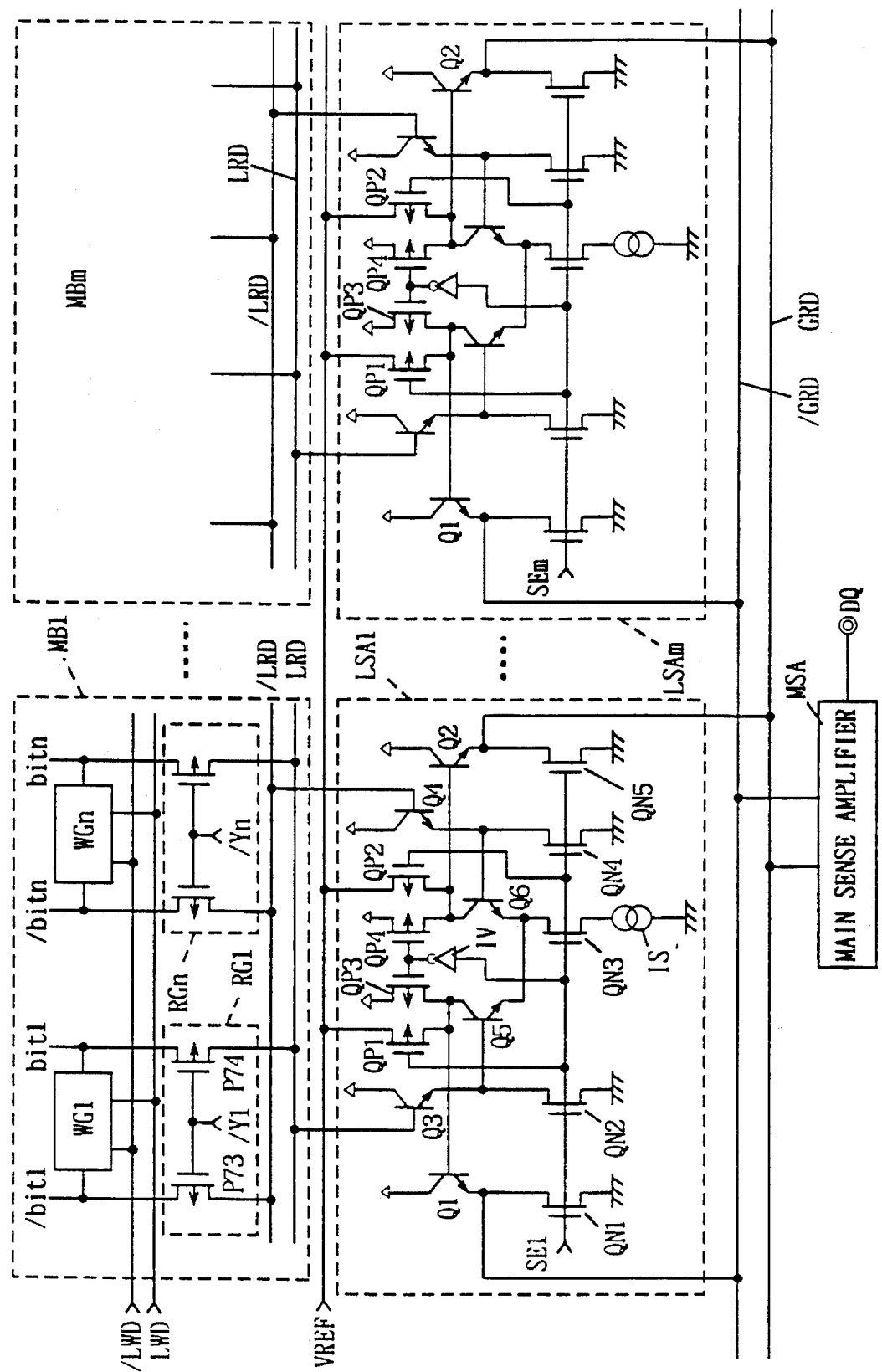
FIG. 38 illustrates other structures of local sense amplifiers.

FIG. 38 illustrates a structure of another embodiment of the data read system. Referring to FIG. 38, local sense amplifiers LSAl to LSAm are provided for respective ones of memory blocks MBl to MBm. The local sense amplifiers LSAl to LSAm are connected to a main sense amplifier MSA in common through global read data lines GRD and GRD. In operation, only one local sense amplifier is brought into an active state.

Each of read gates RG (RG1 to RGn: n=8 in this embodiment) includes p-channel MOS transistors P73 and P74 which connect bit lines bit and /bit (generically denoting bit1 and /bit1 to bitn and /bitn) in response to a column selection signal /Y (generically denoting /Y1 to /Yn) to local read data lines LRD and /LRD. No bipolar transistor is provided in this read gate.

Each of the local sense amplifiers LSA (generically denoting LSAl to LSAm) includes npn bipolar transistors Q3 and Q4 which receive signal potentials on the local read data lines LRD and /LRD on bases thereof, npn bipolar transistors Q5 and Q6 which receive emitter outputs of the bipolar transistors Q3 and Q4 in bases thereof, p-channel MOS transistors QP3 and QP4 which conduct upon receiving a sense amplifier activation signal SE (generically denoting SEl to SEm) at gates thereof through inverters IV for supplying currents to collectors of the transistors Q5 and Q6, and p-channel MOS transistors QP1 and QP2 which receive the sense amplifier activation signal SE at gates thereof for transmitting a nonselection level VREF to collectors of the transistors Q5 and Q6 respectively. The transistors QP3 and QP4 enter ON states in a sense operation, while the transistors QP1 and QP2 enter ON states in inactivation of the sense amplifier activation signal SE.

Each local sense amplifier LSA further includes an npn bipolar transistor Q1 which receives a collector potential of the transistor Q5 at its base for transmitting a signal to a global read data line /GRD in an emitter-follower mode, an npn bipolar transistor Q2 which receives a collector potential of the transistor Q6 at its base for transmitting a signal onto the global read data line GRD in an emitter-follower mode, n-channel MOS transistors QN1, QN2, QN3, QN4 and QN5 which conduct in response to the sense amplifier activation signal SE for forming current supply paths for the bipolar transistors Q1, Q3, Q5 and Q6, Q4 and Q2, and a constant current source IS for making a current flowing in the transistor QN3 constant. The operation is mow described with an operation waveform diagram shown in FIG. 39.

Figure 39:
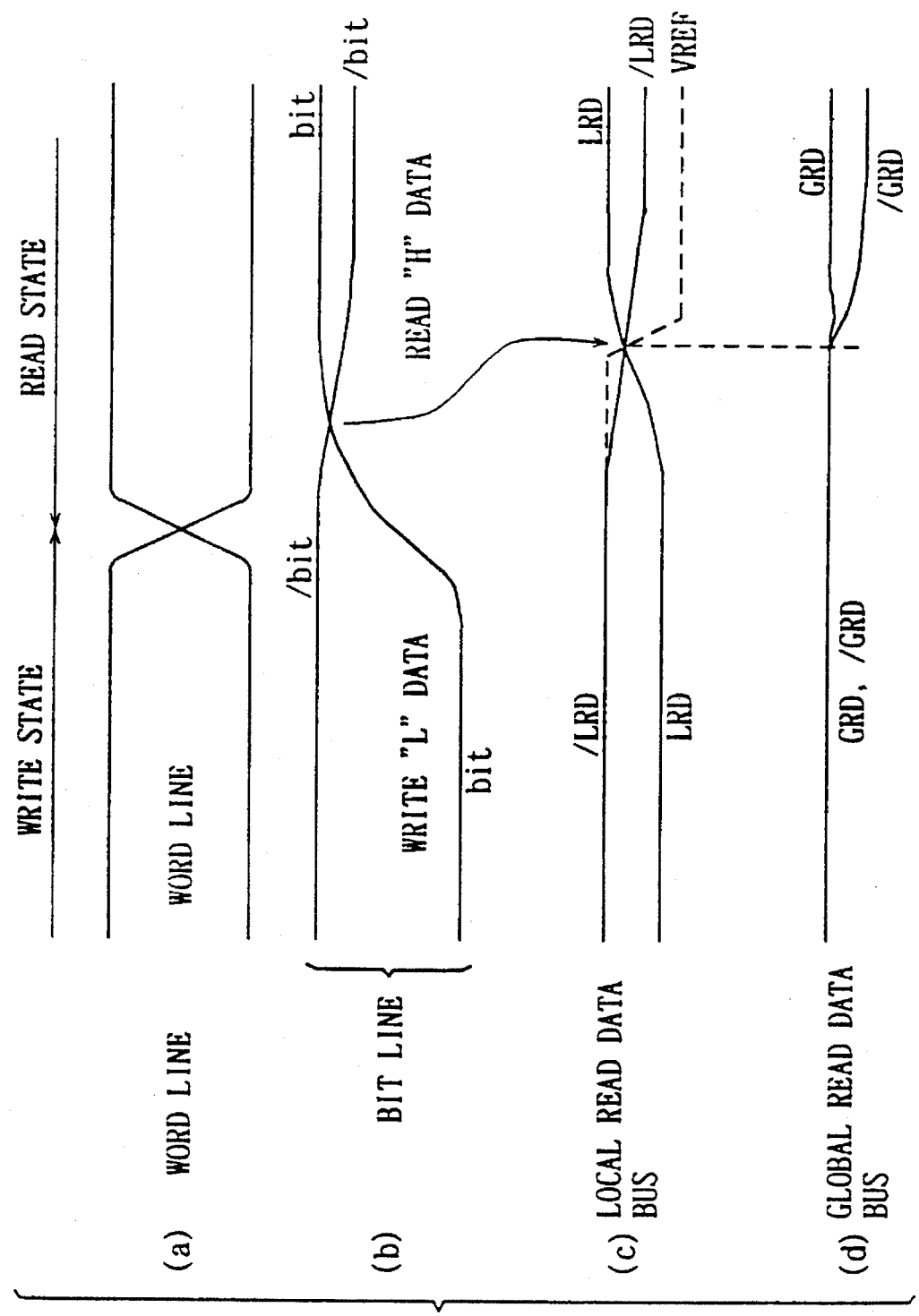
FIG. 39 is a signal waveform diagram showing an operation of each local sense amplifier shown in FIG. 38.

FIG. 39 shows an operation for carrying out data reading following data writing. Consider that the memory block MBl in which the column selection signal Y1 enters a selected state is selected. In a data write state, the transistors P73 and P74 provided in the read gate RG1 enter ON states in accordance with the column selection signal /Y1, so that the local read data lines LRD and /LRD are connected to the bit lines bit1 and /bit1. Write data are transmitted onto the bit lines bit1 and /bit1 by paths (not shown) through the write gate WG1. The write data are transmitted onto the local read data lines LRD and /LRD.

The local sense amplifier LSA is wired-OR-connected to the global read data lines GRD and /GRD. Only the local sense amplifier LSA for the selected memory block is brought into an active state. In this case, the sense amplifier activation signal SEl goes high, while the remaining sense amplifier activation signals SEm are at low levels. In the local sense amplifiers LSAm corresponding to the nonselected memory blocks MBm, the transistors QP1 and QP4 enter ON states, while base potentials of the output bipolar transistors Q1 and Q2 go to the nonselection levels VREF.

In the local sense amplifier-LSAl for the selected memory block MBl, on the other hand, the base potentials of the output bipolar transistors Q1 and Q2 are changed in accordance with the signal potentials on the local read data lines /LRD and LRD. The output bipolar transistors Q1 and Q2 are wired-OR-connected to the global read data lines GRD and /GRD, so that highest base. potentials of the output bipolar transistors Q1 and Q2 in the local sense amplifiers LSAl to LSAm are transmitted. In this state, therefore, the potentials of the global read data lines GRD and /GRD are set at the nonselection level VREF. The nonselection level VREF is produced employing the nonselection level generation circuit employed in the aforementioned embodiment. However, no block selection signal is included and only an internal write signal /wea is utilized.

Then, data reading is carried out with respect to the bit lines bit1 and /bit1. At this timer a newly selected memory cell stores high-level data, and the bit line bit is charged so that its potential is increased. Following potential change of the bit lines bit and /bit, the potentials of the local read data bus LRD and /LRD are also changed. In this data read cycle, the nonselection level VREF is reduced to be lower than the potential level of the low-level local read data bus /LRD. Thus, signal potentials in accordance with the base potentials of the output bipolar transistors Q1 and Q2 of the selected local sense amplifier LSAl appear on the global read data bus GRD and /GRD. This is because the base potentials of the output bipolar transistors Q1 and Q2 of the remaining nonselected local sense amplifiers LSAm are at the nonselection level VREF.

As hereinabove described, it is possible to maintain the potentials of the global read data bus an the same potential levels in the write cycle by changing the nonselection level VREF which is supplied to the local sense amplifier between the write and read cycles, thereby reading the data at a high speed. The data can be read at the highest speed when the potential level of the nonselection level VREF is changed at the point of time for changing the potentials of the local read data lines LRD and /LRD as shown at (c) in FIG. 39. This structure is implemented by employing a structure which is similar to that of the nonselection level generation circuit shown in FIG. 36 and setting the delay time of the delay circuit 320 at a proper level.

In the structure shown in FIGS. 31 or 38, the nonselection level VREF is set to be lower than the low-level bit line potential in a read cycle for reading data. In this case, the potentials of "the local read data buses and the global read data buses are changed in accordance with the read data. A structure for further increasing the speed of this reading is now described.

Figure 40:
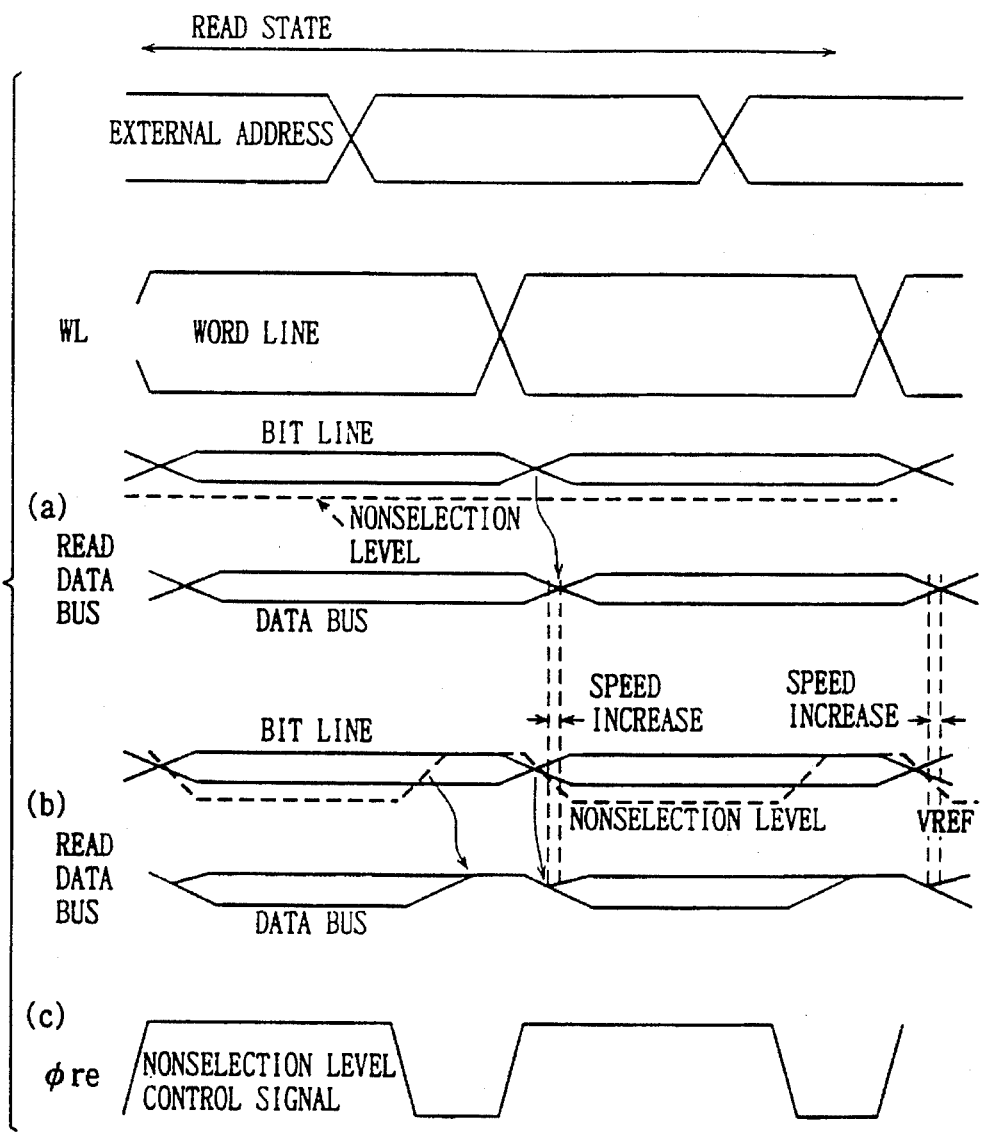
FIG. 40 is a signal waveform diagram for illustrating an operation of a nonselection level generation circuit according to another embodiment of the present invention.

When a data read operation is repeatedly executed as shown in FIG. 40, the nonselection level VREF is increased to a high level upon potential rise of the word line, to equalize the data bus, i.e., the local read data bus lines LRD and /LRD and the global read data lines GRD and /GRD at the same potentials (see (b) in FIG. 40). When the nonselection level VREF is held at a low level as shown at (a) in FIG. 40, potential amplitudes of the data bus are developed but it is possible to read next data at a high speed since potential amplitude of the read data bus is eliminated by temporarily increasing the nonselection level VREF to a high level in advance of word line selection.

Referring to FIG. 40, the local read data lines and the global read data lines are shown as read data buses respectively to be applicable to the structures shown in FIGS. 31 and 38. The structures shown in FIGS. 31 and 38 may be combined with each other. In order to temporarily increase the nonselection level VREF to the high level of the supply potential Vcc level before word line selection, a nonselection level control signal φre may be reduced to a low level for a prescribed period before word line selection to short circuit a diode in a nonselection level generation circuit.

Figure 41:
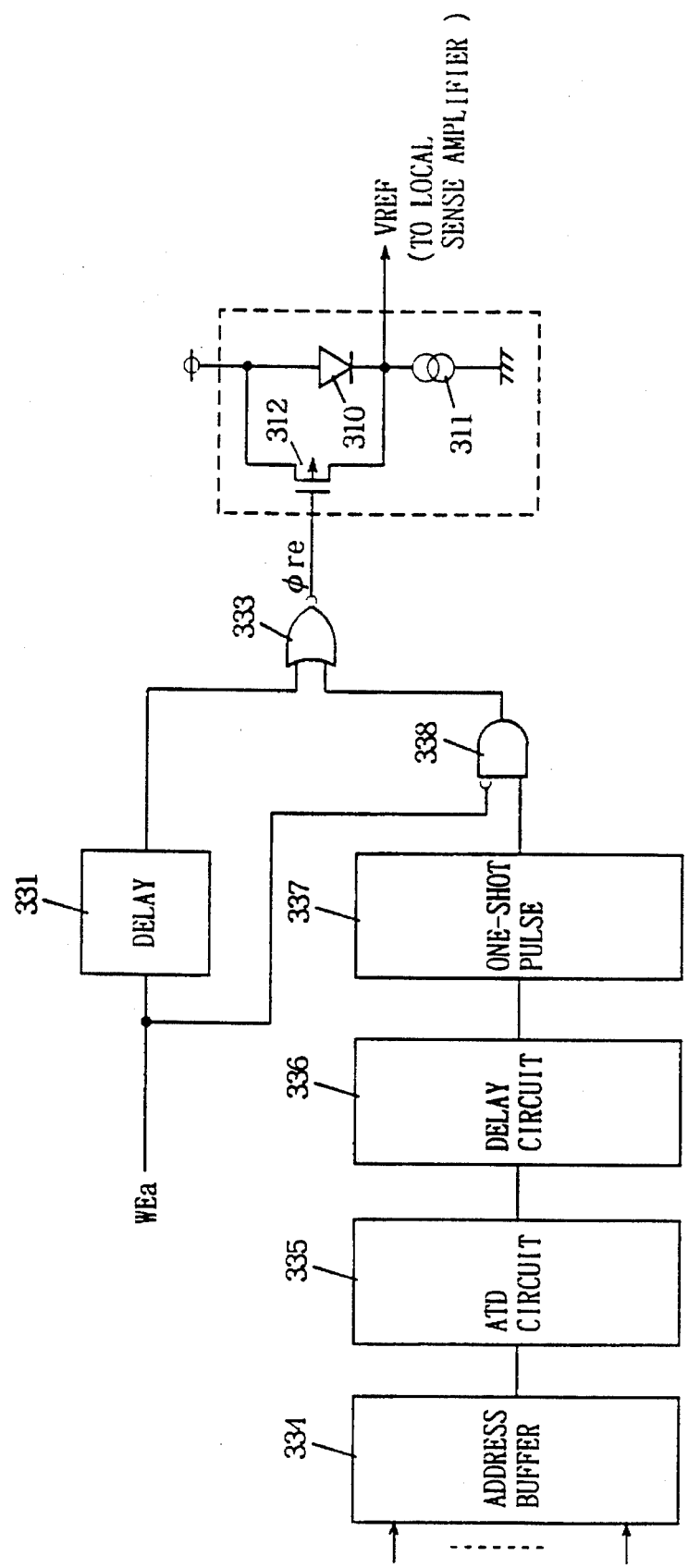
FIG. 41 illustrates a circuit structure for generating a nonselection level shown in FIG. 40.

FIG. 41 illustrates an exemplary structure of a nonselection level control signal φre generation circuit shown in FIG. 40. Referring to FIG. 41, the nonselection level control signal generation circuit includes an ATD circuit 335 which receives an internal address signal from an address buffer 334 for detecting a point of time of change of the address signal, a delay circuit 336 which delays an address change detection signal from the ATD circuit 335 by a prescribed time, a one-shot pulse generation circuit 337 which generates a one-shot pulse signal having a prescribed time width in response to an output of the delay circuit 336, and a gate circuit 338 which receive the internal write control signal WEa and an output of the one-shot pulse generation circuit 337 in its false and true inputs respectively. The gate circuit 338 passes the output of the one-shot pulse generation circuit 337 when the internal write control signal WEa is at a low level to indicate data reading. In data writing, the internal write control signal WEa is at a high level and the output of the gate circuit 338 is at a low level.

The nonselection level generation circuit further includes a delay circuit 331 which delays the internal write control signal WEa for a prescribed time, and a NOR circuit 333 which receives outputs of the delay circuit 331 and the gate circuit 338. The NOR circuit 333 sets the control signal ere at a low level when its one input goes high.

In a data write cycle, the internal write control signal WEa is at a high level, the nonselection level control signal φre is at a low level and the nonselection level VREF is at a high level of Vcc. In transition from the write cycle to a read cycle, the output of the delay circuit 331 falls to a low level after a lapse of a prescribed time. At this time, the gate circuit 338 is brought into an enabled state by the low-level internal write control signal WEa, while no pulse is generated from the one-shot pulse generation circuit 337. Therefore, the output of the gate circuit 338 is at a low level and the nonselection level control signal φre which is outputted from the NOR circuit 33 goes high while the nonselection level VREF goes low to the Vcc–Vth level. When a prescribed period elapses after starting of the read cycle, the one-shot pulse generation circuit 337 generates a one-shot pulse in response to the output of the delay circuit 336, so that the nonselection level control signal φre falls to a low level for a prescribed period through the NOR circuit 332. Thus, it is possible to implement the nonselection level control signal shown in FIG. 40.

Further, an ATD circuit is employed in the structure shown in FIG. 41. In a synchronous type SRAM which operates in synchronization with an external clock such as a system clock, however, it is possible to generate a nonselection level control signal using the external clock signal as a trigger. When the chip selection signal /CS is in an active state on a leading edge of the external clock signal, a one-shot pulse may be generated after a lapse of a prescribed period. Therefore, a latch circuit for latching the chip selection signal /CS in synchronization with the clock signal is employed in place of the ATD circuit.

[Summary of Logic of Data Write System]

Figure 42:
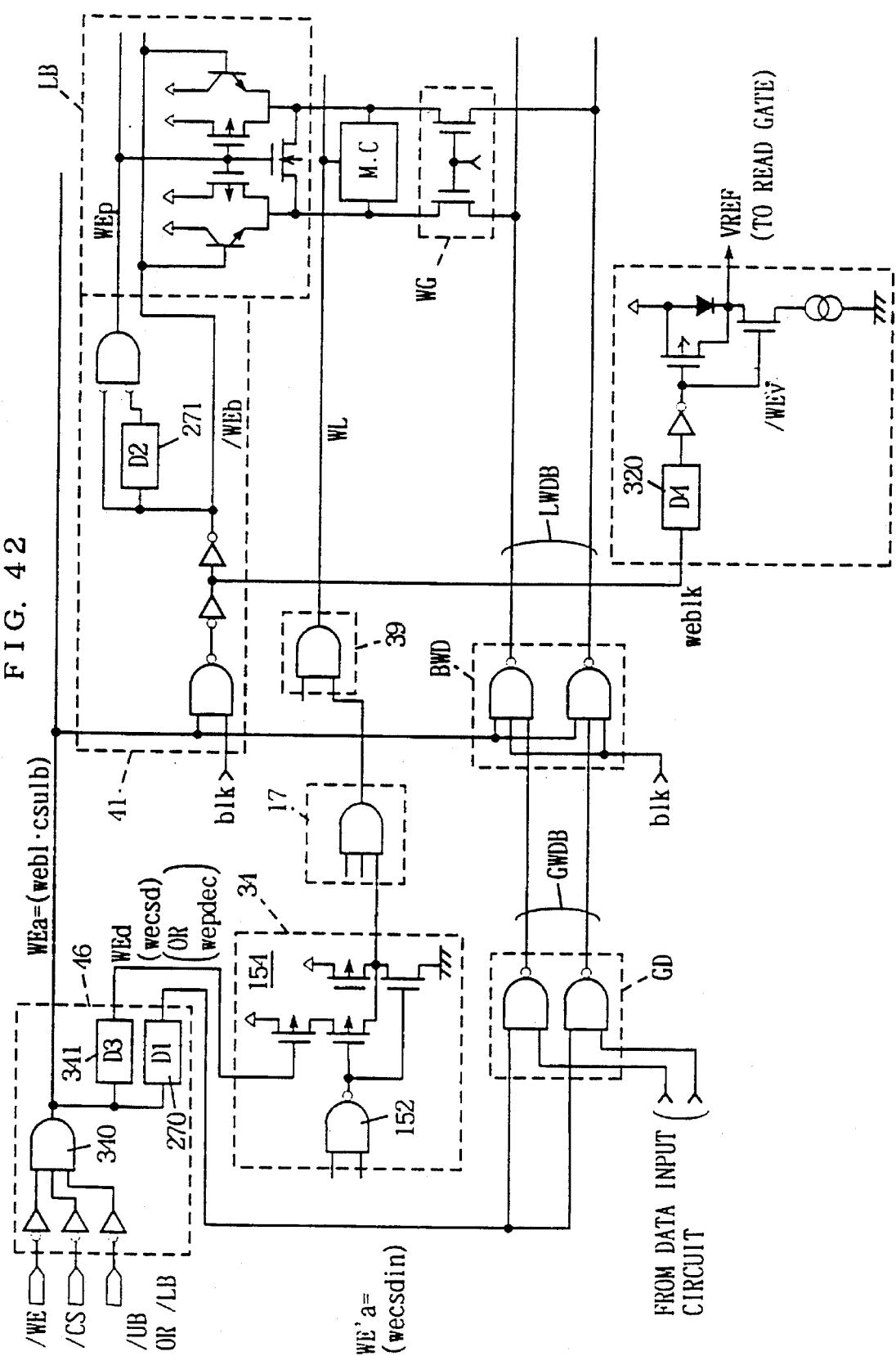
FIG. 42 illustrates data write related circuitry.

FIG. 42 schematically illustrates a structure of a circuit part which is related to data writing. Referring to FIG. 42, portions corresponding to those in the aforementioned embodiment are denoted by the same reference numerals, to omit the description thereof. In a control circuit 46, however, a gate 340 takes the logic of external control signals /WE, /CS and /UB or /LB. An X predecoder 34 is supplied with a delayed write control signal WEd which is obtained by delaying the internal write control signal WEa through a delay circuit 341. The delay circuit 341 has a delay time D3. A global write driver GD is supplied with the internal write control signal WEa through a delay circuit 270. The delay circuit 270 has a delay time D1. In a block driving circuit 41, fall of a first precharge/equalize signal WEp is delayed by a time DD by a delay circuit 271. A nonselection level VREF is produced by delaying an internal write control signal weblk by a delay time D4 by a delay circuit 320. The internal write control signal WEa corresponds to a logical product of the control signals webl and csulb shown in FIG. 10. The internal control signal WEd corresponds to wecsd or wepdec shown in FIG. 10. A control signal WE'a, which is supplied to the global write driver GD, corresponds to wecsdin shown in FIG. 10.

Figure 43:
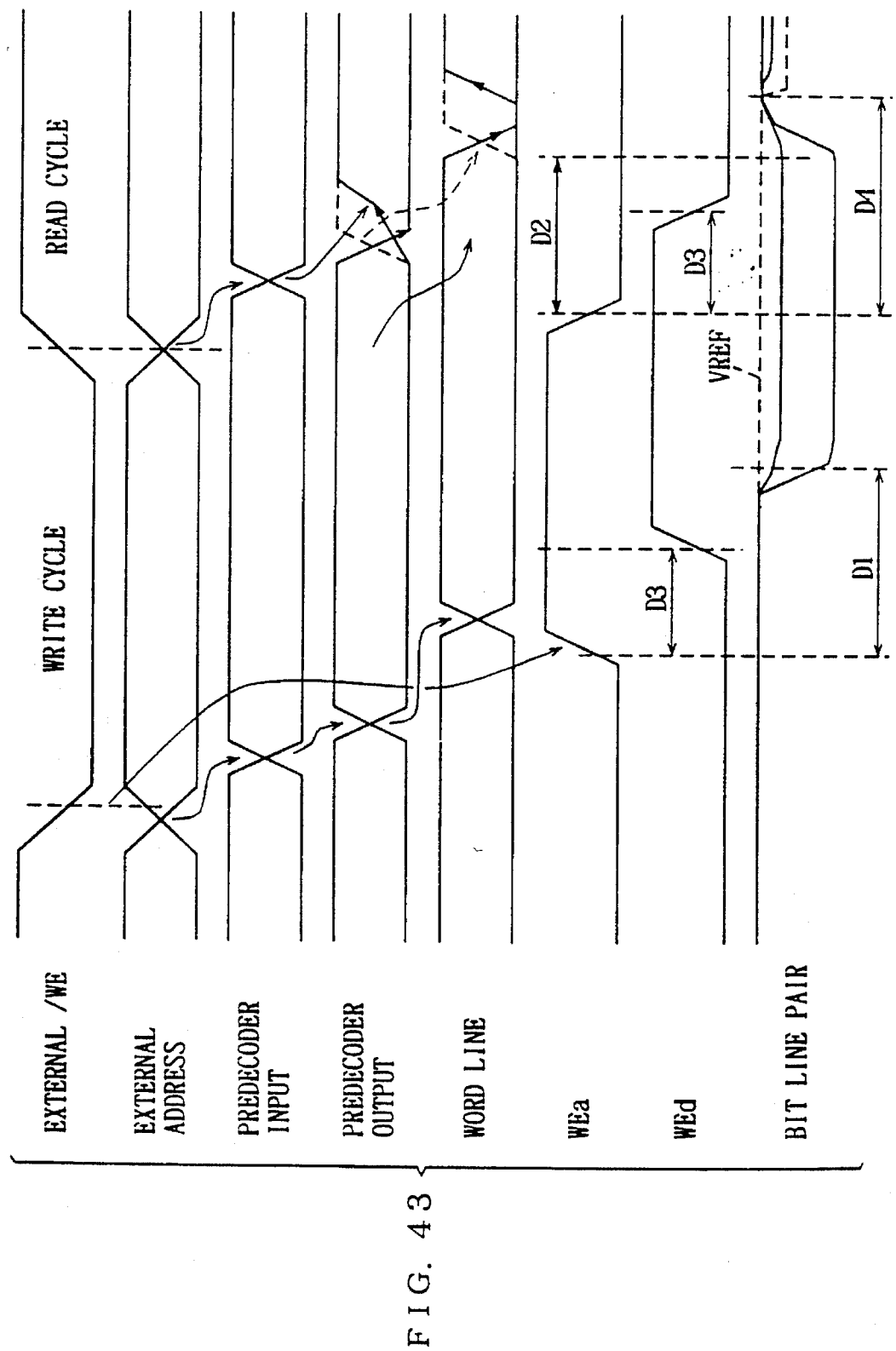
FIG. 43 is a signal waveform diagram for illustrating a function of a delay circuit employed for data writing shown in FIG. 42.

FIG. 43 schematically illustrates the operation of this data write system. In a write cycle, the control signal WEd maintains a low level, and the predecoder output rises at a high speed. After a lapse of the delay time D3 of the delay circuit 341, the control signal WEd rises to a high level. At this time, the potential of a selected word line is increased.

On the other hand, the control signal WE'a is generated with the delay time D1 by the delay circuit 272. In this case, the output of the global write driver GD goes high during the delay time D1, so that potentials of the bit lines are reduced by the block write driver BWD. After a lapse of the delay time D1, the control signal WE'a goes high, the global write driver GD is enabled, data writing is carried out, and the potentials of the bit lines are changed in response to the written data.

In transition from the write cycle to a read cycle, the internal control signal WEd still maintains a high level also when the internal control signal WEa goes low. Therefore, rise of the output of the predecoder is delayed in this case, and rise of the potential of the selected word line is also delayed in response (rise of the potential of the word line is shown by a solid line in FIG. 43. Potential change of the word line and the output of the potential of the predecoder shown by broken lines indicate potential change in an ordinary read cycle).

When the time D2 elapses after the internal control signal WEa falls to a low level, a charging operation is executed by a bit line load circuit. At this time, the charging operation is carried out only by a bipolar transistor of the bit line load circuit. After a lapse of the time D4, the nonselection level VREF is changed and its potential level is reduced.

As to the delay times provided in the waveform diagram shown in FIG. 43, those by a logic gate circuit are neglected.

It is possible to implement an SRAM having sufficiently excellent write recovery by setting the delay times at proper levels as hereinabove described, without increasing the access time.

[Column Redundancy Circuit]

Figure 44:
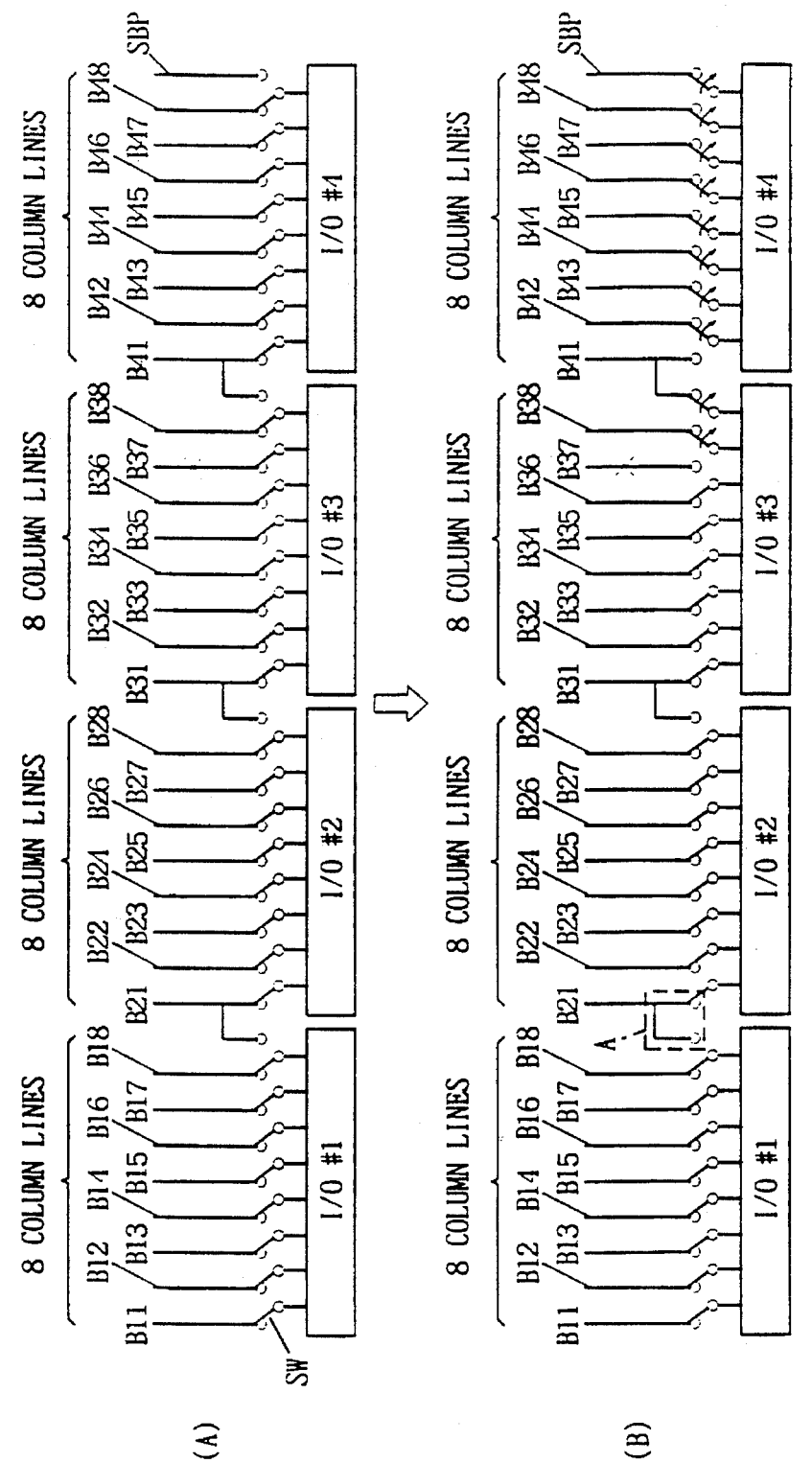
FIG. 44 conceptually illustrates a structure of column shift redundancy according to the present invention.

FIG. 44 illustrates a conceptual structure of a column shift redundancy circuit. Referring to FIG. 44, (A) shows a connection mode of the column shift redundancy circuit before repair of a defective bit, and (B) shows a connection mode of the column shift redundancy circuit after replacement of the defective bit.

Each memory block is provided with four I/O blocks for storing 4 bits of upper byte data and four I/O blocks for storing 4 bits of lower byte data. Each I/O block is provided with eight pairs of bit lines, i.e., eight column lines. Eight column lines are connected to a single I/O circuit (data input/output circuit) I/O #i (i=1 to 4). The data input/output circuit includes the local sense amplifier and the block write driver. Each of column lines B21, B31 and B41 which are present in boundaries between the I/O blocks is provided with a switch, to be connectable to two I/O circuits. One spare column line SBP is provided for the four I/O blocks.

It is assumed here that a defective bit is present in a column line B37 in the I/O block 3 (data input/output circuit I/O #3). In order to repair this defective bit, all contacts of the switches SW provided in correspondence to the column lines B37 to B48 are switched. Thus, the I/O block 3 includes the column lines B31 to B36, B38 and B41. The I/O block 4 (I/O #4) includes the column lines B42 to B48 and the spare column line SBP. Connection between the remaining column lines and the data input/output circuits remains unchanged. Thus, when a defective bit is present in an arbitrary position in four I/O blocks, it is possible to repair this defective bit by a single spare column line. Thus, utilization efficiency of the spare column line can be improved so that a defective column can be efficiently replaced without increasing the chip occupied area. Referring to (B) in FIG. 44, symbol A denotes a shift portion between the I/O blocks.

Figure 45:
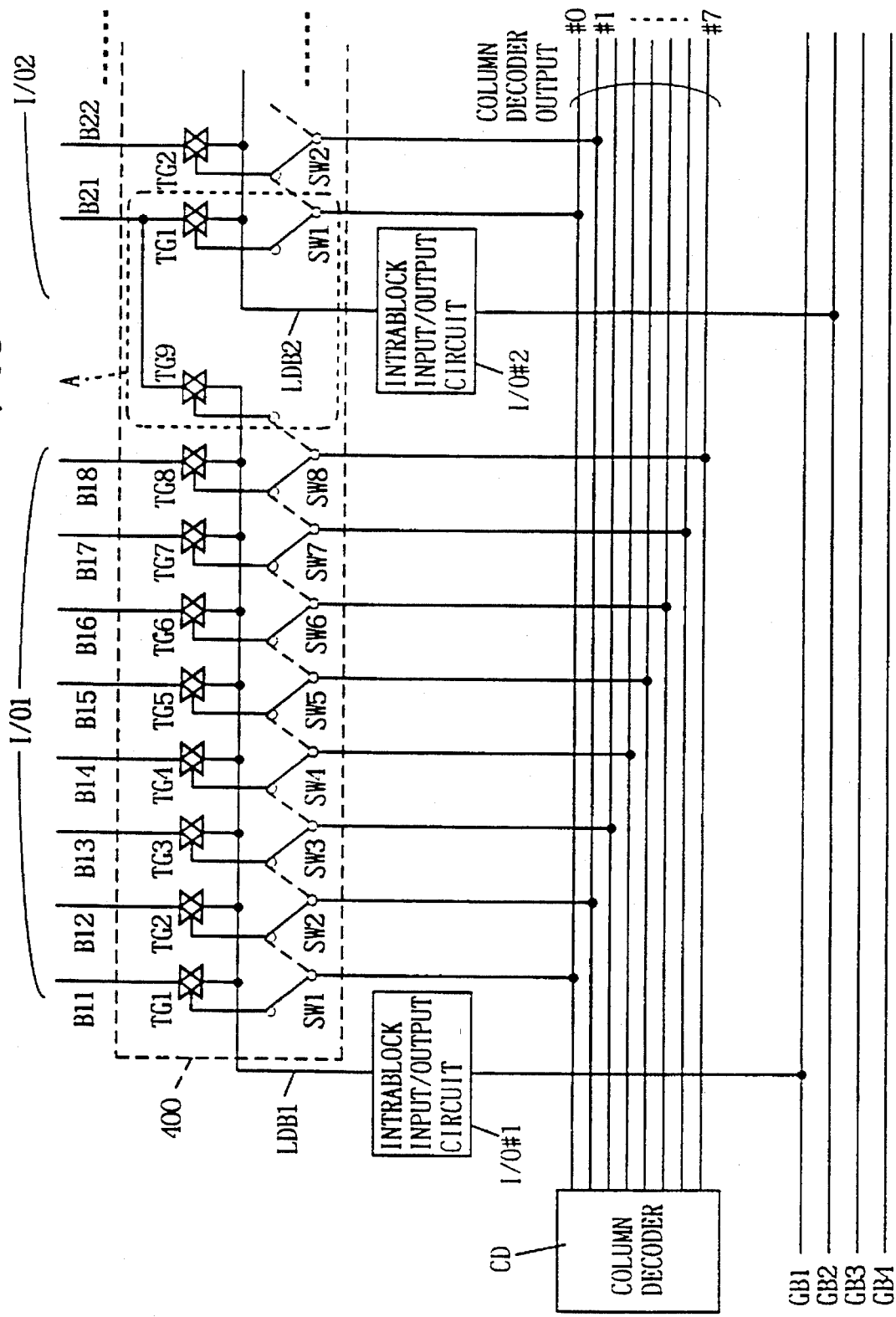
FIG. 45 specifically illustrates a structure of a column shift redundancy circuit according to the present invention.
Figure 46:
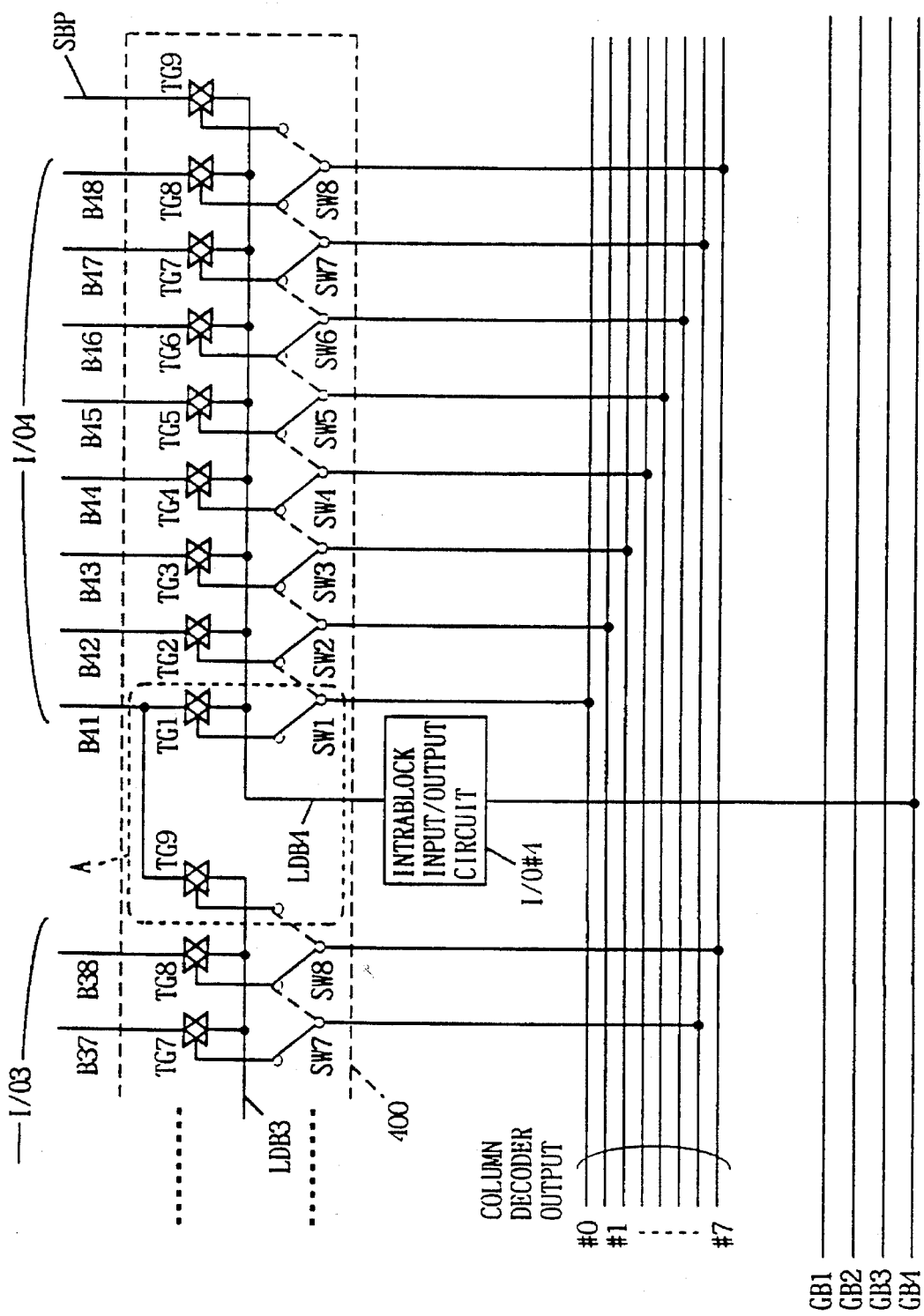
FIG. 46 specifically illustrates the structure of the column shift redundancy circuit according to the present invention.

FIGS. 45 and 46 illustrate the structure of the column shift redundancy circuit shown in FIG. 44 in more detail. FIG. 45 shows a boundary between I/O blocks I/O1 and I/O2, and FIG. 46 shows a boundary between the blocks I/O3 and I/O4. Referring to FIG. 45, a column decoder CD outputs column selection signals on eight column selection signal lines #0 to #7. Output signal lines of the column decoder CD are arranged in common for the four I/O blocks I/O1 to I/O4.

Intrablock input/output circuits I/O#1 to I/O#4 are provided for the I/O blocks I/O1 to I/O4 respectively. The intrablock input/output circuits I/O#1 to I/O#4 include the local sense amplifiers and the block write drivers respectively. These intrablock input/output circuits I/O#1 to I/O#4 transfer data between local data buses (including both of local read data buses and local write data buses) LDB1 to LDB4 and global data buses (including both of global read data buses and global write data buses) GB1 to GB4 provided in the corresponding memory blocks respectively.

A shift circuit 400 includes eight switches SW1 to SW8 provided for the respective memory blocks I/O (generically denoting I/O1 to I/O4), eight transfer gates TG1 to TG8 provided in correspondence to the respective column lines, and a transfer gate TG9 which is connected to a column line of an adjacent memory block. The switching circuits SW1 to SW8 receive and transmit the outputs #0 to #7 of the column decoder CD respectively to first control electrodes of adjacent pairs of transfer gates. Each switching circuit SWj (j=1 to 8) can transmit a column selection signal to a control electrode of one of two transfer gates TGj and TG(j+1).

The transfer gates TG1 to TG9 conduct when the column selection signals received through the switching circuits SW1 to SW8 are in active states, to connect the column lines to the local data bus LDB. Therefore, it is possible to change connection between the outputs of the column decoder CD and the column lines by switching the connection of these switching circuits SW1 to SW8. The transfer gates TG1 to TG8 are provided for column lines B1 to B8 (generically denoting S11 to S18, B21 to B28, B31 to B38 and B41 to B48), and the transfer gate TG9 is connected to a column line B1 (B21, B31 or B41) of the first column in the adjacent I/O block.

As shown in FIGS. 45 and 46, it is possible to provide the IO-to-IO shift region A for the first column lines B21, B31 and B41 of the I/O blocks for changing the I/O block to which the region belongs by the transfer gate TG9, thereby repairing a defective column in an arbitrary I/O block by a single spare column line SBP. In a method of repairing the defective column, all connection paths from the switch corresponding to the defective column to the switching circuit SW8 provided for the column line B48 of the I/O block I/O4 are switched when the connection state shown by solid lines in FIGS. 45 and 46 is established. When the column line B45 is defective in the I/O block 1/O4, for example, connection of the switches SW5 to SW8 is switched to the direction shown by broken lines shown in FIG. 46. Connection of the remaining switching circuits remains unchanged. Thus, no column selection signal is transmitted to the transfer gate TG5 of the column line B45, so than this defective column B45 is regularly brought into a nonselected state. The transfer gates TG1 to TG8 correspond to write and read gates.

Figure 47:
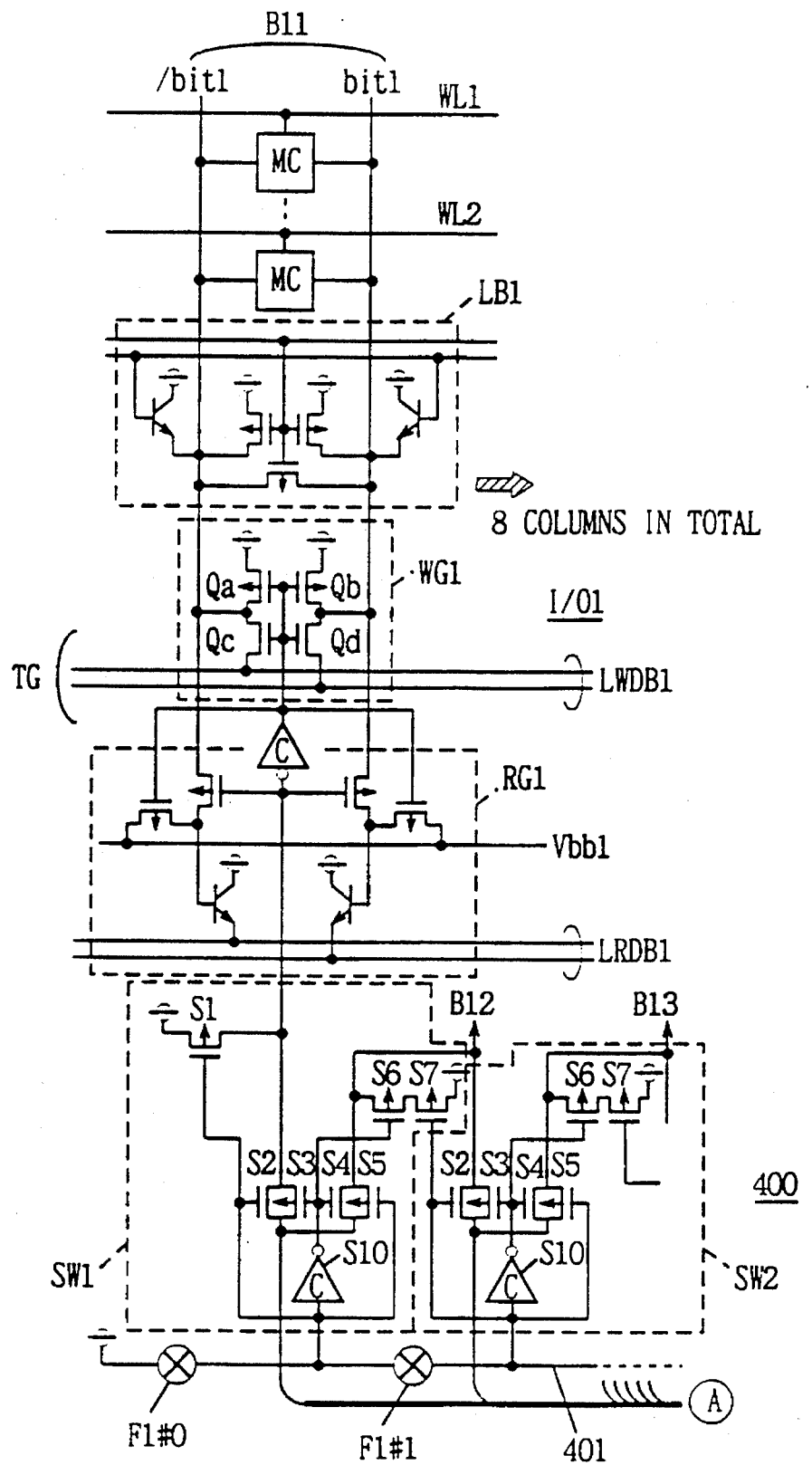
FIG. 47 illustrates the structure of the column shift redundancy circuit according to the present invention in more detail.
Figure 48:
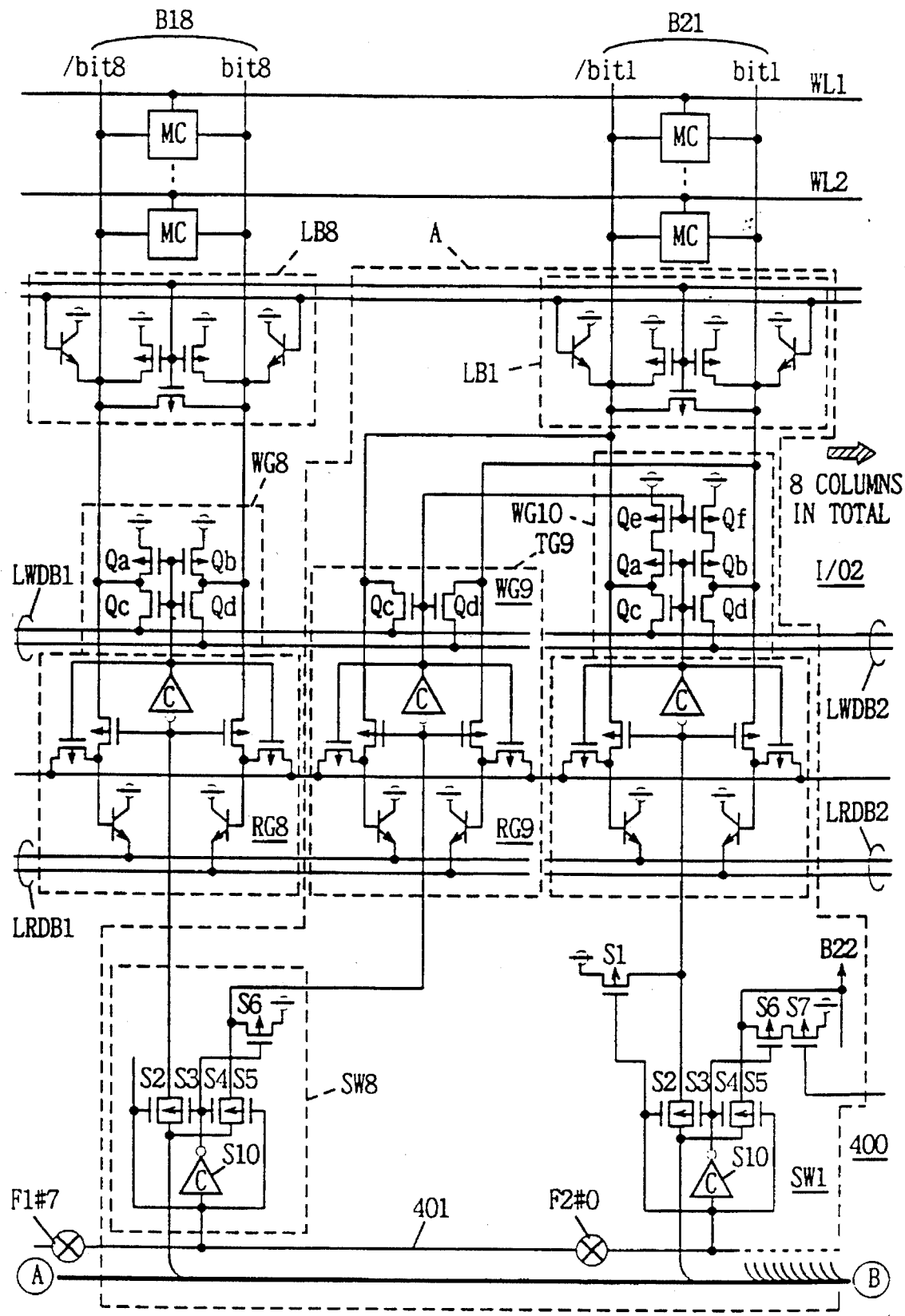
FIG. 48 illustrates the structure of the column shift redundancy circuit according to the present invention in more detail.
Figure 49:
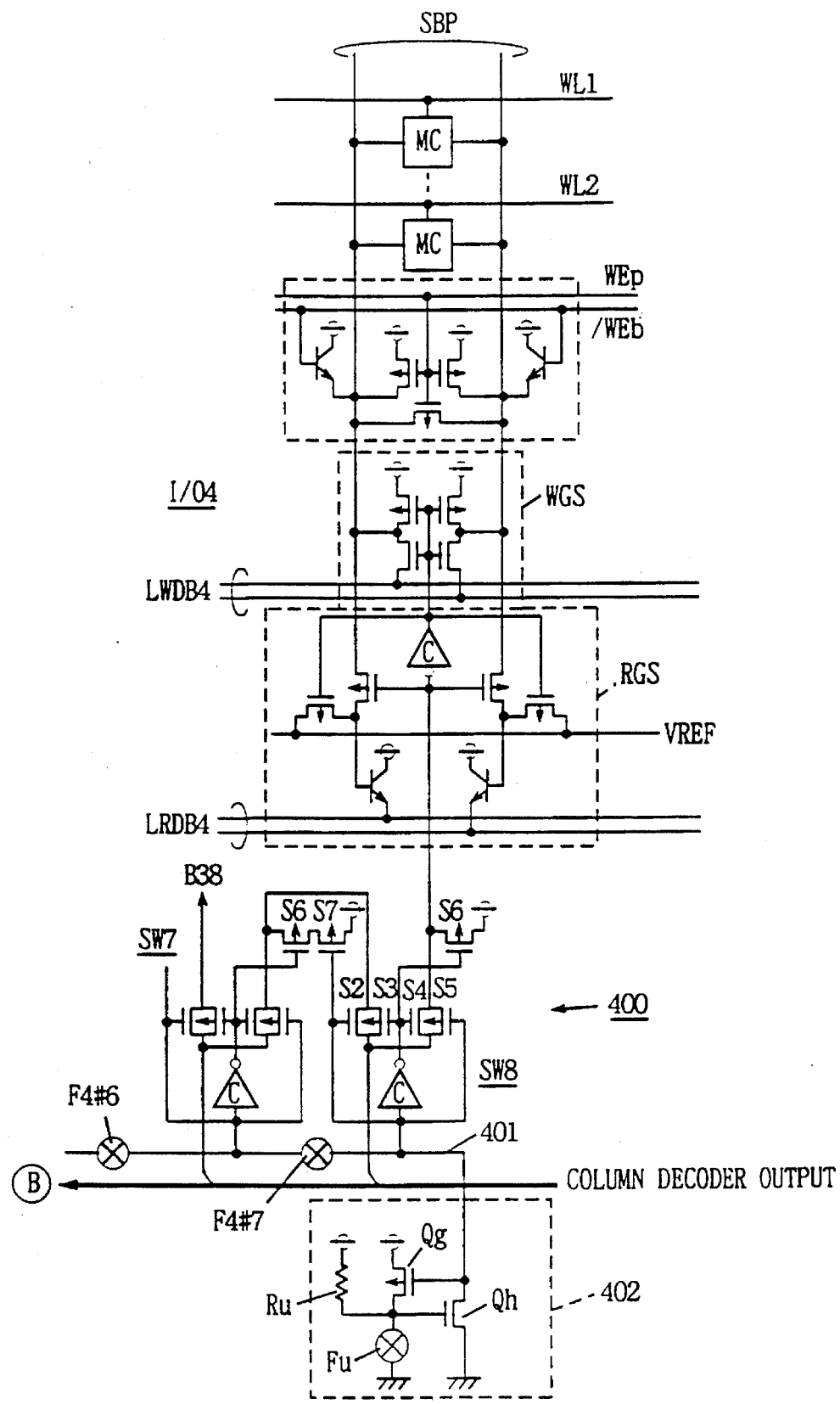
FIG. 49 illustrates the structure of the column shift redundancy circuit according to the present invention in more detail.

FIGS. 47 to 49 show the shift circuit appearing in FIGS. 45 and 46 in more detail. Referring to FIGS. 47 to 49, fuse elements F1#0 to F4#7 are provided in correspondence to the switching circuits SW1 to SW8 respectively. The fuse elements F1#0 to F4#7 are connected in series between a supply potential Vcc supply node and a redundancy use specifying circuit 402. Thus, a voltage supply path 401 is formed between the supply potential Vcc and the redundancy use specifying circuit 402 for defining connection modes of the respective switches.

Referring to FIG. 47, the switching circuit SW1 includes an n-channel MOS transistor S2 and a p-channel MOS transistor S3 which are connected in parallel with each other for transmitting the output #0 from the column decoder to the column line B11, and a p-channel MOS transistor S5 and an n-channel MOS transistor S4 which are connected in parallel with each other for transmitting the output #0 of the column decoder to the adjacent column line B12. The transistors S2 and S3 form a transmission gate, while the transistors S4 and S5 form another transmission gate. An inverter S10 inverts and supplies the supply potential through the fuse elements F1#1 and F1#0 and to gates of the transistors S3 and S4. Gates of the transistors S2 and S5 are supplied with the potential through the fuse elements F1#0 and F1#1.

The switching circuit SW1 further includes a p-channel MOS transistor S1 which receives the supply potential through the fuse elements F1#1 and F1#0 at its gate for setting a column selection line an the supply potential Vcc level, a p-channel MOS transistor S6 which conducts in response to an output of the inverter S10, and a p-channel MOS transistor S7 which is connected in series to the transistor S6 for receiving an input of an inverter S10 of the adjacent switching circuit SW2 at its gate and transmitting the supply potential Vcc. When both of the transistors S6 and S7 enter ON states, the potential of the selection line for the column line B12 is set at the supply potential Vcc level.

The switching circuits SW2 to SW7 (not shown) are identical in structure to the switching circuit SW1 except that no transistors S1 are provided. The switching circuit W8 is identical in structure to the switching circuit SW1, except chat no transistors S1 and S7 are provided.

Referring to FIG. 48, the transfer gate TG9 includes a write gale WG9 and a read gate RG9 in the IO-to-IO shift region A. The write gate WG9 and the read gate RG9 connect the column line B21 to a local write data bus LWDB1 and a local read data bus LRDB1 respectively. The write gate WG includes n-channel MOS transistors Qc and Qd which conduct in response to the column selection signal. The read gate RG9 is identical in structure to the read gates RG1 to RG8. These read gates RG1 to RG9 are identical in structure to the read gate described above with reference to FIG. 31. Each of the write gates WG1 to WG8 includes n-channel MOS transistors Qc and Qd which conduct in response to the column selection signal, and p-channel MOS transistors Qa and Qb which conduct in nonselection for charging bit lines, bit and /bit, to the supply potential Vcc level.

A write gate WG10 in the first column of the adjacent I/O block, i.e., in the column line B21, includes p-channel MOS transistors Qe and Qf which conduct in response to a control signal received in the transfer gate TG9, p-channel MOS transistors Qa and Qb which enter conducting states in nonselection in response to the column selection signal received from the first switching circuit SW1 of the I/O block I/O2, and n-channel MOS transistors Qc and Qd which conduct in response to the column selection signal for connecting the bit lines bit and /bit to the local write data-bus LWDB2.

The transistors Qe, Qa and Qc are connected in series between the supply potential Vcc and the local write data line, while the transistors Qf, Qb and Qd are connected in series to the other local write data line. In the write gate WG10, the p-channel MOS transistors Qe and Qa or Qf and Qb are connected in series to each other. In order to reliably charge the bit lines bit1 and /bit1 to the supply potential Vcc level in nonselection, the p-channel MOS transistors Qe, Qf, Qa and Qb are doubled in size as compared with the remaining p-channel MOS transistors, to be improved in current suppliability, so that these transistors which are connected in series are prevented from reduction of current suppliability due to doubled resistance values.

Referring to FIG. 49, the redundancy use specifying circuit 402 includes an n-channel MOS transistor Qh which is connected between the fuse element F4#7 and the ground potential, a high-resistance load Ru for supplying the supply voltage Vcc to a gate of the transistor Qh, a p-channel MOS transistor Qg for forming a latch circuit with the transistor Qh, and a fuse element Fu which is connected between the gate of the transistor Qh and the ground potential. The operation is now described.

When no defective bit is present, all fuse elements F1#0 to F4#7 are in conducting states. Also in the redundancy use specifying circuit 402, the fuse element Fu is in a conducting state. Thus, the potential of the transistor Qh reaches the ground potential level, so that the transistor Qh enters an OFF slate. Therefore, the supply potential on the voltage supply path 401 is at a high level of the supply voltage Vcc level. In this case, the output of the inverter S10 provided in the switching circuit goes low so that the transmission gate formed by the transistors S2 and S3 conducts and that formed by the transistors S4 and S5 enters an OFF slate. Further, the transistor S6 enters an ON state in accordance with a low-level signal from the inverter circuit S10, while the transistors S7 and S1 are in OFF states in response to the high-level potential on the voltage supply path 401. In this state, therefore, the outputs #0 to #7 from the column decoder CD are associated with the column lines B1 to B8 in the I/O blocks respectively (B1 to B8 generically denote the column lines B11 to B18, B21 to B28, B31 to B38 and B41 to B48 respectively).

Referring to FIG. 48, the output of the inverter circuit S10 is at a low level and the transistor S6 enters an ON state in the switching circuit SW8. In the write gate WG9, therefore, the transistors Qc and Qd are normally set in OFF states, so that the write gate WG9 regularly enters an OFF state. In the write gate WG10, further, the transistors Qe and Qf enter ON states so that the transistors Qa and Qb are turned on/off in response to selection/nonselection of the column line B21 to selectively execute a charging operation for the bit lines bit1 and /bit1.

It is assumed here that the column line B18 of the memory block I/O1 is defective. In this case, the fuse element F1#7 is cut and the fuse element Fu in the redundancy use specifying circuit 402 is blown off. The voltage supply path 401 between the fuse element F1#7 and the supply potential Vcc supply node is at a high voltage level, to maintain the aforementioned state. Since the fuse element Fu is blown off or cut off in the redundancy use specifying circuit 402, on the other hand, the potential of the gate of the transistor Qh is set at a high level of the supply potential Vcc level by the resistance Ru, so that the potential of this voltage supply path portion reaches the ground potential Vss level. The low-level potential of the voltage supply path is latched by the transistor Qg which enters an ON state.

When the voltage level of the voltage supply path 401 shown in FIG. 48 goes low, the output of the inverter circuit S10 of the switching circuit SW8 goes high and the transmission gate formed by the transistors S2 and S3 enters an OFF state while the transmission gate formed by the transistors S3 and S5 enters an ON state. Further, the transistor S6 enters an OFF state. Thus, the column line B18 receives no column selection signal, and is separated from the output of the column decoder. At this time, the transistors S6 and S7 enter ON states in the adjacent switching circuit SW7, and the potential of the column selection signal transmission line of the column line B18 is see at a high level of the supply potential Vcc level to be regularly in a nonselected state. Thus, the column line B21, which has transferred data with the local read data bus LRDB2 and the local write data bus LWDB2, transfers data with the local write data bus LWDB1 and the local read data bus LRDB1.

The read gate RG1 which is provided in the column line B21 regularly enters an OFF state since the transistors S2 and S3 are in OFF stakes and the transistor S1 enters an ON state in the switching circuit SW1. In the write gate WG10, the transistors Qc and Qd also regularly enter OFF states, while the transistors Qa and Qb regularly enter ON states. Thus, the column line B21 is charged through the transistors Qe and Qf in accordance with the column selection signal received through the read gate RG9 and the write gate WG9.

When the column line B18 is selected in this state, the column selection signal is supplied to the transfer gate TG9, the write gate WG9 and the read gate RG9 conduct and the column line B21 is connected to the local read data bus LRDB1 and the local write data bus LWDB1.

In the spare column line SBP shown in FIG. 49, the transistors S4 and S5 enter conducting states in the corresponding switching circuit SW8, and are connected with the local write data bus LWDB4 and the local read data bus LRDB4 through a read gate RGS and a write gate WGS in selection.

As hereinabove described, a spare column line is provided in common for a plurality of I/O blocks in a single memory block so that a defective column line of an arbitrary I/O block can be repaired by the spare column line, whereby utilization efficiency of the spare column line is improved so that the occupied area of the chip is not increased and the manufacturing cost can be reduced, while the access time is not retarded by the shift redundancy structure.

[Peripheral Circuits]

[Reference Voltage Generation Circuit of Sense Amplifier]

Figure 50:
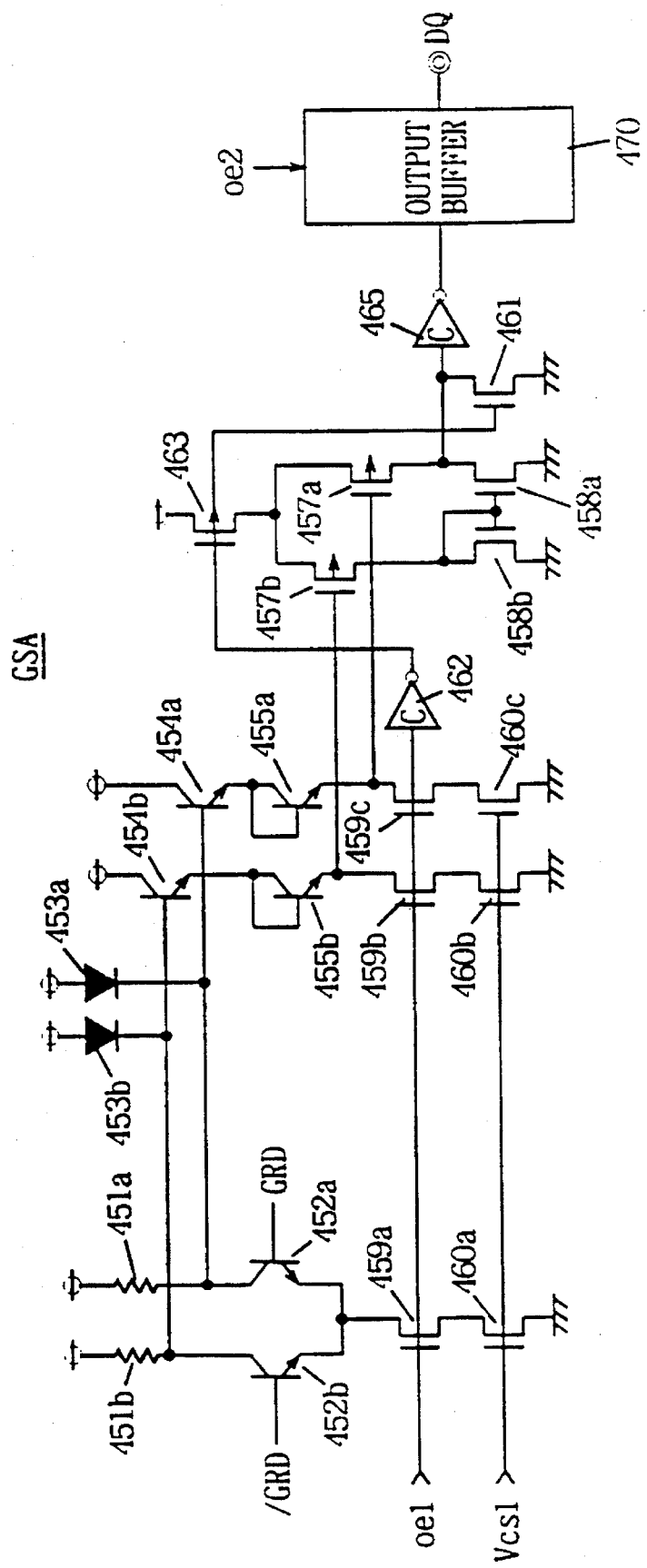
FIG. 50 specifically illustrates a structure of a main sense amplifier.

FIG. 50 illustrates exemplary structure of each main sense amplifier. Referring to FIG. 50, a main sense amplifier GSA includes npn bipolar transistors 452a and 452b whose bases are connected to local read data lines GRD and /GRD, load resistances 451a and 451b for supplying currents to the bipolar transistors 452a and 452b respectively, and diodes 453a and 453b for clamping collector potentials of the bipolar transistors 452a and 452b at prescribed potentials respectively. Emitters of the bipolar transistors 452a and 452b are connected in common.

The main (global) sense amplifier GSA further includes npn bipolar transistors 454a and 454b whose bases are connected to collectors of the bipolar transistors 452a and 452b, diode-connected npn bipolar transistors 455a and 455b for level-shifting emitter potentials of the bipolar transistors 454a and 454b only at prescribed potentials, p-channel MOS transistors 457a and 457b whose gates are connected to emitters of the bipolar transistors 455a and 455b, and n-channel MOS transistors 458a and 458b which are connected between the transistors 457a and 457b and the ground potential. The transistors 458a and 458b form a current mirror circuit.

The main sense amplifier GSA further includes n-channel MOS transistors 459a, 459b and 459c which conduct in response to an output enable signal oe1 for forming current paths for the bipolar transistors 452a, 452b, 455b and 455a respectively, an inverter circuit 462 which inverts the output enable signal oe1, a p-channel MOS transistor 463 which conducts in response to an output of the inverter circuit 462 for supplying currents to the transistors 457a and 457b, an inverter circuit 465 of a CMOS structure which inverts/amplifies a potential at a junction between the transistors 457a and 458a, and an n-channel MOS transistors 461 which conducts in response to the output of the inverter circuit 462 for pulling down an input of the inverter circuit 465.

n-channel MOS transistors 460a, 460b and 460c are provided between the transistors 459a, 459b and 459c and the ground potential Vss respectively for receiving a reference voltage Vcs1 and serving as constant current sources. The operation is now briefly described.

Consider that the potential of the read data line GRD is higher than that of the read data line /GRD. When the output enable signal oe1 goes high, an input differential amplifying stage (transistors 452b and 452a) and an output amplifying stage (transistors 457b, 457a, 458a and 458b) of this main sense amplifier enter operating states. Since the base potential of the bipolar transistor 452a is higher than that of the bipolar transistor 452b, the diode 453a supplies a current with that supplied from the resistance 451a, whereby the base potential of the bipolar transistor 454a is reduced. The base potential of the bipolar transistor 454b substantially remains unchanged since a discharge current of the bipolar transistor 452b is small. The base potentials of the bipolar transistors 454a and 454b are transmitted to the bipolar transistors 455a and 455b in an emitter-follower mode, and level-shifted by the transistors 455a and 455b. The amounts of level shifting are about base-to-emitter forward drop voltages Vbe of the bipolar transistors 455b and 455a.

Since the emitter potential of the bipolar transistor 455a is lower than that of the bipolar transistor 455b, the conductance of the p-channel MOS transistor 457b becomes smaller than that of the p-channel MOS transistor 457a. The transistors 458a and 458b form a current mirror circuit, so that a current which is identical to that flowing in the transistor 458b flows in the transistor 458a, if the transistors 458a and 458b are identical in size to each other. The current flowing in the transistor 458b is supplied through the transistor 457b. Therefore, a larger amount of current is supplied through the transistor 457a as compared with that flowing in the transistor 458a, whereby the potential at a drain node (output node) of the p-channel MOS transistor 457a is increased. The potential rise of the output node is inverted by the inverter circuit 465 and transmitted to the output buffer 470.

The transistor 461 provided in the output part enters an OFF state in response to the output enable signal oe1 in operation of the main (global) sense amplifier GSA. In no operation of the global sense amplifier GSA, i.e., when the output enable signal oe1 is at a low level of an inactive state, on the other hand, the transistor 461 enters an ON state and fixes its output node at a low level.

As hereinabove described, a constant current source is formed by n-channel MOS transistors in the global sense amplifier GSA shown in FIG. 50. The current supplied by the constant current source is decided by the reference voltage Vcs1. When the amounts of currents supplied by the constant current sources are different from each other, the transistors 457a and 458a supply different voltage amplitudes to the output node and hence no correct amplifying operation can be executed or no desired operating characteristics can be obtained (the bipolar transistors operate in saturated regions and no amplitude adjusting functions are provided by the diodes 453a and 453b, resulting in difference of operating characteristics). Thus, it is necessary to set the reference voltage Vcs1 at a correct value. This also applies to the local sense amplifiers shown in FIGS. 32 and 38. These utilize the reference voltages as constant current sources. A structure for correctly generating the reference voltage is now described.

Figure 51:
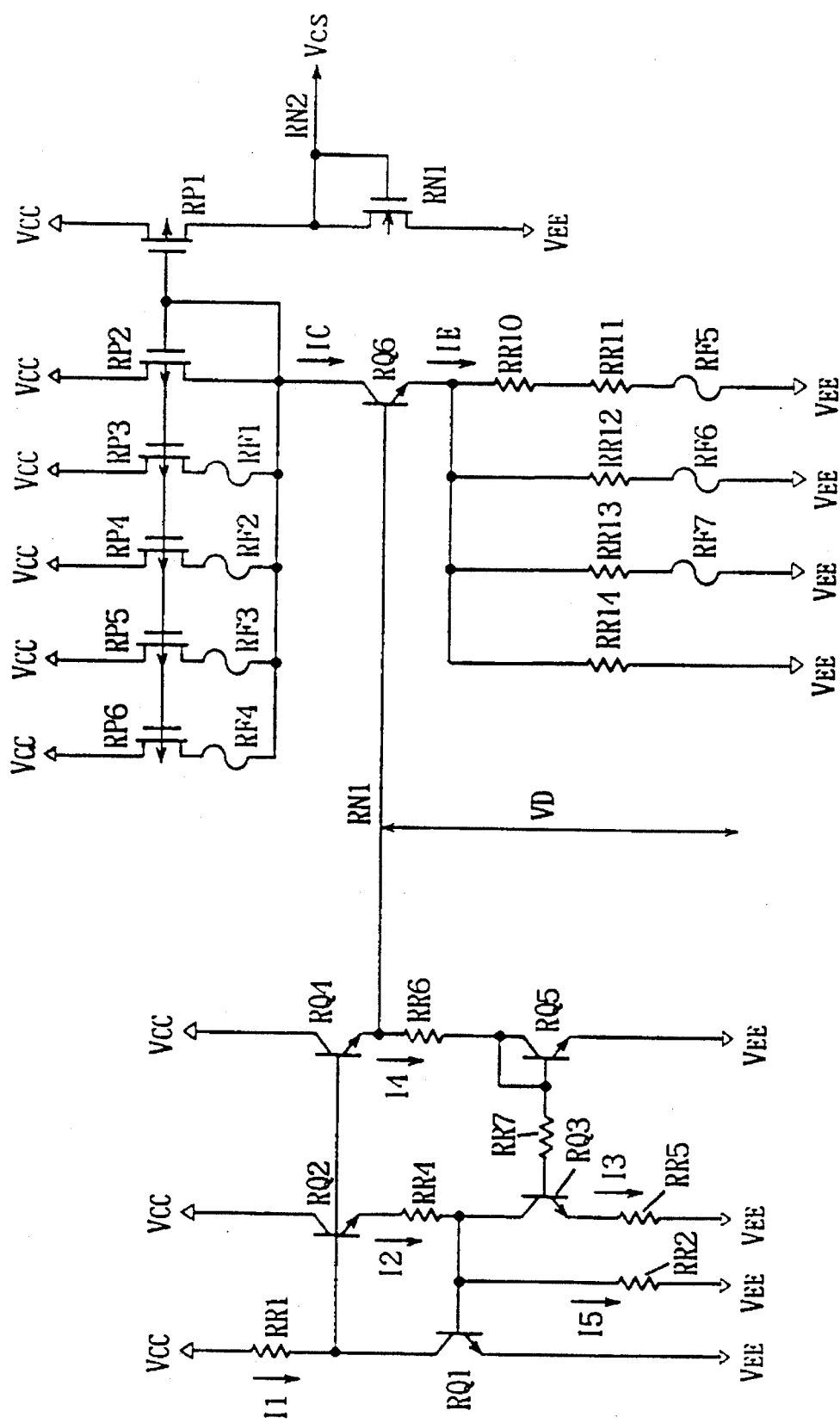
FIG. 51 illustrates a structure of a reference voltage generation circuit for generating a reference voltage employed for a local sense amplifier and a global sense amplifier.

FIG. 51 shows a structure of a reference voltage generation circuit according to the present invention. Referring to FIG. 51, the reference voltage generation circuit includes a constant voltage generation part which generates a constant voltage VD, and a reference voltage generation part which generates a reference voltage Vcs in accordance with the constant voltage VD from the constant voltage generation part.

The constant voltage generation part includes a resistance RR1 having one end connected to the supply voltage Vcc supply node, an npn bipolar transistor RQ1 having a collector connected to another end of the resistance RR1, an emitter connected to a supply potential VEE (ground potential Vss), and a base connected to the ground potential VEE through a resistance RR2, an npn bipolar transistor RQ2 having a collector connected to the supply potential Vcc, a base connected to the other end of the resistance RR1, and an emitter connected to one end of a resistance RR4, an npn bipolar transistor RQ3 having a collector connected to another end of the resistance RR4, an emitter connected to the ground potential VEE through a resistance RR5, and which is connected to one end of a resistance RR7, an npn bipolar transistor RQ4 having a collector connected to the supply potential Vcc, a base connected to the other end of the resistance RR1, and an emitter connected to an output node RN1 and one end of the RR4, and an npn bipolar transistor RQ5 having a collector and a base connected respectively to the other ends of the resistance RR6 and RR7 and an emitter connected to the ground potential VEE.

The reference voltage generation part includes p-channel MOS transistors RP2, RP3, RP4, RP5 and RP6 connected in parallel with each other, fuse elements RF1, RF2, RF3 and RF4 connected in series to the transistors RP3 to RP6 respectively, an npn bipolar transistor RQ6 having a base connected to the output node RN1 of the constant voltage generation part, and resistance RR10, RR11, RR12, RR13 and RR14 and fuse elements RF5, RF6 and RF7 connected between an emitter of the transistor RQ6 and the ground potential VEE.

The resistances RR10, RR11 and the fuse element RF5 are connected in series to each other and the resistance RR12 and the fuse element RF6 are connected in series to each other, while the resistance RR13 and the fuse element RF7 are connected in series to each other. The resistances RR14, RR13 and RR12 are connected in parallel with each other, and a series body of the resistances RR10 and RR11 is provided in series to the resistances RR12 to RR14. A collector of the transistor RQ6 is connected in common to the other ends of the fuse elements RF1 to RF4, and connected to a drain and a gate of the transistor RP2.

The reference voltage generation part further includes a p-channel MOS transistor RP1 having a gate connected to the gate of the transistor RP2, a source connected to the supply potential Vcc, and a drain connected to an output node RN2, and an n-channel MOS transistor RN1 having a gate and drain connected to the output node RN2, and a source connected to the ground potential VEE. The transistor RN1 serves as a resistive element by its ON resistance.

The operation of the constant voltage generation part is now described. It is assumed here that I1, I2, I3 and I4 represent currents flowing in the resistances RR1, RR4, RR5 and RR6 respectively, and VBE1 to VBE5 represent base-to-emitter voltages of the bipolar transistors RQ1 to RQ5 respectively. The bipolar transistors RQ1 to RQ5 have sufficiently large current amplification factors, so that base currents thereof can be neglected.

The voltage VD (voltage with respect to the ground potential VEE) appearing at the output node RN1 is expressed as follows:

$$VD = VBE5 + RR6 \cdot I4 \quad (1)$$

Resistance values of the resistances RR1 to RR6 are represented by RR1 to RR6 respectively.

On the other hand, potential difference between the supply potential Vcc and the ground potential VEE is provided by the sum of a voltage which is applied to the resistance RR1, the base-to-emitter voltage VBE2 of the bipolar transistor RQ2, a voltage which is applied to the resistance RR4, and the base-to-emitter voltage VBE1 of the bipolar transistor RQ1, as follows:

$$Vcc - VEE = I1 \cdot RR1 + VBE2 + I2 \cdot RR4 + VBE1 \quad (2)$$

The potential difference between the supply potential Vcc and the ground potential VEE is also that across the path through the resistance RR1, the bipolar transistor RQ4, the resistance RR6 and the bipolar transistor RQ5. Hence, the following equation is derived:

$$Vcc - VEE = I1 \cdot RR1 + VBE4 + I4 \cdot RR6 + VBE5 \quad (3)$$

From the equations (2) and (3), the following equation (4) is obtained:

$$I4 \cdot RR6 = VBE1 + VBE2 - VBE4 - VBE5 + I2 + R4 \quad (4)$$

Substitution of the equation (4) into the equation (1) gives:

$$VD = VBE1 + VBE2 - VBE4 + I2 \cdot RR4 \quad (5)$$

Further, a voltage which is applied to the resistance RR2 is equal to the base-no-emitter voltage VBE1 of the bipolar transistor RQ1. Hence, the following equation is obtained:

$$VBE1 = I5 \cdot RR2 \quad (6)$$

The base currents of the bipolar transistors RQ1 and RQ3 can be neglected, and hence the following equation is obtained:

$$I2 = I3 + I5 = I3 + (VBE1/RR2) \quad (7)$$

Substitution of the equation (7) into the equation (4) gives:

$$VD = VBE1 + VBE2 - VBE4 + RR4 \cdot (I3 + (VBE1/RR2)) \quad (8)$$

The base-to-emitter voltage VBE5 of the bipolar transistor RQ5 is provided by the sum of the base-to-emitter voltage VBE3 of the bipolar transistor RQ3 and the voltage which is applied across the resistance RR5. Hence, the following equation is obtained:

$$VBE5 = VBE3 + I3 \cdot RR5 \quad (9)$$

Transformation of the equation (9) gives:

$$I3 = (VBE5 - VBE3)/RR5 \quad (10)$$

Substitution of the equation (10) into (8) gives:

$$VD = VBE1 + VBE2 - VBE4 + RR4 \cdot (VBE1/RR2) + (VBE5 - VBE3)/RR5 \quad (11)$$

As understood from the equation (11), the voltage VD appearing at the output node RN1 is decided by the base-to-emitter voltages of the bipolar transistors and the resistance values. While currents are varied with the supply voltage Vcc and the ground potential VEE, the base-to-emitter voltages VBE are extremely slightly changed following the currents and can be neglected. Thus, it is understood from the equation (11) that a constant voltage is outputted from the output node RN1 regardless of fluctuation of the supply voltage Vcc. Qualitative description of the operation of this constant voltage generation circuit is as follows:

When the current I1 is increased, the base potentials of the bipolar transistors RQ2 and RQ4 are reduced and the currents I2 and I4 are reduced. Thus, the current I5 is also reduced, and the base potential of the bipolar transistor RQ1 is reduced by the resistance RR2 to reduce the current I1. Thus, the base potentials of the bipolar transistors RQ2 and RQ4 are increased. Namely, the resistance RR2 has a function of regularly maintaining the potential of the bipolar transistor RQ1 at the base-to-emitter voltage VBE1, for making the current I1 flowing in the resistance RR1 constant.

Thus, constant currents I2 and I4 regularly flow so that a constant voltage appears at the output node RN1. The resistance RR7 has a function of preventing the bipolar transistor RQ7 from fluctuation of operating characteristics caused by transmission of fluctuation in the base potential, i.e., the collector potential of the bipolar transistor RQ5.

The operation of the reference voltage generation part is now described. The resistances RR10 to RR14 form emitter resistance of the bipolar transistor RQ6. An emitter potential of the bipolar transistor RQ6 is provided by VD–VBE6, where VBE6 represents the base-to-emitter voltage of the bipolar transistor RQ6. Combined resistance RZ of the resistances RR10 to RR14 is provided by:

$$1/RZ=(1/RR14)+(1/RR13)+(1/RR12)+(1/RR10+RR11)$$

An emitter current IE of the bipolar transistor RQ6 is expressed as follows:

$$IE=(VD-VBE6)/RZ$$

The emitter current IE is increased when the combined resistance RZ is reduced. Assuming the base current of the bipolar transistor RQ6 is negligible, a collector current IC of the bipolar transistor RQ6 is substantially equal to the emitter current IE.

The transistor RP1 and the transistors RP2 to RP6 form a current mirror circuit. When the collector current IC of the bipolar transistor RP6 is increased, therefore, a current flowing in the transistor RP1 is increased and the reference voltage Vcs appearing at the output node RN2 is increased in level. When the emitter current IE is reduced, therefore, the reference voltage Vcs is reduced. The combined resistance RZ is minimized when all fuse elements RF5 to RF7 are in conducting states. When the fuse elements RF5 to RF7 are blown off, the combined resistance RZ is increased to reduce the reference voltage Vcs.

The base potential of the transistor RP1 is identical to those of the transistors RP2 to RP6. The current flowing in the bipolar transistor RQ6 is supplied by the transistors RP2 to RP6. Assuming that Im2 to Im6 represent currents which are supplied by the transistors RP2 to RP6 respectively, the collector current IC of the bipolar transistor RQ6 is expressed as follows:

$$IC=Im2+Im3+\ldots+Im6$$

Since the collector current IC of the bipolar transistor RQ6 is constant (on the assumption that the constant voltage Vcs is constant and the combined resistance RZ is fixed), a current corresponding to the currents which are independently supplied by the transistors RP2 to RP6 flows in the transistor RP1. Assuming that the transistors RP1 to RP6 are identical in size to each other for the purpose of simplification, the collector current IC is expressed as follows:

$$IC=n\cdot Im$$

Hence, a current IC/n flows in the transistor RP1, where n represents the number of transistors which are capable of supplying currents among the transistors RP2 to RP6. When any of the fuse elements RF1 to RF4 is blown off, the number n of the transistors which are capable of supplying currents is reduced and the current flowing in the transistor RP1 is increased. In other words, the reference voltage Vcs is increased.

As hereinabove described, the reference voltage Vcs is increased when the fuse elements RF1 to RF4 are blown off, while the reference voltage Vcs is reduced when the fuse elements RF5 to RF7 are blown off. Thus, it is possible to obtain the optimum reference voltage by blowing off the fuse elements RF1 to RF7 by laser blow.

Figure 52:
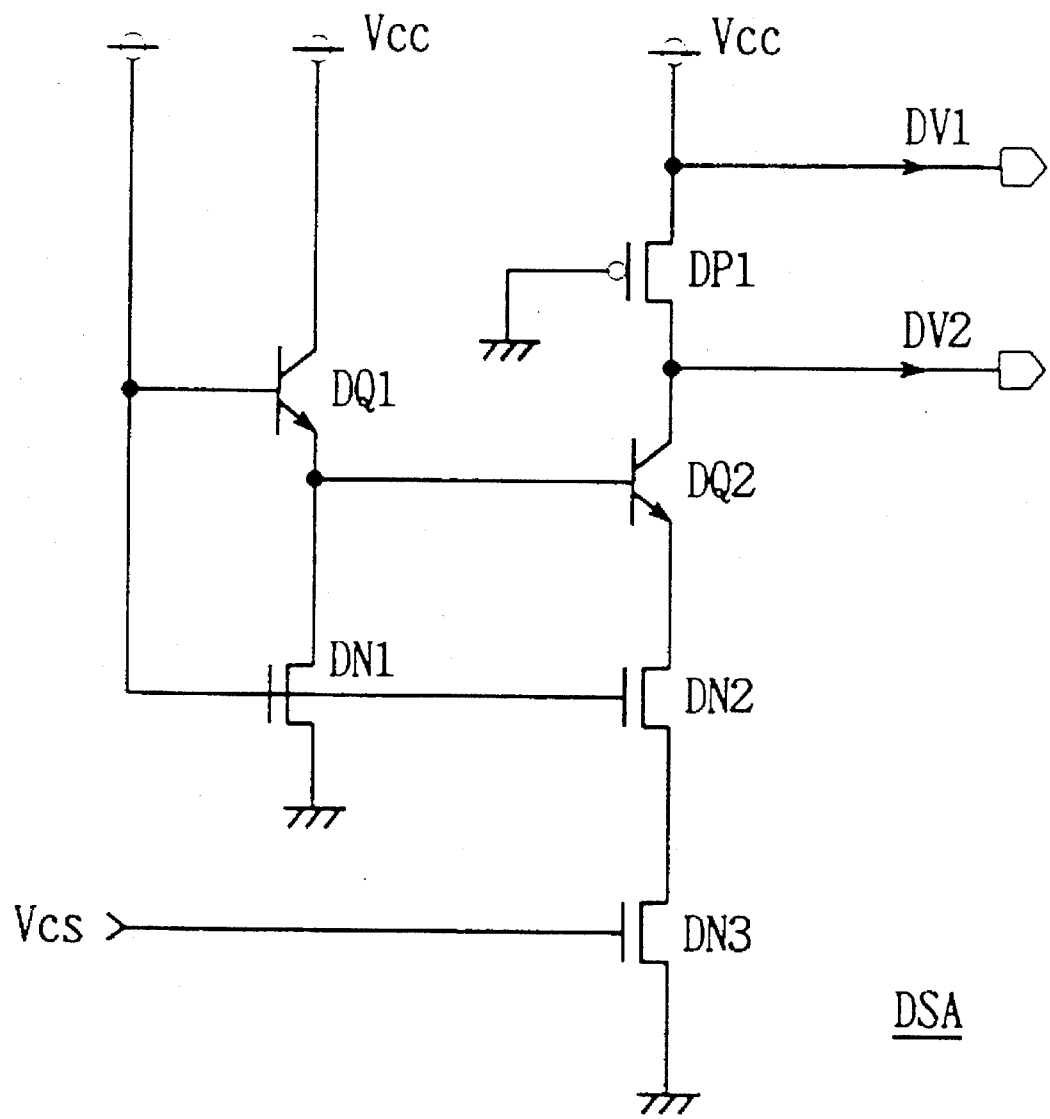
FIG. 52 illustrates a structure of a dummy sense amplifier for monitoring the reference voltage.

FIG. 52 illustrates a structure of a dummy sense amplifier. This dummy sense amplifier comprises a structure of a differential input stage of a global or local sense amplifier. This dummy sense amplifier is so employed as to monitor whether or not the reference voltage is set at a prescribed voltage level in the exterior. Referring to FIG. 52, the dummy sense amplifier DSA includes an npn bipolar transistor DQ1 having a base and collector connected to the supply potential Vcc, an n-channel MOS transistor DN1 having one conduction terminal connected to the emitter of the bipolar transistor DQ1, another conduction terminal connected to the ground potential Vss, and a gate connected to the supply potential Vcc, a p-channel MOS transistor DP1 having one conduction terminal connected to the supply potential Vcc and a monitoring bonding pad DV1, another conduction terminal connected to a monitoring bonding pad DV2, and a gate connected no the ground potential Vss, an npn bipolar transistor DQ2 having a collector connected to the another conduction terminal of the transistor DP1, and a base connected to the emitter of the bipolar transistor DQ1, an n-channel MOS transistor DN2 having one conduction terminal connected to the emitter of the bipolar transistor DQ2 and a base receiving the supply potential Vcc, and an n-channel MOS transistor DN3 having one conduction terminal connected to the other conduction terminal of the transistor DN2, another conduction terminal connected to the ground potential Vss, and a gate receiving the reference voltage Vcs. The transistor DP1 serves as a resistive element, for generating a voltage in accordance with currents flowing in the transistors DQ2, DN2 and DN3.

The bipolar transistor DQ1 and the MOS transistor DN1 are identical in structure to a bipolar transistor which transmits a data signal in an emitter-follower mode and a transistor for setting the level of an emitter potential of this bipolar transistor. The transistors DQ2, DN2 and DN3 form an input part of the differential amplifying stage. When the transistor DN3 conducts in accordance with the reference voltage Vcs to supply a constant current, therefore, this constant current is converted to a voltage by the MOS transistor D1 serving as a resistance. The voltage which is generated by the transistor DP1 is transmitted to the monitoring pads DV1 and DV2, so that the generated voltage can be monitored in the exterior. Thus, it is possible to set the optimum reference voltage according to element parameters of the local or global (main) sense amplifier even if manufacturing parameters are varied. Therefore, it is possible to correctly set a voltage amplitude regularly generated in the main or local sense amplifier at a desired value.

Figure 53:
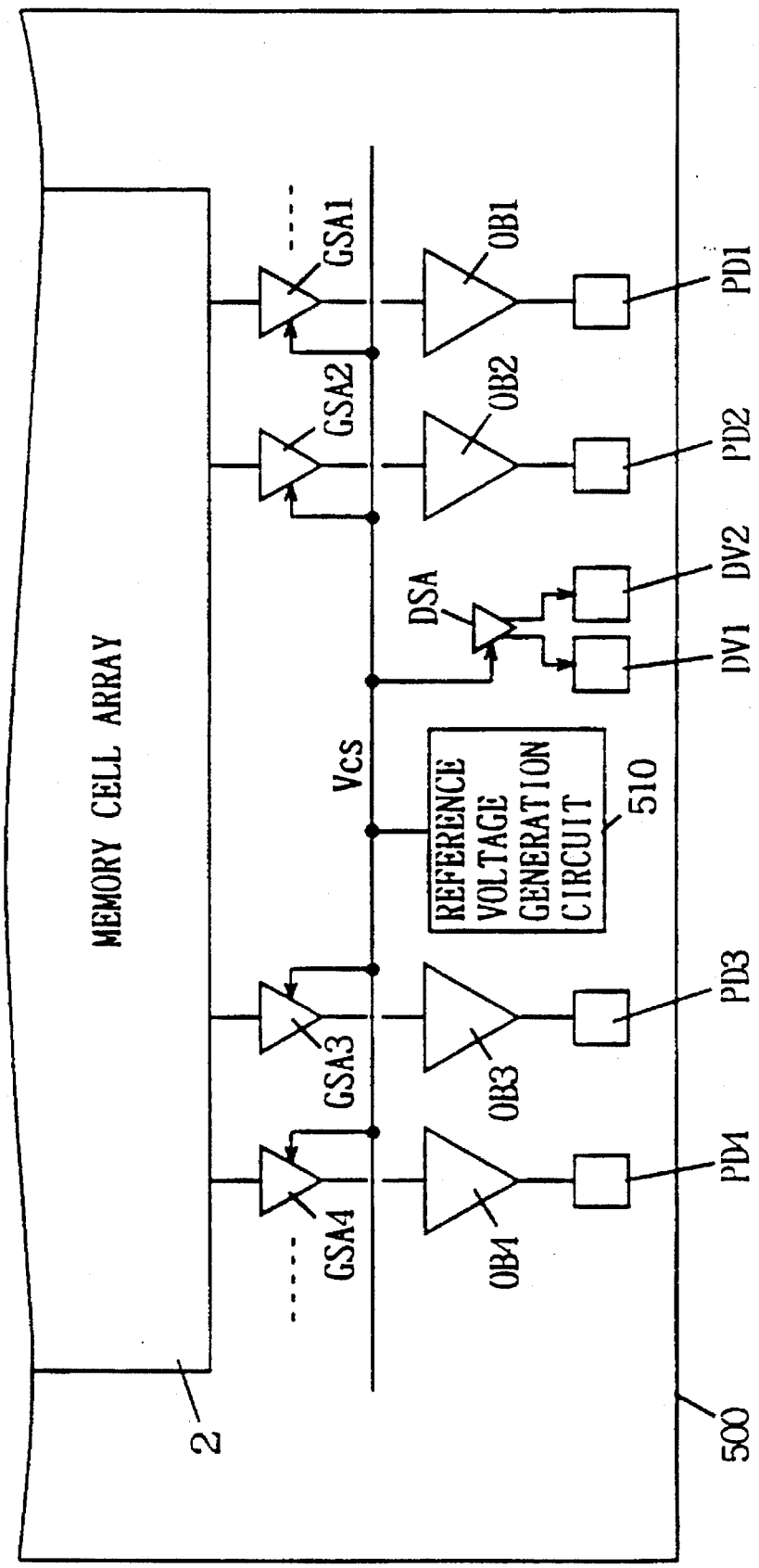
FIG. 53 illustrates a layout of the local and global sense amplifiers and the dummy sense amplifier on a chip.

FIG. 53 illustrates arrangement of the dummy sense amplifier and the reference voltage generation circuit on the chip. Referring to FIG. 53, global sense amplifiers GSA1 to GSA4 are arranged along an outer periphery of a memory cell array. These global sense amplifiers GSA1 to GSA4 are supplied with the reference voltage Vcs from a reference voltage generation circuit 510. Output buffers OB1 to OB4 are arranged in correspondence to the global sense amplifiers GSA1 to GSA4 respectively. Output parts of the output buffers OB1 to OB4 are connected to data output bonding pads PD1 no PD4 respectively. The pads PD1 to PD4 are arranged along an outer periphery of a chip 500. The reference voltage generation circuit 510 is arranged between the output buffers OB2 and OB3. A dummy sense amplifier DSA is arranged between the reference voltage generation circuit 510 and the output buffer OB2. This dummy sense amplifier DSA receives the reference voltage Vcs from the reference voltage generation circuit 510. An output of the dummy sense amplifier DSA is transmitted to the monitoring bonding pads DV1 and DV2.

A step of adjusting the reference voltage Vcs which is generated from the reference voltage generation circuit 510 is included in a step (laser trimming) of testing and determining necessity/unnecessity for employment of the redundancy circuit after completion of a wafer process. The dummy sense amplifier DSA is driven to monitor a voltage currently appearing between the monitoring bonding pads DV1 and DV2 in the exterior. A determination is made as to whether or not the output voltage level appearing between the bonding pads DV1 and DV2 is an actually required one. When the output voltage level is erroneous, proper combination of the fuse elements RF1 to RF7 is cut off to adjust the output voltage level of the dummy sense amplifier DSA. Thus, it is possible to correctly set the required reference voltage at a desired value even if manufacturing parameters are varied.

In the arrangement shown in FIG. 53, only the global sense amplifiers are supplied with the reference voltage Vcs from the reference voltage generation circuit 510. A plurality of local sense amplifiers are provided in correspondence to each of the global sense amplifiers GSA1 to GSA4. These local sense amplifiers are also supplied with the reference voltage Vcs from the reference voltage generation circuit 510. Also in this case, the dummy sense amplifier DSA is identical in structure to that of an input stage of each local sense amplifier, whereby it is possible to implement a local sense amplifier having desired signal amplification characteristics.

[Output Buffer]

Figure 54:
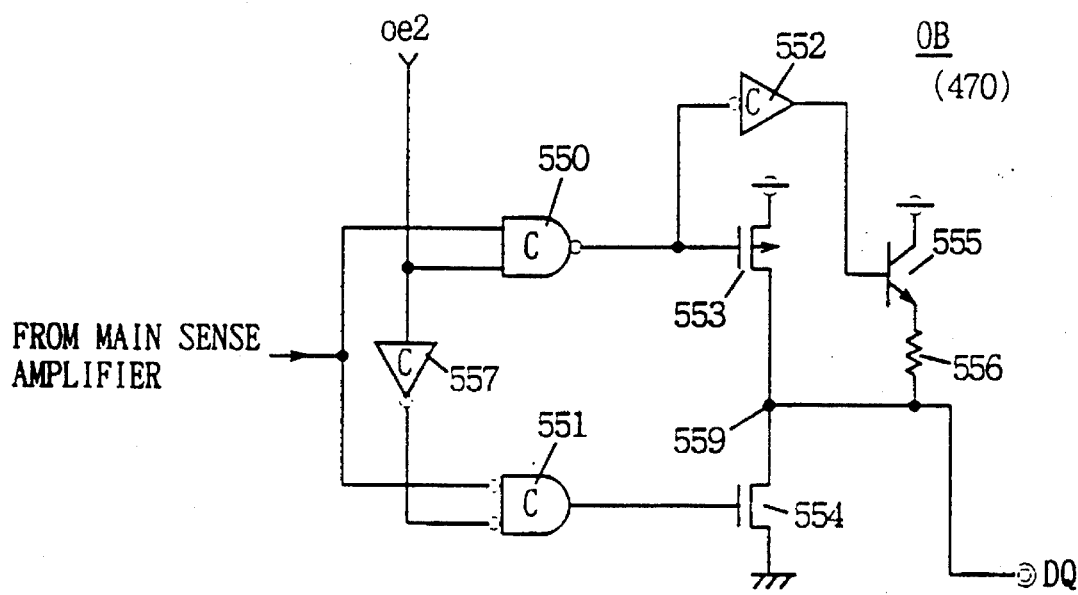
FIG. 54 illustrates a structure of an output buffer.

FIG. 54 illustrates an exemplary structure of each output buffer. Referring to FIG. 54, the output buffer 0B (or 470; see FIG. 50) includes a two-input NAND circuit 550 which receives internal read data from the main sense amplifier and an output enable signal oe2, a two-input NOR circuit 551 which receives the internal read signal from the main sense amplifier and the output enable signal oe2 which is supplied through an inverter circuit 557, a p-channel MOS transistor 553 which conducts in response to an output of the NAND circuit 551 to charge an output node 559 at the supply potential Vcc level, and an n-channel MOS transistor 554 which conduces in response to an output of the NOR circuit 551 to discharge the output node 559 to the ground potential level. The output node 559 is connected to the data input terminal DQ.

The output buffer OB (or 470) further includes an inverter circuit 552 which receives an output of the NAND circuit 550, an npn bipolar transistor 555 which conducts in response to an output of the inverter circuit 552, and a resistance 556 which is provided between the output node 559 and an emitter of the bipolar transistor 555. The resistance 556 is adapted to prevent a reverse-biased state across the base and the emitter of the bipolar transistor 555. The operation is now briefly described.

When the output enable signal oe2 is at a low level of an inactive state, the output of the NAND circuit 550 goes low and the transistor 553 and the bipolar transistor 555 enter OFF states. Further, the output of the NOR circuit 551 which receives a high-level signal through the inverter circuit 557 goes low and the transistor 554 enters an OFF state. Thus, the output node 559 enters a high impedance state. When the output enable signal oe2 goes high, on the other hand, the NAND circuit 550 and the NOR circuit 551 are brought into enabled state, to invert and output read data transmitted from the main sense amplifier.

When a signal outputted from the main sense amplifier is at a high level, the outputs of the NAND circuit 550 and the NOR circuit 551 go low while the transistor 553 enters an ON slate and the transistor 554 enters an OFF state. At this time, the bipolar transistor 555 enters an ON state by an output of the inverter circuit 552. The bipolar transistor 555 raises the output node 559, i.e., the data output terminal DQ, to a high level. When the bipolar transistor 555 completes its charging operation, the p-channel MOS transistor 553 charges the output node 559 and the data output terminal DQ to the supply potential Vcc level. It is possible to output a high-level signal at a high speed by driving the data output terminal DQ through the bipolar transistor 555.

When a signal read from the main sense amplifier is at a low level, the transistor 554 enters an ON state, the transistor 553 enters an OFF state and the bipolar transistor 55 enters an OFF state. In this case, the data input/output terminal DQ is discharged to the ground potential level by the transistor 554.

Figure 55:
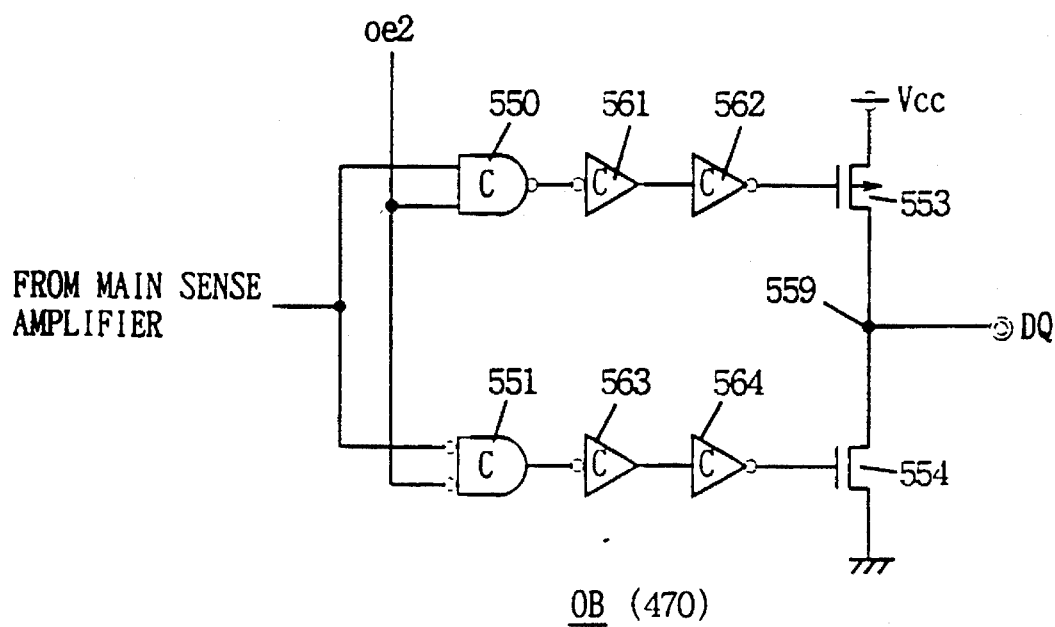
FIG. 55 illustrates another structure of an output buffer.

FIG. 55 illustrates another exemplary structure of the output buffer. Referring to FIG. 55, the output buffer OB (or 470) includes two stages of cascade-connected inverter circuits 561 and 562 between a NAND circuit 550 and a gate of a p-channel MOS transistor 553, and two stages of inverter circuits 563 and 564 which are provided between a NOR circuit 551 and a gate of an n-channel MOS transistor 554. The output buffer shown in FIG. 55 is provided with no output pullup bipolar transistor, dissimilarly to the output buffer shown in FIG. 54. In other words, the output buffer shown in FIG. 54 has a BiNMOS structure, while that shown in FIG. 55 has a CMOS structure.

The operation of the output buffer OB (or 470) shown in FIG. 55 is identical to that of the output buffer shown in FIG. 54, except the output pullup operation by the bipolar transistor 555. In the output buffer shown in FIG. 55, the output transistors 553 and 554 are driven at a high speed by the two stages of cascade-connected inverters, whereby a data input/output terminal DQ can be driven at a high speed.

Figure 56:
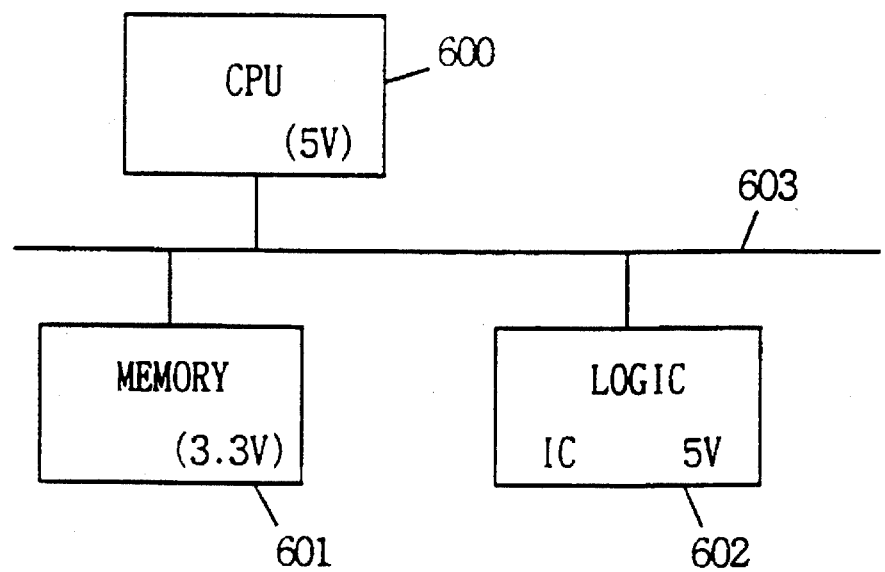
FIG. 56 illustrates an exemplary structure of a data processing system employing the SRAM according to the present invention.

FIG. 56 illustrates an exemplary structure of a data processing system employing a memory. Referring to FIG. 56, the data processing system includes a central processing unit (CPU) 600, a memory 601 which is an SRAM, for example, and a logic IC 602 which carries out necessary logic processing. The CPU 600, the memory 601 and the logic IC 602 are interconnected with each other through a data bus 603. Operating supply voltages of the CPU 600 and the logic IC 602 are 5 V, and that of the memory 601 is 3.3 V. In order to directly connect an output terminal of the memory 60t to the data bus 603, it is necessary to provide a protective function in a data output part of the memory 601. Since the data bus 603 has 5 V signals and a 3.3 V signal in a mixed state, it is necessary to ensure reliability of components forming an output buffer of the memory 601 even if a voltage exceeding the rated voltage (Vcc) of the memory 601 such as a search for the 5 V signal or an overshoot is applied to the output terminal of the memory 601.

Figure 57:
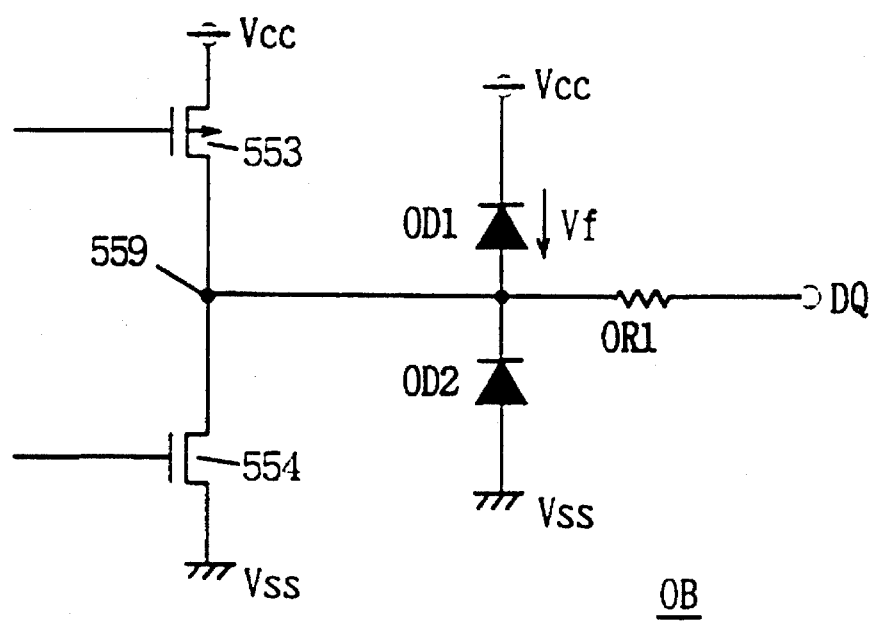
FIG. 57 illustrates a structure of a data output part of the output buffer according to the present invention.

FIG. 57 illustrates a structure of an output stage of an improved output buffer. Referring to FIG. 57, the output buffer OB includes a diode OD1 which is connected between an output node 559 and a supply voltage supply node Vcc in a forward direction from the output node 559, a diode OD2 which is connected between the output node 559 and a ground potential Vss in a reverse direction from the output node 559, and a resistive element OR1 which is provided between the output node 559 and a data output terminal DQ. The diodes OD1 and OD2 are formed by bipolar transistors which are prepared by a BiCMOS process, for example, while the resistance is formed by a polysilicon wiring layer, for example. Thus, the protective diodes OD1 and OD2 and the protective resistance OR1 are formed as independent elements, whereby it is possible to reliably relax voltages which are applied to MOS transistors 553 and 554, as compared with a structure of employing a parasitic diode which is present between a source/drain of an output MOS transistor and a substrate. The operation is now described.

When a high voltage exceeding the rated voltage Vcc is applied to the data input/output terminal DQ, a current is first limited by the protective resistance OR1, and then the diode OD1 transmits the current to the supply potential supply node, so that the potential of the output node 559 is clamped at Vcc+Vf, where Vf represents a forward drop voltage of the diode OD1 and Vf<<Vcc in general. Thus, it is possible to prevent application of a high voltage across drains and gates of the MOS transistors 553 and 554 of the output stage, thereby ensuring reliability of a gate oxide film. When an undershoot takes place at the data input/output terminal DQ, on the other hand, the diode OD2 conducts so that a current by the undershoot is extracted toward the ground potential Vss. Thus, the potential of the output node 559 is clamped at Vss−Vf. It is assumed here that the forward drop voltage of the diode OD2 is identical to that of the diode OD1.

It is possible to prevent a backward current to the supply voltage supply node caused by a high voltage by providing the protective resistance OR1, thereby stably holding the potential on an internal operating power supply line at a constant value and reliably ensuring reliability of the internal components.

Figure 58:
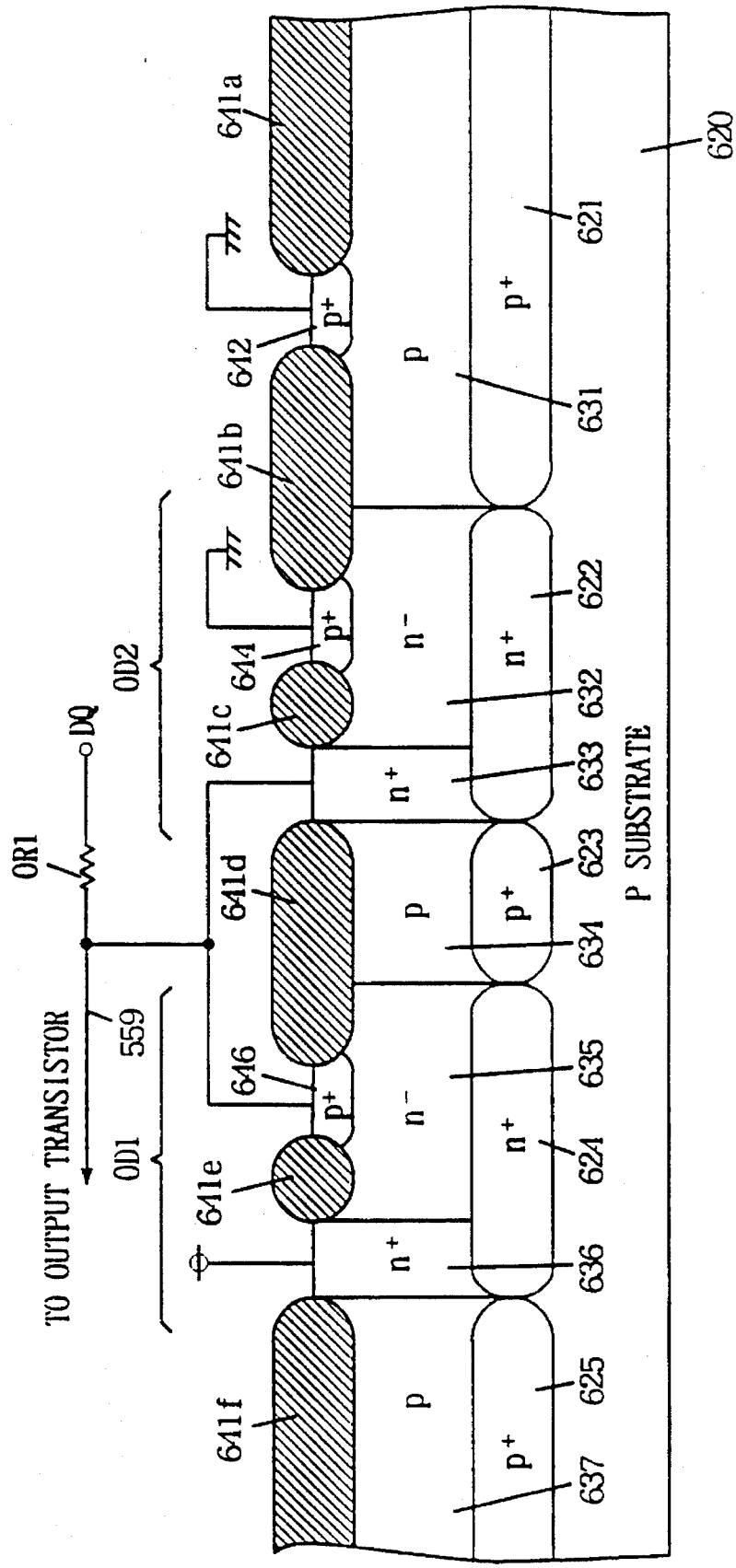
FIG. 58 is a sectional view showing structures of protective diodes shown in FIG. 57.

FIG. 58 illustrates sectional structures of the protective resistance and the protective diodes shown in FIG. 57. Referring to FIG. 58, $p^+$-type buried layers 621, 623 and 625 and $n^+$-type buried layers 622 and 624 are formed on a p-type semiconductor substrate 620. These $p^+$-type and $n^+$-type buried layers are alternately formed to be adjacent to each other. These buried layers are formed in the same process as collector buried layers for reducing collector resistance in a bipolar transistor.

A p-type layer 631 is formed on the $p^+$-type buried layer 621 and an $n^-$-type layer 632 and an $n^+$-type layer 633 are formed on the $n^+$-type buried layer 622, while a p-type layer 634 is formed on the $p^+$-type buried layer 623, an $n^-$-type layer 635 and an $n^+$-type layer 636 are formed on the $n^+$-type buried layer 624 and a p-type layer 637 is formed on the $p^+$-type buried layer 625.

A $p^+$-type layer 642 is formed on the p-type layer 631, a $p^+$-type layer 644 is formed on the $n^-$-type layer 632, and a $p^+$-type layer 646 is formed on the $n^-$-type layer 635. An element isolation insulating film 641a is formed on the surface of the p-type layer 631, to be adjacent to the $p^+$-type layer 642. The $p^+$-type layers 642 and 644 are isolated from each other by an element isolation insulating film 641b. The $p^+$-type layer 644 is isolated from the $n^+$-type layer 633 by an element isolation insulating film 641c. The $p^+$-type layer 646 is isolated from the p-type layer 634 by an element isolation insulating film 641d. The $n^+$-type layer 636 is isolated from the $p^+$-type layer 646 by an element isolation insulating film 641e. An element isolation insulating film 641f is formed on the surface of the p-type layer 637.

The $p^+$-type layer 644 is connected to receive the ground potential level, while the $n^+$-type layer 633 is connected to the output node 599 and the protective resistance OR1. The protective diode OD2 is implemented by the $p^+$-type layer 644, the $p^-$-type layer 632 and the $n^+$-type layer 633.

The $p^+$-type layer 646 is connected to the output node 559 and the protective resistance OR1, and the $n^+$-type layer 636 is connected to receive the supply potential Vcc. The protective diode OD1 is formed by the $P^+$-type layer 646, the $n^-$-type layer 635 and the $n^+$-type layer 636. The element isolation insulating film 641d, the p-type layer 634 and the $p^+$-type layer 623 form an element isolating region. The protective resistance OR1 is formed on a prescribed region such as an element isolation insulating film, for example, by polysilicon, for example.

As clearly understood from FIG. 58, the $n^+$-type layers 633 and 636 can be formed in the same process as collector electrode layers of an npn bipolar transistor, while the $p^+$-type layers 644 and 646 can be formed in the same process as a base forming process of an npn bipolar transistor. Therefore, it is possible to reliably implement the structure of an output protective function in a BiMOS process without increasing any manufacturing process.

Referring to FIG. 58, the protective diodes are formed in the same process as an npn bipolar transistor. The protective diodes may alternatively be formed in the same process as a pnp bipolar transistor.

[Input Buffer]

Figure 59:
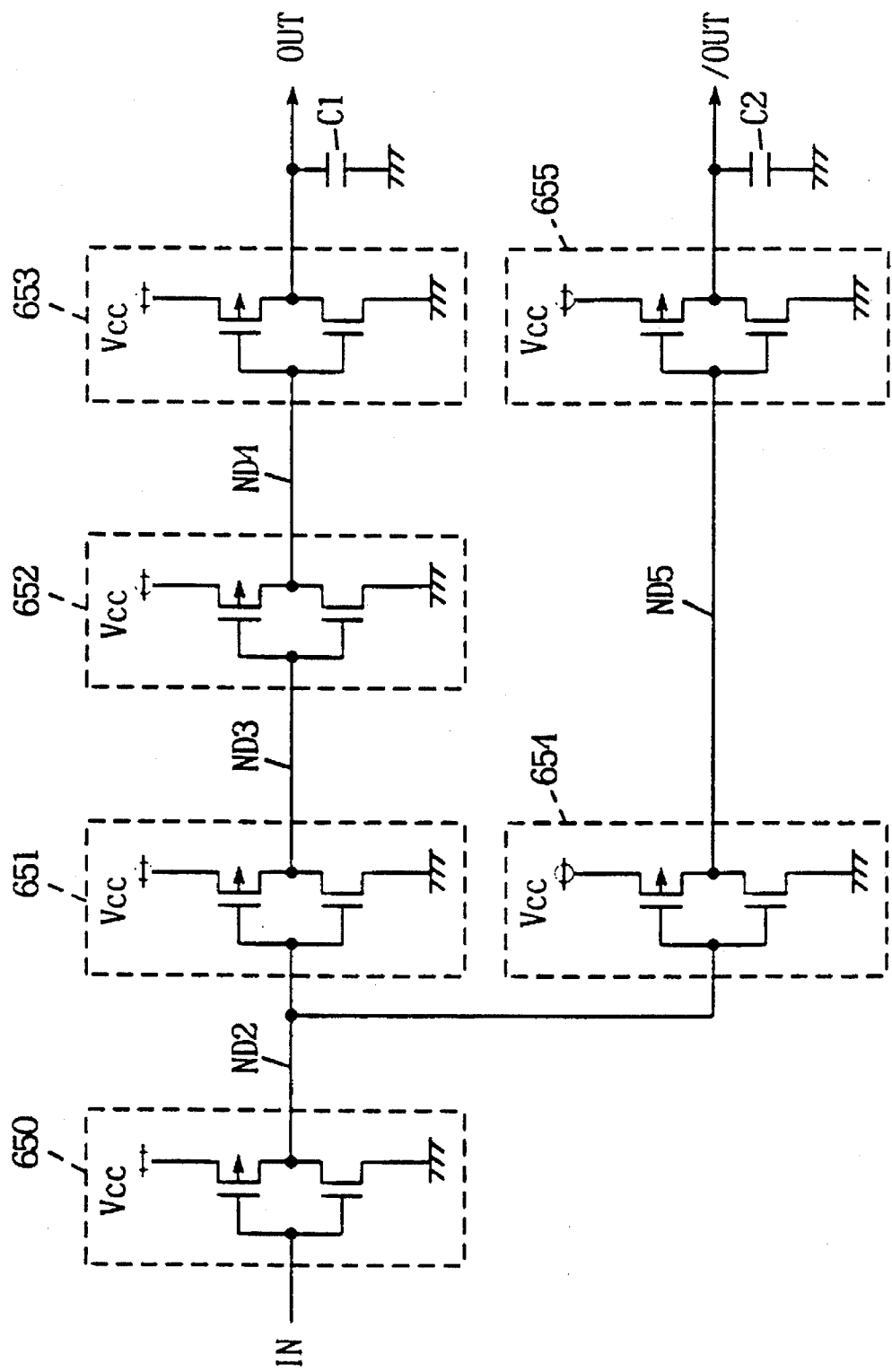
FIG. 59 illustrates a structure of a CMOS input buffer.

FIG. 59 shows a structure of the input buffer. Referring to FIG. 59, the input buffer includes an initial stage CMOS inverter circuit 650 which receives input data IN from the exterior, three stages of cascade-connected CMOS inverter circuits 651, 652 and 653 which successively invert/amplify an output of the initial stage CMOS inverter circuit 650, and two stages of cascade-connected CMOS inverter circuits 654 and 655 which are connected in parallel with the CMOS inverter circuits 651 to 653 for inverting/amplifying the output of the initial stage CMOS inverter circuit 650 respectively. The CMOS inverter circuit 653 outputs an output OUT, while the CMOS inverter circuit 655 outputs a complementary output /OUT. Parasitic capacitances (including load capacitances) C1 and C2 are attendant on output parts of the CMOS inverter circuits 653 and 655 respectively.

As to input/output response characteristics of the input buffer, a time tLH which is required for changing its output in response to rise of the input signal IN is preferably equal to a time tHL for the output to be changed in response to fall of the input signal IN, since the response speed of the input buffer is decided by a longer one of these times tLH and tHL.

Figure 60:
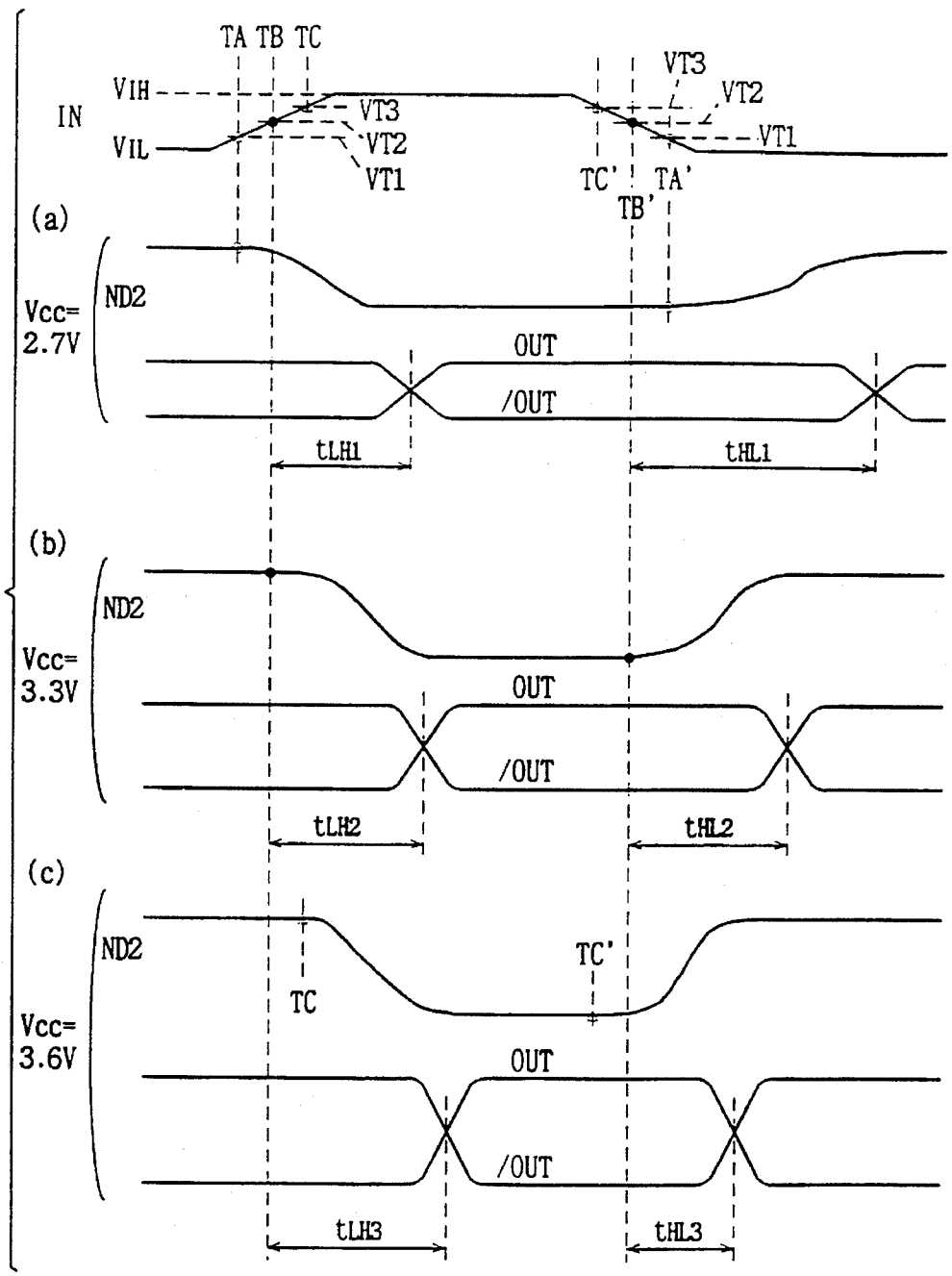
FIG. 60 is a signal waveform diagram showing the operation of the CMOS input buffer shown in FIG. 59.

An input logic threshold value VT of the initial stage CMOS inverter circuit 650 is set at ½ of a high level VIH and a low level VIL of the input signal IN, i.e., (VIH+VIL)/2. The input logic threshold value VT of each CMOS inverter circuit is decided by a size ratio (gate width/gate length) of the p-channel and n-channel MOS transistors and the supply voltage Vcc. It is assumed here that the input logic threshold values VT of the CMOS inverter circuits 651 to 655 are set at ½ of the supply voltage Vcc and the ground potential Vss, for the purpose of simplification. VIH is 2.2 V and VIL is 0.8 V at a TTL level, while VIH is 2.0 V and VIL is 0.8 V at an LVTTL level. When the supply voltage Vcc is changed, the input logic threshold values VT of the CMOS inverter circuits are also changed. The operation of the input buffer shown in FIG. 59 is now described with an operation waveform diagram shown in FIG. 60.

The input logic threshold value of the initial stage CMOS inverter circuit 650 of the input buffer is set to be (VIH+VIL)/2 when the supply voltage Vcc is 3.3 V. In this case, discharging of the output part is started when the input signal IN reaches the input logic threshold value VT and the outputs OUT and /OUT cross with each other after a lapse of a time tLH2 to define the output, as shown at (b) in FIG. 60. Similarly, charging of the output part of the initial stage CMOS inverter circuit 650 is started at a time TB' when the input signal IN falls from a high level to a low level. The outputs OUT and /OUT cross with each other after a lapse of a time tHL2 from this time TB'. In this case, tLH2=tHL2 since the input logic threshold value VT2 of the CMOS inverter circuit 650 is (VIH+VIH)/2 when the supply voltage Vcc is 3.3 V.

On the other hand, when the supply voltage Vcc is reduced to 2.7 V, for example, the input logic threshold value VT1 of the initial stage CMOS inverter circuit 650 is reduced. When the input signal IN rises from a low level to a high level, discharging of the output part of the CMOS inverter circuit 650 is started at a time TA and the outputs OUT and /OUT cross with each other after a lapse of a time tLH1 from the time TB, as shown at (a) in FIG. 60. When the input signal IN falls from a high level to a low level, on the other hand, charging of the output part of the initial stage CMOS inverter circuit 650 is started at a time TA' when the input signal IN reaches the input logic threshold value VT1, whereby the outputs /OUT and OUT cross with each other after a lapse of a time tHL1 from a time TB' when the input signal IN reaches an intermediate input logic threshold value VT. In this case, discharging of the output part of the CMOS inverter circuit 650 is executed at timing earlier than charging, whereby tLH1<tHL1. In this case, the response speed of the input buffer is decided by the time tHL1.

On the other hand, when the supply voltage Vcc is increased to 3.6 V, for example, the input logic threshold value VT of the initial stage CMOS inverter circuit 650 is also increased to VT3 in response. When the input signal IN rises from a low level to a high level, discharging of the output part of the initial stage CMOS inverter circuit 650 is started at a time TC, whereby the outputs OUT and /OUT cross with each other after a lapse of a time tLH3 from the time TB, as shown at (c) in FIG. 60. When the input signal IN falls from a high level to a low level, on the other hand, charging of the output part of the CMOS inverter circuit 650 is started at a time TC' when the level of the input signal IN reaches VT3. In this case, the outputs OUT and /OUT cross with each other after a lapse of a time tHL3 after the input signal IN reaches the intermediate level VT2. When the supply voltage Vcc reaches 3.6 V, therefore, discharge timing for the initial CMOS inverter circuit 650 is delayed as compared with charge timing, whereby tLH3>tHL3. Thus, when a CMOS inverter circuit is employed for the initial stage of the input buffer, tLH is unequalized with tHL along large fluctuation of the operating supply voltage and hence the response speed in rise of the input signal IN from a low level to a high level differs from that in fall of the input signal IN from a high level to a low level. Thus, it may be impossible to carry out a correct buffer operation.

Figure 61:
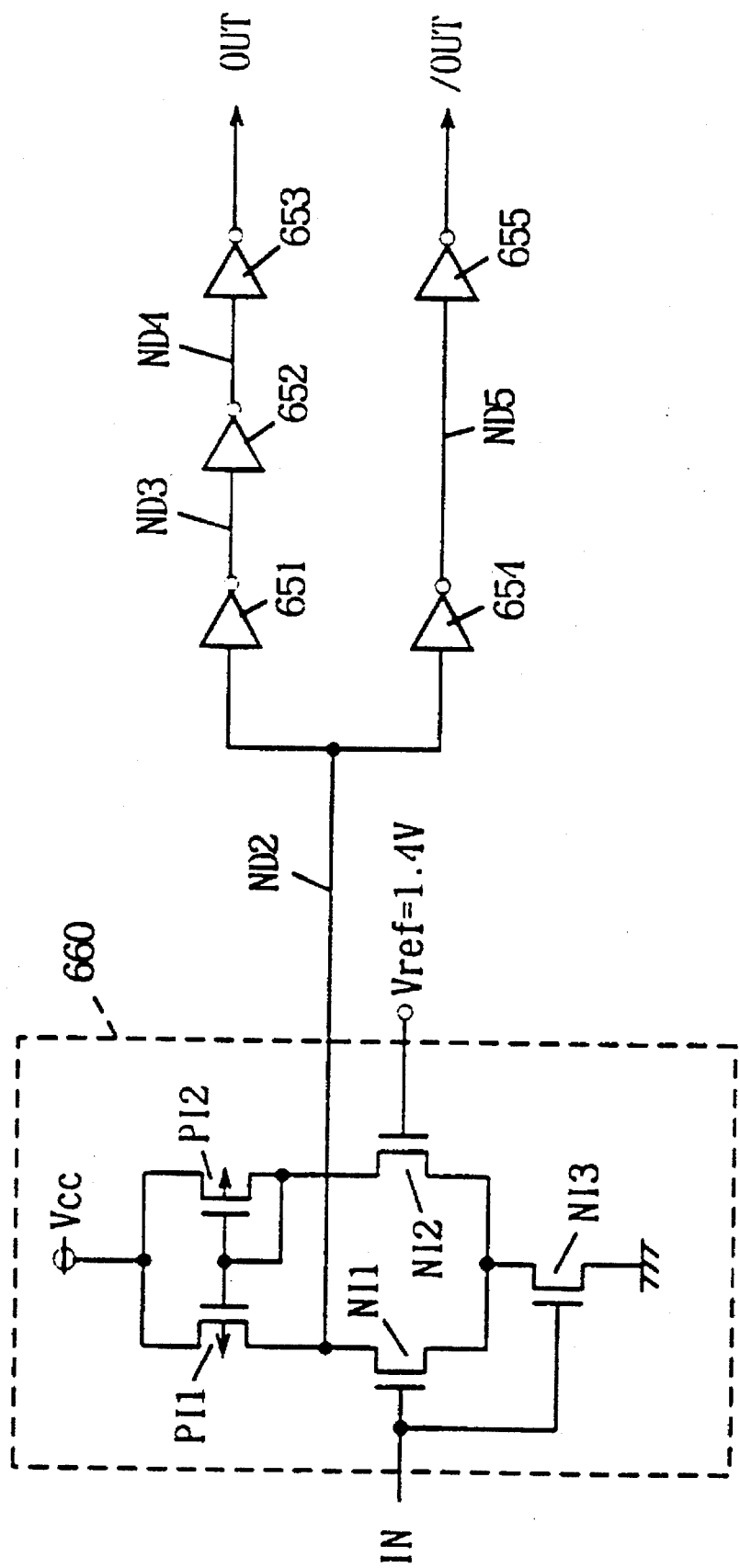
FIG. 61 illustrates a structure of a current mirror type input buffer according to the present invention.

FIG. 61 shows a structure of an improved input buffer. Referring to FIG. 61, a current mirror type buffer circuit 660 is provided in place of the initial stage CMOS inverter circuit. The current mirror buffer circuit 660 includes an n-channel MOS transistor NI1 which receives the input signal IN in its gate, an n-channel MOS transistor NI2 which receives the reference voltage Vref in its gate, an n-channel MOS transistor NI3 which receives the input signal IN in its gate for forming current supply paths for the transistors NI1 and NI2, a p-channel MOS transistor PI1 which is connected between the transistor NI1 and a supply potential Vcc supply node, and a p-channel MOS transistor PI2 which is connected between the n-channel MOS transistor NI2 and the supply potential Vcc supply node.

Gates of the transistors PI1 and PI2 are connected to a drain of the transistor PI2. In other words, the transistors PI1 and PI2 form a current mirror circuit. The reference voltage Vref which is supplied to the gate of the transistor NI2 is set at 1.4 V, for example. This corresponds to a voltage level of (VIL+VIH)/2 in an LVTT level. In the input buffer shown in FIG. 61, CMOS inverter circuits 651 to 655 have structures which are similar to those shown in FIG. 59. The operation of the input buffer shown in FIG. 61 is now described with an operation waveform diagram shown in FIG. 62.

Consider that the supply voltage Vcc is 3.0 V. If the input signal IN exceeds the level of the reference voltage Vref when the same rises from a low level to a high level, the conductance of the transistor NI1 exceeds that of the transistor NI2, whereby a large amount of current flows through the transistor NI1. On the other hand, the amount of current flowing in the transistor NI2 is reduced, whereby a current flowing in the transistor PI2 is also reduced. The transistors PI2 and PI1 form a current mirror circuit, and hence the same amount of current to that flowing in the transistor PI2 flows in the transistor PI1, if the transistors PI1 and PI2 are equal in size to each other. Thus, the potential at a node ND2 is discharged through the transistors NI1 and NI3, to fall at a high speed.

If the input signal IN reaches a voltage level which is lower than the reference voltage Vref when it falls from a high level to a low level, on the other hand, the amount of current flowing through the transistor NI2 is increased and that of the current flowing in the transistor PI2 is also increased accordingly. Thus, the output node ND2 is charged through the transistor PI1, so that its potential starts to rise.

The transistor NI3 serving as a current source is in an ON state and feeds a current whether the input signal IN is at a low or high level. The transistor NI3 feeds a large amount of current when the input signal IN is at a high level, while the former feeds a small amount of current when the latter is at a low level. When the input signal IN rises to a high level, therefore, a large amount of current flows through the transistors NI1 and NI3 while the transistor PI1 supplies a small amount of current at this time, whereby the output node ND2 is discharged at a high speed to be reduced to the ground potential level. When the input signal IN is at a low level, on the other hand, a large amount of current flows through the transistor NI2. At this time, only a small amount of current flows in the transistor NI3, whereby the current flows substantially only through the transistor NI2. Thus, the node ND2 can be charged through the transistor PI1 substantially at the same amount of current as that in discharging. Namely, the input signal IN which is supplied to the transistor NI3 oscillates about the reference voltage Vref, the transistor NI3 can virtually switch/drive the transistors NI1 and NI2 in saturated regions and most of the current reliably flows to only one of them to implement for charging/discharging of the node ND2 at a high speed.

Figure 62:
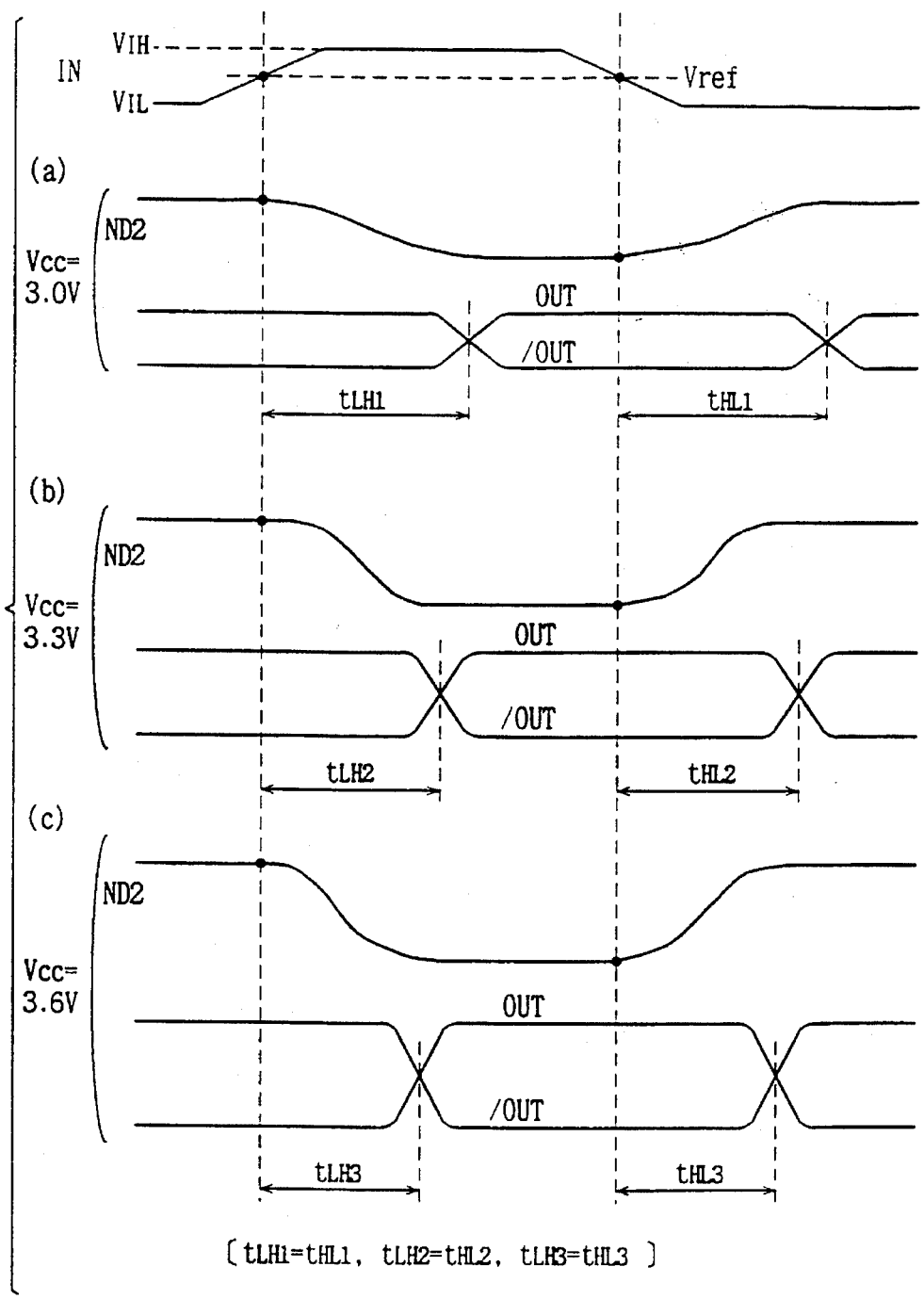
FIG. 62 is a signal waveform diagram showing an operation of the current mirror type input buffer shown in FIG. 61.

Also when the supply voltage Vcc reaches 3.3 V, the node ND2 is charged/discharged depending on the relation between the input signal IN and the reference voltage Vref, as shown at (b) in FIG. 62. Therefore, the node ND2 is charged and discharged at the same timing, and response times tLH2 and tHL2 for the input signal IN which rises from a low level to a high level-and falls from a high level to a low level are equal no each other.

Also when the supply voltage Vcc is increased to 3.6 V, for example, as shown at (c) in FIG. 62, the node ND2 is charged/discharged in accordance with the relation between the input signal IN and the reference voltage Vref, similarly to the above. Therefore, tLH3=tHL3 also in this case. Thus, it is possible to attain tLH=tHL regardless of the value of the supply voltage Vcc, thereby implementing a stably operating input buffer. As the supply voltage Vcc is increased, the time required for the output signals OUT and /OUT to cross with each other is gradually reduced since the operating speeds of the CMOS inverter circuits 651 to 655 are increased following the increase of the supply voltage Vcc.

As hereinabove described, it is possible to implement a stably operating input buffer having excellent input/output response characteristics by employing a current mirror circuit and holding its reference voltage Vref at a constant value depending on no supply voltage.

Figure 63:
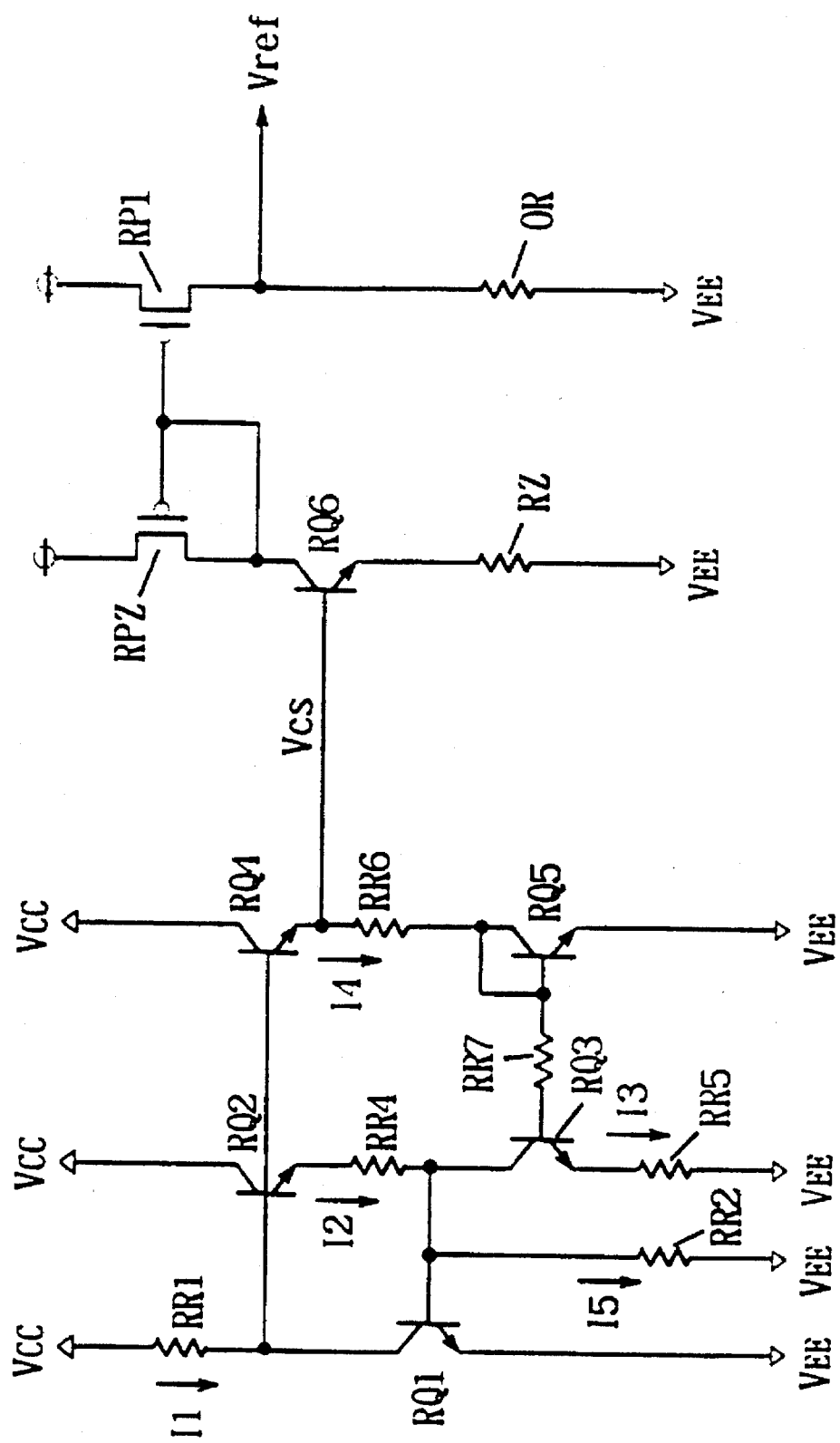
FIG. 63 illustrates a circuit structure for generating a reference voltage employed for the current mirror type input buffer.

FIG. 63 shows a structure of a reference voltage generation circuit for generating the reference voltage Vref for the current mirror input buffer circuit shown in FIG. 61. The reference voltage generation circuit shown in FIG. 63 is similar in structure to that shown in FIG. 51. Therefore, components corresponding to those shown in FIG. 51 are denoted by similar reference numerals, to omit repeated description thereof. Referring to FIG. 63, a p-channel MOS transistor RPZ provided in a reference voltage generation part corresponds to the p-channel MOS transistors RP2 to RP6 and the fuse elements RF1 to RF4 shown in FIG. 51, which are connected in parallel with each other. An emitter resistance TZ of a bipolar transistor RQ6 corresponds to the combined resistance of the resistances RR10 to RR14 and the fuse elements RF5 to RF7 shown in FIG. 51. A resistance OR provided in an output part corresponds to the resistance-connected n-channel MOS transistor RN11 shown in FIG. 51. Similarly to the reference voltage generation circuit shown in FIG. 51, therefore, the reference voltage generation circuit shown in FIG. 63 can stably generate the reference voltage Vref of a desired voltage level without depending on the supply voltage Vcc.

Figure 64:
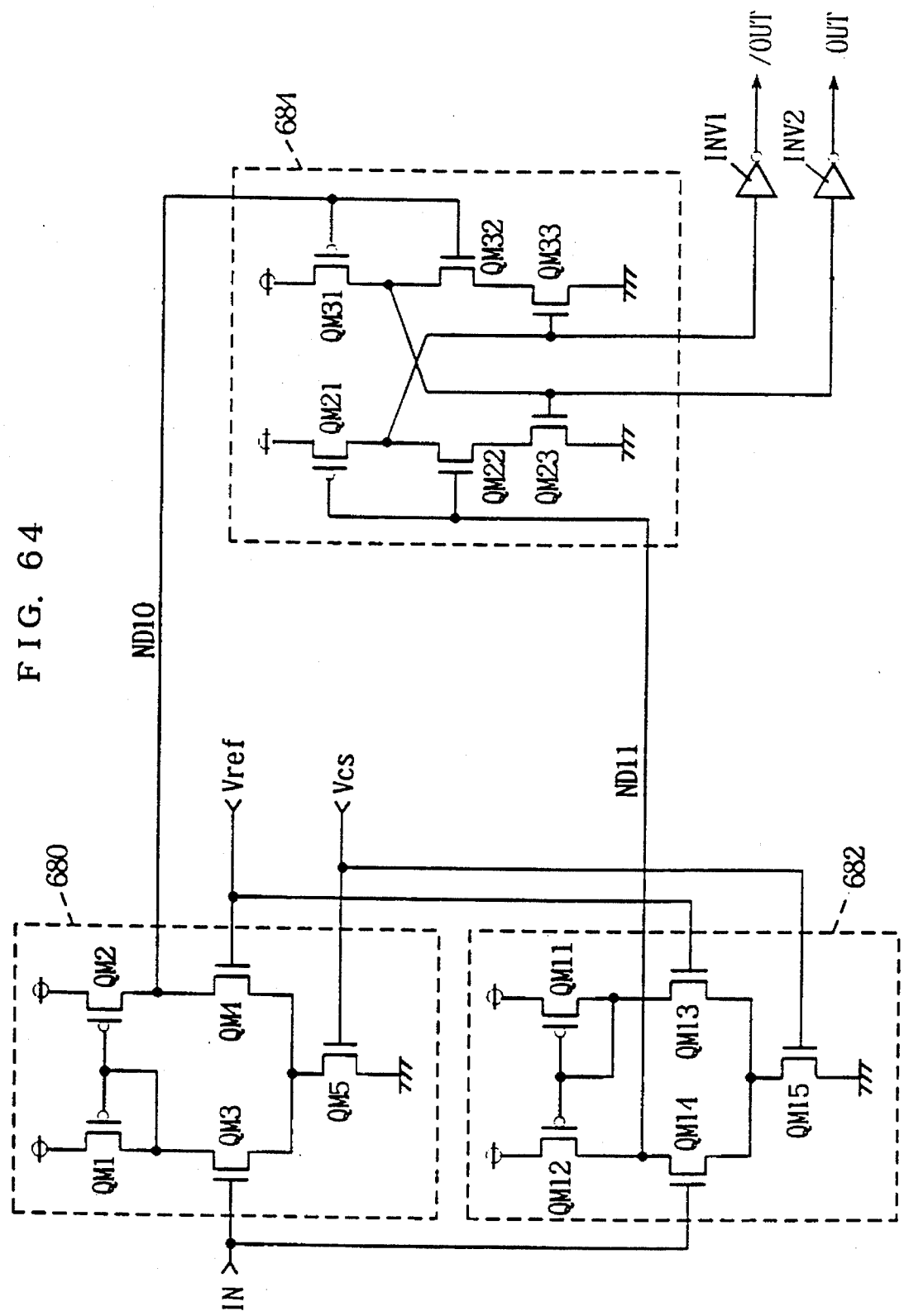
FIG. 64 illustrates another structure of a current mirror type buffer according to the present invention.

FIG. 64 shows a structure of another current mirror input buffer. The current mirror input buffer shown in FIG. 64 includes a first current mirror differential amplification circuit 680, a second current mirror differential amplification circuit 682, an amplification circuit 684 which amplifies outputs of the first and second current mirror differential amplification circuits 680 and 682, and inverters INV1 and INV2 which invert/amplify complementary output signals outputted from the amplification circuit 684 respectively.

The first current mirror differential amplification circuit 680 includes an n-channel MOS transistor QM5 which receives the reference voltage Vcs at its gate to operate as a constant current source, an n-channel MOS transistor QM3 which receives the input signal IN at its gate, an n-channel MOS transistor QM4 which receives the reference voltage Vref at its gate, and p-channel MOS transistors QM1 and QM2 which supply currents to the transistors QM3 and QM4 respectively. First conducting terminals (sources) of the transistors QM3 and QM4 are connected to one conduction terminal (drain) of the transistor QM5. The gates of the transistors QM1 and QM2 are connected to a drain of the transistor QM1 (node between the transistors QM1 and QM3), so that the transistors QM1 and QM2 form a current mirror circuit.

The second current mirror differential amplification circuit 682 includes an n-channel MOS transistor QM15 which receives the reference voltage Vcs at its gate for serving as a constant current source, an n-channel MOS transistor QM14 which receives the input signal IN in its gate, an n-channel MOS transistor QM13 which receives the reference voltage Vref at its gate, and p-channel MOS transistors QM11 and QM12 which supply currents to the transistors QM13 and QM14 respectively. Sources of the transistors QM13 and QM14 are connected to a drain of the transistor QM15. Gates of the transistors QM11 and QM12 are connected to a drain of the transistor QM11 (node between the transistors QM11 and QM13), so that the transistors QM11 and QM12 form a current mirror circuit. An output node ND10 of the first current mirror differential amplification circuit 680 is connected to a drain of the transistor QM2 (node between the transistors QM2 and QM4). An output node ND11 of the second current mirror differential amplification circuit 682 is connected to a drain of the transistor QM12.

The amplification circuit 684 includes a p-channel MOS transistor QM21 which receives a signal potential on the node ND11 at its gate, an n-channel MOS transistor QM22 which is connected in series to the transistor QM21 for receiving the signal potential on the node ND11 at its gate, an n-channel MOS transistor QM23 which forms current supply paths for the transistors QM21 and QM22, a p-channel MOS transistor QM31 which receives a signal potential on the node ND10 at its gate, an n-channel MOS transistor QM32 which is connected in series to the transistor QM31 for receiving the signal potential on the node ND10 at its gate, and an n-channel MOS transistor QM33 which is connected between the transistor QM32 and the ground potential for receiving a drain potential of the transistor QM21 at its gate. A gate of the transistor QM23 is connected to a drain of the transistor Q31. The operation is now briefly described.

When the input signal IN is lower than the reference potential Vref, the conductance of the transistor QM3 is reduced below the transistor QM4 in the first current mirror differential amplification circuit 680, so that currents flowing through the transistors QM1 and QM2 are reduced and the potential level of the node ND10 is reduced. In the second current mirror differential amplification circuit 682, on the other hand, the conductance of the transistor QM13 exceeds that of the transistor QM14 and currents flowing through the transistors QM11 and QM12 are increased so that the potential level of the node ND11 is increased.

Following reduction of the potential level of the node ND10, the transistor QM31 is brought to an ON state and the transistor QM32 is brought to an OFF state, while the gate potential of the transistor QM23 is increased. On the other hand, the transistor QM21 is brought to an OFF state and the transistor QM22 is brought to an ON state, while the gate potential of the transistor QM33 is reduced. As the conductance of the transistor QM33 is reduced following reduction of its gate potential, the gate of the transistor QM23 is charged at a high speed through the transistor QM31 so that its potential is reduced, whereby the gate of the transistor QM33 is discharged at a high speed through the transistors QM22 and QM23. Due to the series of feedback operation, the output of the amplification circuit 684 is ascertained or developed at a high speed. A low-level signal which is supplied to an inverter circuit INV1 of this amplification circuit 684 is inverted/amplified to be outputted as an output/OUT. A high-level signal which is supplied to an inverter circuit INV2 is inverted to be outputted as an output OUT.

Also in the input buffer shown in FIG. 64, the initial stage buffer circuit receiving the input signal IN has a structure of a current mirror circuit to carry out an amplifying operation in accordance with the relation between the reference potential Vref and the input signal IN, whereby it is possible to charge and discharge the output signals OUT and /OUT without depending on the level of the supply voltage Vcc. The reference voltages Vref and Vcs shown in FIG. 64 can be generated from the reference voltage generation circuit shown in FIG. 63.

Figure 65A:
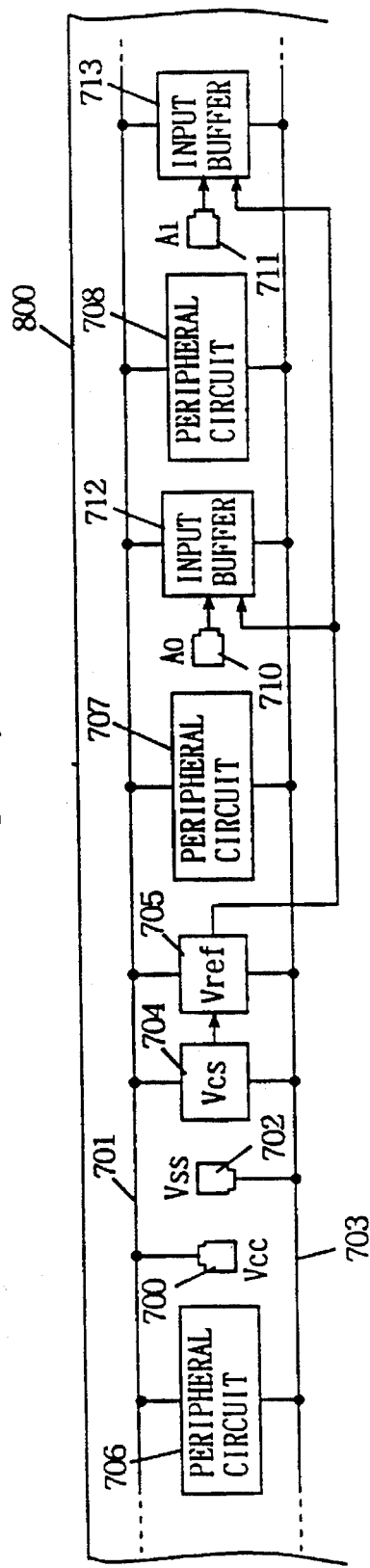
FIGS. 65A and 65B illustrate on-chip layout of the current mirror type input buffer and the reference voltage generation circuit according to the present invention.
Figure 65B:
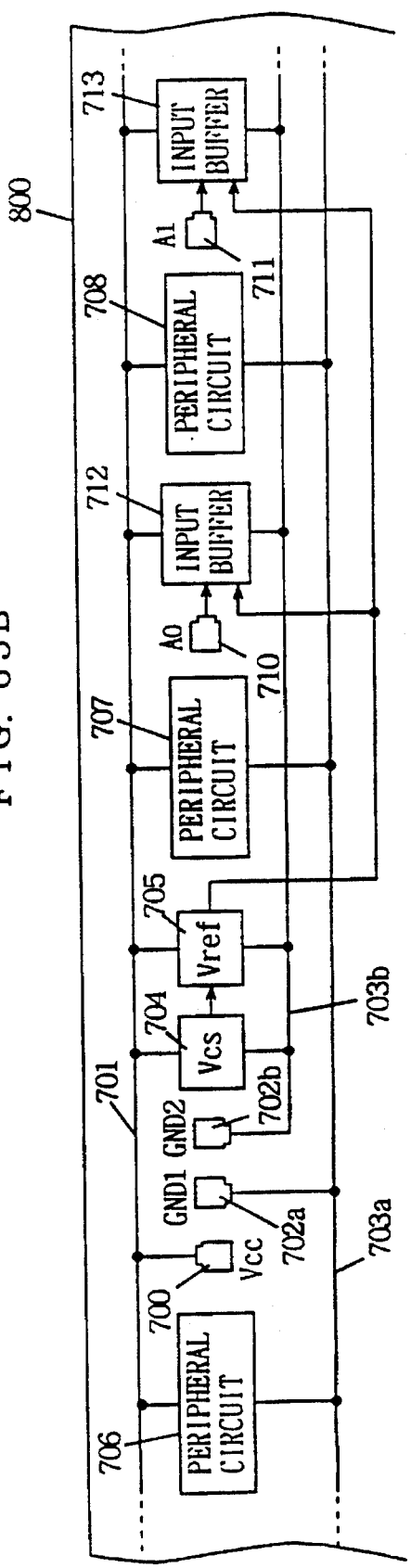

FIGS. 65A and 65B show exemplary modes of arrangement of reference voltage generation circuits and input buffers on chips. Referring to FIG. 65A, a chip 800 includes a power supply pad 700 which receives the supply voltage Vcc, a ground pad Vss which receives the ground potential Vss, and input pads 710 and 711 which receive input signals A0 and A1 respectively along its inner periphery. The input signals A0 and A1 which are supplied to the pads 710 and 711 may be address signal bits, input data, or external control signals. A power supply line 701 is arranged from the power supply pad 700 along one end of the chip 800, while a ground line 703 is arranged from the ground pad 702 in parallel with the power supply line 701. A constant voltage generation part 704 for generating the constant voltage Vcs and a reference voltage generation part 705 for generating the reference voltage Vref from the constant voltage Vcs are provided in the vicinity of the pad 702.

Input buffers 711 and 712 are provided in proximity to the input pads 710 and 711. The input buffers 711 and 712 have structures which are identical to that shown in FIGS. 61 or 62. The constant voltage generation part 704 and the reference voltage generation part 705 have structures which are identical to that shown in FIG. 63. A peripheral circuit 706 is provided on one side of the power supply pad 700 and another peripheral circuit 707 is provided in the vicinity of the reference voltage generation circuit 705, while still another peripheral circuit 708 is provided in the vicinity of the input buffer 711. The peripheral circuits 706, 707 and 708 may be address predecoders, or control signal generation circuits. The constant voltage generation part 704, the reference voltage generation part 705, the input buffers 711 and 712, and the peripheral circuits 706, 707 and 708 operate by the supply voltage Vcc and the ground potential Vss which are supplied on the power supply line 701 and the ground line 703 as operating supply voltages. The reference voltage Vref which is generated from the reference voltage generation part 705 is supplied to the input buffers 711 and 712 as an input threshold value. The constant voltage generation part 704 and the reference voltage generation part 705 can generate the reference voltage Vref without depending on the supply voltage Vcc. Also when the power supply line 701 and the ground line 703 are utilized by the peripheral circuits and the input buffers in common, therefore, it is possible to stably generate the reference voltage Vref.

In the structure shown in FIG. 65B, on the other hand, ground pads 702a and 702b are provided while ground lines 703a and 703b are independently provided for the ground pads 702a and 702b respectively. The ground line 703a is utilized by peripheral circuits 706 to 708, while the ground line 703b is utilized by a constant voltage generation part 704, a reference-voltage generation part 705, and input buffers 712 and 713. The ground lines are provided separately for the peripheral circuits and for the input buffers, to be reinforced. Namely, the reference voltage Vref which is generated from the reference voltage generation circuit has no dependence on the supply voltage Vcc. The constant voltage Vcs is constant regardless of the reference ground voltage Vss (remember that the constant voltage Vcs is expressed as I4·RR6+VBE5+VEE in FIG. 63). When the level of the ground potential Vss is increased by some cause, therefore, the constant voltage Vcs may fluctuate. Therefore, circuits for generating the reference voltages Vcs and Vref and the input buffers utilizing Vcs or Vref are driven by the same ground line, and the ground line 703a is separately provided for the peripheral circuits 706, 707 and 708. Thus, it is possible to reduce potential fluctuation of the ground potential Vss, thereby stably generating the reference voltages Vcs and Vref.

As hereinabove described, it is possible to implement a stably operating input buffer whose input/output response is not changed upon change of the supply voltage Vcc, by employing a current mirror buffer circuit for the initial stage of the input buffer.

As hereinabove described, it is possible to implement an SRAM having a small chip occupied area, which stably operates at a high speed. When a memory system is constructed with an SRAM supporting implementation of the present invention, restriction in timing design of various control signals as employed is relaxed so that the system is not only increased in speed but improved in reliability.

Principal features of the present invention are as follows:

(1) The precharge potential level for each bit line is reduced for a prescribed period in starting of writing, whereby it is possible to reduce the potential amplitudes of a selected bit line pair and to equalize the potentials of the selected bit line pair at a high speed after completion of writing, thereby remarkably enlarging the margin of write recovery.

(2) The output of the block write driver, which is second write means, is forcibly set at a low level by the write delay signal for a prescribed period, whereby it is possible to reduce both potentials of the selected bit line, thereby reducing the potential amplitudes of the selected bit line pair. Thus, it is possible to equalize the potentials of the selected bit line at a high speed in completion of writing, thereby remarkably enlarging the margin of write recovery.

(3) After the completion of-writing, the bit lines are charged only through the bipolar transistors which are included in the bit line load circuit, whereby potentials of high-level bit lines are not increased for a prescribed period and it is possible to equalize the potentials of the selected bit line pair at a high speed. Thus, the margin of write recovery is remarkably enlarged and it is possible to reliably prevent increase of the access time and erroneous writing in the next read cycle.

(4) The output charging speed of the decode means is adjusted by the delayed signal of the write command signal, whereby the output of the decode means loosely rises in a read cycle which is carried out following a write cycle. Thus, it is possible to delay rise timing of the potential of the selected word line, thereby remarkably enlarging the margin of write recovery.

(5) The output of the X predecoder is switched between a low speed and a high speed in response to active and inactive states of the write command signal. This predecoder is supplied with a delayed signal of the write command signal. Therefore, the delayed signal of the write command signal is still in an active state when a read cycle is carried out following a write cycle, whereby the output of the predecoder rises at a slow speed. Thus, it is possible to delay rise timing of the selected word line in response, thereby remarkably enlarging the margin of write recovery.

(6) In the read gate for transmitting the data signal to the read data line in an emitter-follower mode, the voltage of the nonselection level which is supplied to the base of the emitter follower is brought into the same level as the high-level bit line potential in a write operation while being set at a voltage level lower than the low-level bit line potential in a read operation. Thus, it is possible to reliably hold the same potential by the emitter-follower operation also in data writing with no potential fluctuation of the read data line, thereby reading the data at a high speed.

(7) The base of the emitter follower for driving the global read data bus line which is the second read data bus line in an emitter-follower mode in accordance with the signal potential on the local read data line which is the first read data bus line is supplied with the nonselection level voltage which goes high in writing and low in reading, whereby the potential of the global read data bus line is equalized in data writing. Thus, it is possible to read the data at a high speed.

(8) The write control signal is subjected to taking of logic with other control signals in the vicinity of each memory block, whereby propagation delay of the write control signal can be minimized. Thus, it is possible to increase the speed for data writing and enlarge the margin of write recovery.

(9) The upper byte data write control signal generation system and the lower byte data write control signal generation circuit are separately provided in the central portions of the first and second arrays so that the write control signals generated therefrom are transmitted to the corresponding memory blocks respectively and thereafter each memory block takes the logic of the write control signal and other control signals. Thus, it is possible to transmit the write control signals to the respective memory blocks at a high speed, thereby writing the data at a high speed and implementing enlargement of the margin of write recovery.

(10) Each memory block is provided with the spare column line which is utilized for a plurality of I/O blocks in common so that the spare column line is replaceable with the column of an arbitrary I/O block in the related memory block, whereby it is possible to remarkably improve utilization efficiency of the spare column and there is no need to provide an unnecessary spare column line. Thus, it is possible to reduce the occupied area of the memory cell array.

(11) The current mirror input buffer is employed for the signal input part, whereby it is possible no decide whether the input signal is at a high level or a low level without depending on the supply voltage for generating the internal signal. Thus, it is possible to implement an input buffer having input/output characteristics depending on no supply voltage.

(12) The protective diode and the protective resistance are provided between the output buffer and the data output terminal, whereby it is possible to prevent the transistor of the buffer output stage from breaking even if a voltage such as a surge voltage exceeding the rated value is supplied to the output terminal. Thus, it is possible to implement a semiconductor memory device having a highly reliable output buffer. Further, the protective diode is prepared in the same process as the bipolar transistor forming the semiconductor memory device in the same size, whereby it is possible to reliably relax the voltage which is applied to the transistor of the output stage without increasing the manufacturing step. Thus, it is possible to implement a stably operating output buffer having high reliability.

(13) The trimmable reference voltage generation circuit is employed as a source for generating the reference voltage which is supplied to the current source for the sense amplifier while the reference voltage generated by the reference voltage generation part is supplied to the dummy sense means having the same structure as the constant current source utilizing part of the sense amplifier so that the output of the dummy sense means can be monitored in the exterior, whereby it is possible to set the reference voltage to regularly implement a sense amplifier having desired operation characteristics even if manufacturing parameters fluctuate to change element characteristics. Thus, it is possible to implement a stably operating semiconductor memory device having high reliability.

Although the present invention has been described and illustrated in detail, it is clearly understood that the same is by way of illustration and example only and is not to be taken by way of limitation, the spirit and scope of the present invention being limited only by the terms of the appended claims.

What is claimed is:

1. A semiconductor device, comprising:

a plurality of memory cells arranged in rows and columns;

a plurality of pairs of bit lines provided corresponding to said columns and each connecting memory cells on a corresponding column;

a plurality of bit line load means provided corresponding to said plurality of pairs of bit lines, for setting potentials of corresponding pairs of bit lines to a predetermined level;

write gate means provided for the respective pairs of bit lines, and each responsive to a column selection signal for connecting a corresponding pair of bit lines to internal write data bus lines;

delay means for delaying a write designation signal by a predetermined time;

first write means activated in response to an output of said delay means for producing internal write data corresponding to an external write data; and second write means activated in response to said write designation signal for driving said internal write data bus lines in accordance with an output of said first write means.

2. A semiconductor memory device, comprising:

a plurality of memory cells arranged in rows and columns;

a plurality of pairs of bit lines provided corresponding to respective pairs of bit lines and each connecting memory cells arranged on a corresponding column;

a plurality of bit line load means provided corresponding to said plurality of pairs of bit lines and each including a bipolar transistor and an insulated gate type transistor both provided for each bit line in a corresponding pair of bit lines, for setting potentials of said each bit line to a predetermined level;

first delay means for delaying a data write designation signal by a first predetermined time;

first drive means responsive to inactivation of said data write designation signal for turning on said bipolar transistor;

second delay means for delaying transition to the inactivation state of said data write designation signal by a second predetermined time;

a pair of internal data lines;

write gate means provided for each of said pairs of bit lines and responsive to a column selection signal for connecting a corresponding pair of bit lines to said pair of internal data lines;

first write means activated in response to an output of said first delay means for producing internal write data corresponding to a write data and producing a predetermined logical level data when disabled;

second write means activated in response to said data write designation signal for driving said pair of internal data but lines to potential levels corresponding to an output of said first write means; and second drive means responsive to inactivation of an output of said second delay means for turning on said insulated gate type transistor.

3. The device according to claim 2, wherein said first write means includes first gate means for performing a logical NAND operation of said output of said first delay means and said write data to produce complementary internal write data, and said second write means includes second gate means for performing the logical NAND operation between said write data designation signal and said complementary data to drive said internal data bus lines in accordance with the result of the logical NAND operation.

* * * * *